United States Patent
Ooishi

(10) Patent No.: US 6,477,075 B2
(45) Date of Patent: Nov. 5, 2002

(54) MEMORY CIRCUIT/LOGIC CIRCUIT INTEGRATED DEVICE CAPABLE OF REDUCING TERM OF WORKS

(75) Inventor: Tsukasa Ooishi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/003,255

(22) Filed: Dec. 6, 2001

(65) Prior Publication Data

US 2002/0048182 A1 Apr. 25, 2002

Related U.S. Application Data

(60) Continuation of application No. 09/769,390, filed on Jan. 26, 2001, now Pat. No. 6,335,875, which is a division of application No. 09/357,973, filed on Jul. 21, 1999, now Pat. No. 6,208,547.

(30) Foreign Application Priority Data

Jan. 28, 1999 (JP) .......................................... 11-020346

(51) Int. Cl.[7] .............................................. G11C 5/06
(52) U.S. Cl. ............... 365/63; 365/230.03; 365/230.06; 365/230.08
(58) Field of Search ............................... 365/63, 230.03, 365/230.06, 230.08

(56) References Cited

U.S. PATENT DOCUMENTS

| | | | | |
|---|---|---|---|---|
| 5,140,550 A | | 8/1992 | Miyaoka et al. ............. 365/177 |
| 5,231,607 A | | 7/1993 | Yoshida et al. ............. 365/226 |
| 5,289,423 A | * | 2/1994 | Natale et al. ........... 365/185.12 |
| 5,574,729 A | | 11/1996 | Kinoshita et al. ........ 371/10.03 |
| 5,793,664 A | | 8/1998 | Nagata et al. ................ 365/72 |
| 5,933,364 A | | 8/1999 | Aoyama et al. .............. 365/63 |
| 5,943,254 A | | 8/1999 | Bakeman, Jr. et al. ........ 365/72 |
| 5,943,285 A | | 8/1999 | Kohno ................... 365/230.03 |
| 5,970,016 A | | 10/1999 | Ohsawa ................. 365/230.03 |
| 6,064,585 A | * | 5/2000 | Mori et al. .................... 365/51 |
| 6,097,660 A | | 8/2000 | Tsuchida et al. ........ 365/230.03 |
| 6,115,315 A | * | 9/2000 | Yoshida ................. 365/230.03 |
| 6,125,070 A | | 9/2000 | Tomishima ............ 365/230.03 |
| 6,246,629 B1 | * | 6/2001 | Watanabe et al. ....... 365/189.08 |
| 6,329,712 B1 | * | 12/2001 | Akram et al. ................ 257/202 |

FOREIGN PATENT DOCUMENTS

JP 10-111864 4/1998

OTHER PUBLICATIONS

"Development–Technology Trend and Exemplary Application of Mass Storage DRAM–Logic Hybrid and dRAMA-SIC and Future Development", K. Numata, Issued by Japan Information Center of Science and Technology on Apr. 16, 1998, pp. 1–19.

"Development–Technology Trend and Exemplary Application of Mass Storage DRAM–High Performance Logic Hybrid ASIC HG73M Series and Future Development", T. Suzuki, Issued by Japan Information Center of Science and Technology on Apr. 16, 1998, pp. 1–20.

"Development–Technology Trend and Exemplary Application of 32–Bit RISC Microcomputer Having Mass Flash Memory and Future Development", M. Matsuda, Issued by Japan Information Center of Science and Technology on Apr. 16, 1998, pp. 1–24.

* cited by examiner

Primary Examiner—Richard Elms
Assistant Examiner—Tuan T. Nguyen
(74) Attorney, Agent, or Firm—McDermott, Will & Emery

(57) ABSTRACT

A memory circuit is connected to a logic circuit in a flip chip structure. The memory circuit is electrically connected with the logic circuit through an interface layer provided over a plurality of chips. The capacity of the memory connected to the logic circuit can be readily changed by simply changing the pattern of the interface, thereby reducing the term for developing a memory circuit/logic circuit integrated device.

11 Claims, 53 Drawing Sheets

MEMORY CIRCUIT/LOGIC CIRCUIT INTEGRATED DEVICE CAPABLE OF REDUCING TERM OF WORKS

This application is a continuation of U.S. patent application Ser. No. 09/769,390, filed Jan. 26, 2001, now U.S. Pat. No. 6,335,875 which is a divisional of U.S. patent application Ser. No. 09/357,973, filed Jul. 21, 1999, now U.S. Pat. No. 6,208,547.

BACKGROUND OF THE INVENTION

1. Field of the Invention

The present invention relates to a semiconductor memory device, and more particularly, it relates to the structure of a semiconductor memory device suitable for fabrication of a system device combining a memory circuit and a logic circuit.

2. Description of the Prior Art

In recent years, a system requiring parallel processing of mass data such as video data processing is increasingly employed.

Such a system employs a synchronous DRAM (hereinafter referred to as SDRAM) operating in synchronization with a clock signal for implementing quick access to a dynamic random access memory (hereinafter referred to as DRAM) or the like employed as a main memory following improvement in operating speed of a microprocessor (hereinafter referred to as MPU).

Such an SDRAM or the like employs a bank structure splitting a memory cell array into banks capable of operating independently of each other, in order to enable operations at a higher speed. In other words, the operations of each bank are independently controlled as to a row-system operation and a column-system operation. Quicker access is implemented PE1 559by interleave-operating such banks and reducing a precharge time or the like.

In recent years, however, a DRAM/logic circuit hybrid chip, for example, has been developed by integrating a memory circuit and a logic circuit on a single chip, in order to attain a more advanced multi-function structure, improvement of the data processing speed and the like. In this case, the width of a data bus (the number of bits of simultaneously transferred data) transferring data between the memory circuit such as a DRAM and the logic circuit integrated on the single chip tends to increase for performing high-speed processing.

While high-speed processing can be implemented by increasing the width of an internal data bus on the chip, flexible manufacturing may be required depending on the system. In this case, the aforementioned structure of the DRAM /logic circuit hybrid chip results in the following problem:

The memory capacity required to the memory circuit and the word structure (the bit number of one word or the like) for transmitting/receiving data to/from the logic circuit vary with the performance required to the system or the like. If designing the circuits on the single chip for each system in response to the specifications when fabricating such a semiconductor device, therefore, a long term is disadvantageously required for product development.

In order to solve this problem, Japanese Patent Laying-Open No. 10-111864 (1998), for example, discloses a technique of connecting a RAM board and an MPU board serving as LSI cores oppositely to each other through a bonding technique for a semiconductor chip thereby fabricating a system formed by a logic circuit and a memory circuit as an integral device, in order to reduce the term for developing a semiconductor integrated circuit device while improving the performance of the circuits and reducing the cost.

In this technique, however, pads for attaining electrical connection must be formed on each of the boards oppositely bonded to each other with correct registration, leading to limitation in degree of freedom in circuit design of both the RAM board and the MPU board.

On the other hand, input/output lines (pairs of I/O lines) reading data from memory cells and transmitting the read data to an interface circuit are generally layered in view of improvement of the operating speed or the like. In order to transmit data read from a memory cell through any of the layered pairs of I/O lines, a gate circuit is provided for selectively connecting a pair of bit lines connected with the memory cell selected in reading with the pair of I/O lines transmitting the data. The number of elements of such a gate circuit tends to increase in a multi-bank memory cell array.

In order to input/output data with the aforementioned large data bus width, in particular, it is necessary to increase the number of pairs of I/O lines capable of operating independently of each other, leading to increase of the number of the aforementioned gate circuits and the number of elements forming the same.

SUMMARY OF THE INVENTION

An object of the present invention is, in relation to a system including a memory circuit and a logic circuit structured with an integrated circuit device formed on a semiconductor substrate, to provide a semiconductor memory device capable of reducing the term for development thereof.

Another object of the present invention is to provide a semiconductor memory device capable of efficiently transmitting/receiving data to/from a logic circuit with a large data bus width.

Still another object of the present invention is to provide a semiconductor memory device enabling data transmission/receiving to/from a logic circuit with a large data bus width as well as improvement in efficiency of redundancy repair.

Briefly stated, the present invention is directed to a memory circuit/logic circuit integrated device comprising a logic circuit chip, a memory chip and a plurality of connect members.

The logic circuit chip is formed on a first major surface of a first semiconductor substrate. The logic circuit chip includes a plurality of first input/output pads for electrically interfacing with an external device.

The memory chip is separated to include at least one memory circuit among a plurality of memory circuits formed on a second major surface of a second semiconductor substrate to have separable spaces.

The memory chip includes an insulator layer provided on the outermost surface and an interface wiring layer providable immediately under the insulator layer in common for a plurality of memory circuits among the memory circuits.

The interface wiring layer has a plurality of second input/output pad parts provided on a position corresponding to an opening part of the insulator layer for electrically interfacing with the external device.

The plurality of connect members connect the plurality of first input/output pads and the corresponding second input/output pad parts respectively while opposing the first major surface of the logic circuit chip and the second major surface of the memory chip to each other.

According to another aspect of the present invention, a memory circuit/logic circuit integrated device comprises a logic circuit chip, a memory chip and a plurality of connect members.

The logic circuit chip is formed on a first major surface of a first semiconductor substrate. The logic circuit chip includes a plurality of first input/output pads for electrically interfacing with an external device.

The memory chip is integrally separated from a plurality of memory circuits formed on a second major surface of a second semiconductor device to have separable spaces, and includes at least two memory circuits.

The memory chip includes an insulator layer provided on the outermost surface and an interface wiring layer provided immediately under the insulator layer in common for the memory circuits.

The interface wiling layer has a wiring part connecting an input/output node of each of the memory circuits and a plurality of second input/output pad parts provided on a position corresponding to an opening part of the insulator layer for electrically interfacing with the external device.

The plurality of connect members connect the plurality of first input/output pads and the corresponding second input/output pad parts respectively while opposing the first major surface of the logic circuit chip and the second major surface of the memory chip to each other.

Preferably, each of the memory circuits includes a memory cell array having a plurality of memory cells arranged in rows and columns, a plurality of word lines arranged along the row direction of the memory cell array, a row selection circuit provided in correspondence to the memory cell array for selectively activating the word lines in response to an address signal, a plurality of pairs of bit lines provided in correspondence to the memory cell columns of the memory cell array, a plurality of pairs of data lines provided for a first plurality of pairs of bit lines for transmitting/receiving data to/from a selected memory cell, and a plurality of selection circuits selectively enabling data transmission between the pairs of data lines and the corresponding first plurality of pairs of bit lines.

More preferably, the memory circuit/logic circuit integrated device further comprises a redundancy memory cell row provided on an end portion of the memory cell array, and the redundancy memory cell row has latch circuits of a number corresponding to the memory cell columns for holding stored data.

Accordingly, a principal advantage of the present invention resides in that the term for designing the memory circuit and the fabrication steps therefor as well as the term for developing the memory circuit/logic circuit integrated device can be reduced.

Another advantage of the present invention resides in that a plurality of memory cell columns can share a data input/output structure and hence a structure transmitting/receiving data to/from the logic circuit with a large data bus width can be efficiently implemented.

Still another advantage of the present invention resides in that a redundancy memory cell in a redundancy memory cell block provided independently of the memory cell array replaces a faulty memory cell, whereby the efficiency of redundancy replacement can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
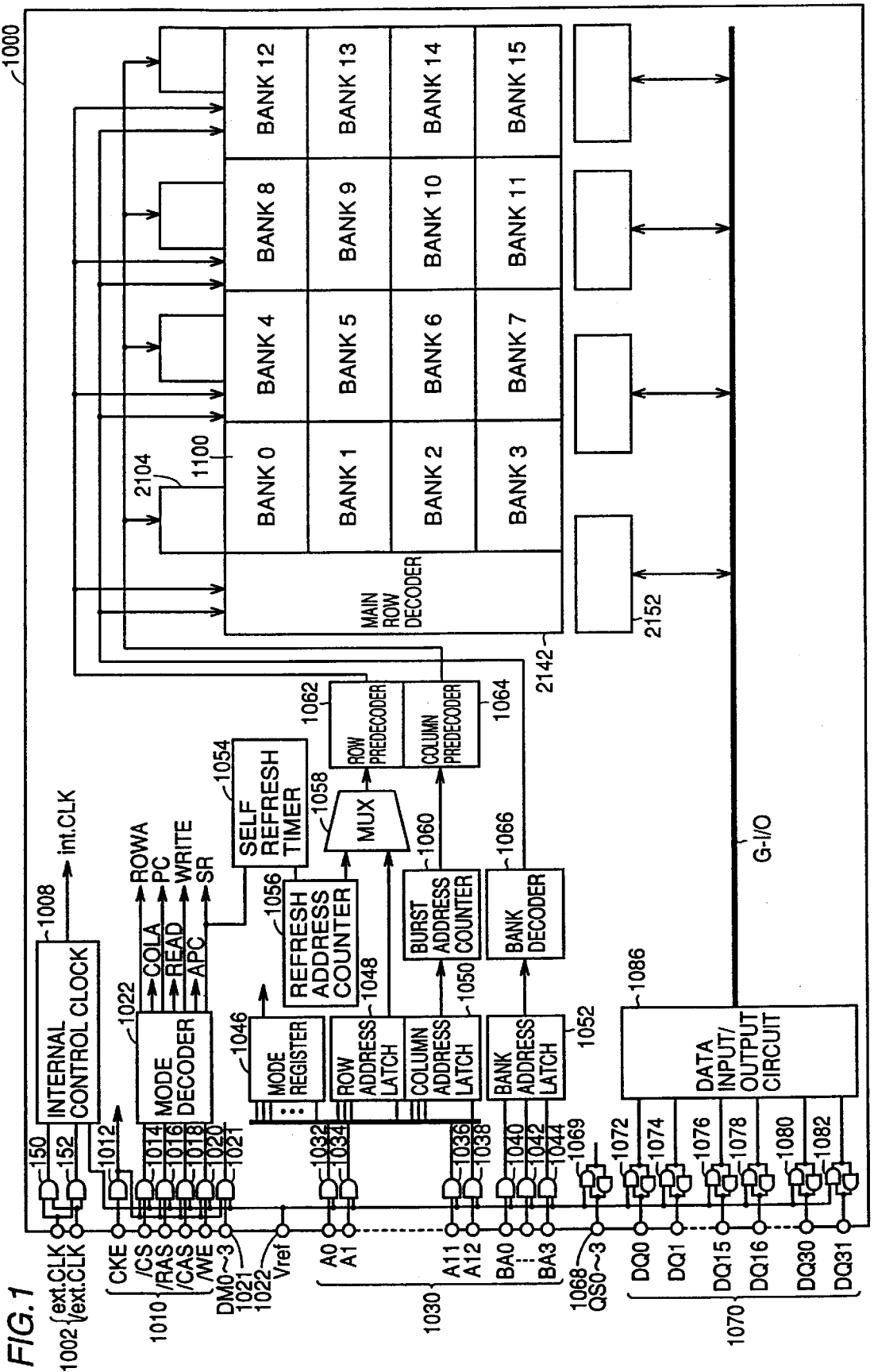
FIG. 1 is a schematic block diagram showing the structure of a semiconductor memory device 1000 according to an embodiment 1 of the present invention.

FIG. 1 is a schematic block diagram for illustrating the circuit structure of a synchronous semiconductor memory device 1000 according to an embodiment 1 of the present invention. As described later, the present invention is not necessarily restricted to such a synchronous semiconductor memory device, but is applicable to the structure of a memory cell array of a more general semiconductor memory device. Referring to FIG. 1, the SDRAM 1000 includes an external dock signal input terminal 1002 receiving externally supplied complementary clock signals ext.CLK and ext./CLK, dock input buffers 150 and 152 buffering the dock signals supplied to the external clock terminal 1002, an internal control clock signal generation circuit 1008 receiving outputs of the clock buffers 150 and 152 and generating an internal clock signal int./CLK, and a mode decoder 1022 receiving external control signals supplied through an external control signal input terminal 1010 through input buffers 1012 to 1020 operating in response to the internal clock signal int.CLK.

The external control signal input terminal 1010 is supplied with a signal CKE, a chip select signal/CS, a row address strobe signal/RAS, a column address strobe signal/CAS, a write control signal/WE and data mask signals DM0 to DM3.

The signal CKE is a signal for indicating enabling of input of the control signals in the chip. If this signal is not inactivated, input of the control signals is not allowed and the SDRAM does not operate as a chip.

The signal/CS is a signal for identifying whether or not a command signal is inputted. In a state where this signal is activated (low level), the command is identified in response to the combination of the levels of the remaining control signals on the leading edges of the clock signals.

The signal/RAS is a signal for indicating an operation of a row-system circuit, and the signal/RAS is a signal for indicating activation of an operation of a column-system circuit. The signal/WE is a signal for identifying a write operation or a read operation.

The signals DM0 to DM3 are signals indicating mask operations of data transfer for corresponding data input/output terminals DQ0 to DQ7, DQ8 to DQ15, DQ16 to DQ23 and DQ24 to DQ31 respectively.

The mode decoder 1022 outputs internal control signals for controlling an operation of an internal circuit of the SDRAM 1000 in response to these external control signals. The mode decoder 1022 outputs signals ROWA, COLA, ACD, PC, READ, WRITE, APC and SR as the internal control signals, for example. The signal ROWA is a signal indicating that row-system access is performed, the signal COLA is a signal indicating that column-system access is performed, and the signal ACT is a signal indicating activation of a word line.

The signal PC is a signal indicating a precharge operation and termination of the row-system circuit operation. The signal READ is a signal for indicating a read operation for the column-system circuit, and the signal WRITE is a signal for indicating a write operation for the column system circuit.

The signal APC is a signal indicating an auto precharge operation. When the auto precharge operation is specified, a precharge operation is automatically stated upon termination of a burst cycle. The signal SR is a signal for indicating a self refresh operation. When the self refresh operation is started, a self refresh timer operates and activates the word line after a lapse of a constant time to start a refresh operation.

The SDRAM 1000 further includes a self refresh timer 1054 starting to operate when the signal SR specifies a self refresh mode for indicating activation of the word line, i.e., starting of the refresh operation after a lapse of the constant time, and a refresh counter 1056 for generating an address for the refresh operation in accordance with the indication from the self refresh timer 1054.

The SDRAM 1000 further includes a reference potential input terminal 1022 receiving a signal VREF forming the reference for determination of a high or low level of an input signal, a mode register 1046 holding information for a prescribed operation mode, such as data for a burst length or which one of a single data rate operation and a double data rate operation is specified, for example, in response to combination of address signals supplied through an address signal input terminal 1030 and the aforementioned external control signals, a row address latch 1048 receiving the address signals through address signal input buffers 1032 to 1038 operating in response to the internal dock signal int.CLK and holding an inputted row address at a timing when the row address is inputted, a column address latch 1050 receiving address signals A0 to A12 and holding a column address at a timing when the column address is inputted, a multiplexer 1058 receiving outputs from the refresh address counter 1056 and the row address latch 1048 for selecting and outputting the output from the row address latch 1048 in a general operation while selecting and outputting the output from the refresh address counter 1056 during the self refresh operation, a row predecoder 1062 receiving the output from the multiplexer 1058 for predecoding the row address, a burst address counter 1060 generating an internal column address in response to the data of the burst length from the mode register 1046 on the basis of the column address held in the column address latch 1050, a predecoder 1064 receiving an output of the burst address counter 1060 and predecoding the corresponding column address, a bank address latch 1052 receiving bank addresses BA0 to BA3 supplied to the address input terminal through input buffers 1040 to 1044 operating in response to the internal clock signal int.CLK and holding a specified bank address value, and a bank decoder 1066 receiving an output of the bank address latch 1052 and decoding the bank address.

The bank address signals BA0 to BA3 indicate an accessed bank in each of row-system access and column-system access. In other words, the bank address signals BA0 to BA3 supplied to the address signal input terminal 1030 are fetched in the bank address latch 1052, thereafter decoded by the bank decoder 1066, and thereafter transmitted to each memory array block (bank) in each of row-system access and column-system access.

The SDRAM 1000 further includes a memory cell array 1100 including memory array blocks operating as banks 0 to 15 which are units capable of independently performing read/write operations respectively, a main row decoder 2142 for selecting a row (word line) in a corresponding bank in response to outputs from the bank decoder 1066 and the row predecoder 1062, a main column decoder 2104 for selecting a column (pair of bit lines) in the corresponding bank in response to an output from the column predecoder 1064, an I/O port 2152 supplying data read from a selected memory cell in a selected bank to a global I/O bus G-I/O in the read operation while supplying write data transmitted by the bus G-I/O to the corresponding bank in the write operation, a data input/output circuit 1086 holding externally supplied write data and supplying the same to the bus G-I/O in the write operation while holding read data transmitted by the bus G-I/O in the read operation, and bidirectional input/output buffers 1072 to 1082 for transferring input/output data DQ0 to DQ31 between the data input/output circuit 1086 and a data input/output terminal 1070.

In the memory cell array 1100, the banks 0 to 15 are arranged in a matrix of four rows and four columns. The arrangement of the banks is not restricted to this but the number thereof may further increase. More generally, the banks may be arranged in a matrix of m rows by n columns (m and n: natural numbers).

Figure 2:
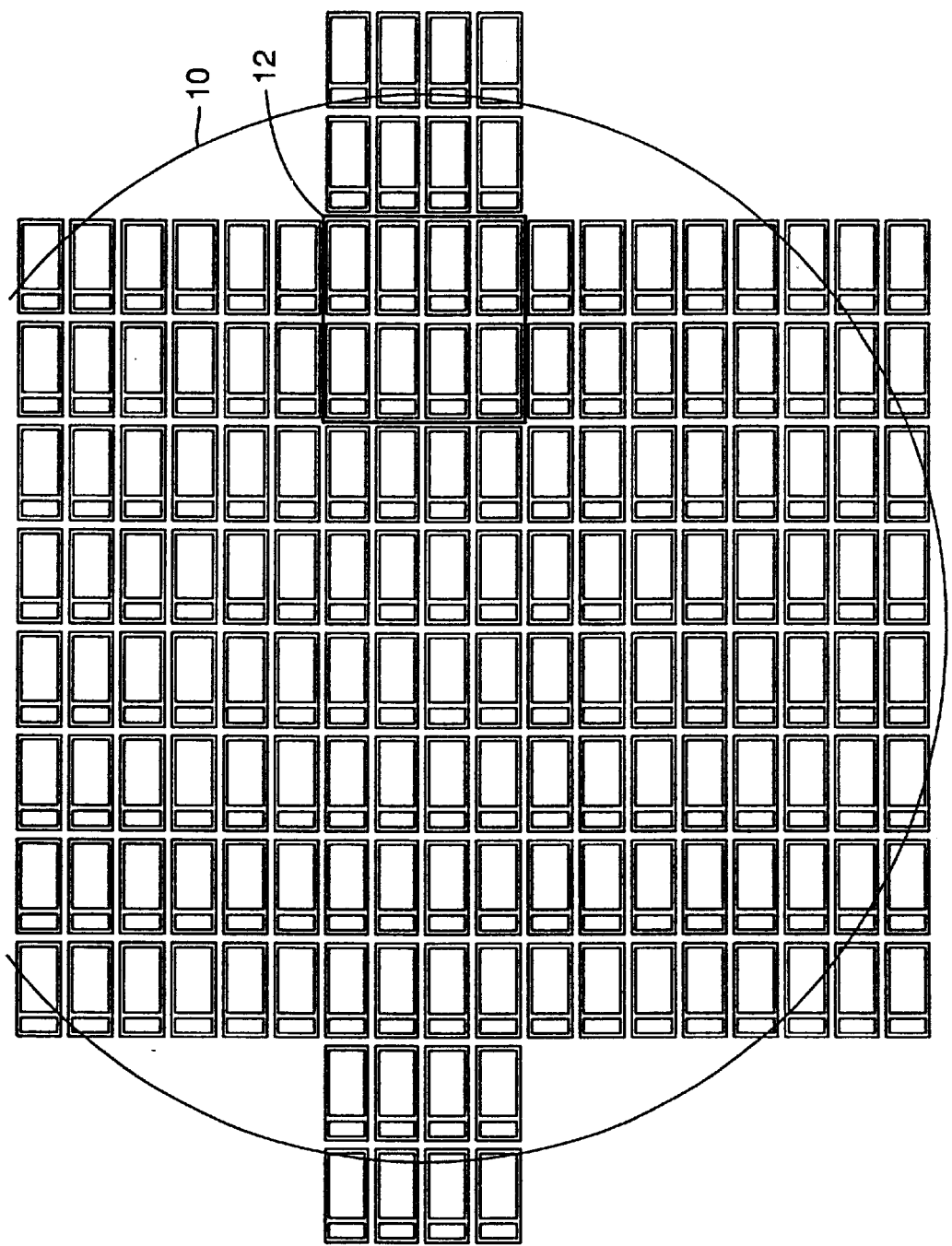
FIG. 2 is a conceptual diagram showing exemplary arrangement for forming the semiconductor memory device 1000 on a silicon wafer 10.

FIG. 2 is a conceptual diagram showing exemplary arrangement for forming the semiconductor memory device (hereinafter referred to as a memory core) 1000 shown in FIG. 1 on a silicon wafer 10.

Referring to FIG. 2, the memory core 1000 is formed through respective steps (a film forming step, an etching step and the like) by repetitively simultaneously pattern-transferring a plurality of row-system memory cores in a photolithographic step. In the example shown in FIG. 2, eight chips of such row-system memory cores are simultaneously pattern-transferred. In stepper exposure, for example, the area 12 shown in FIG. 2 forms a one-shot exposure area.

Figure 3:
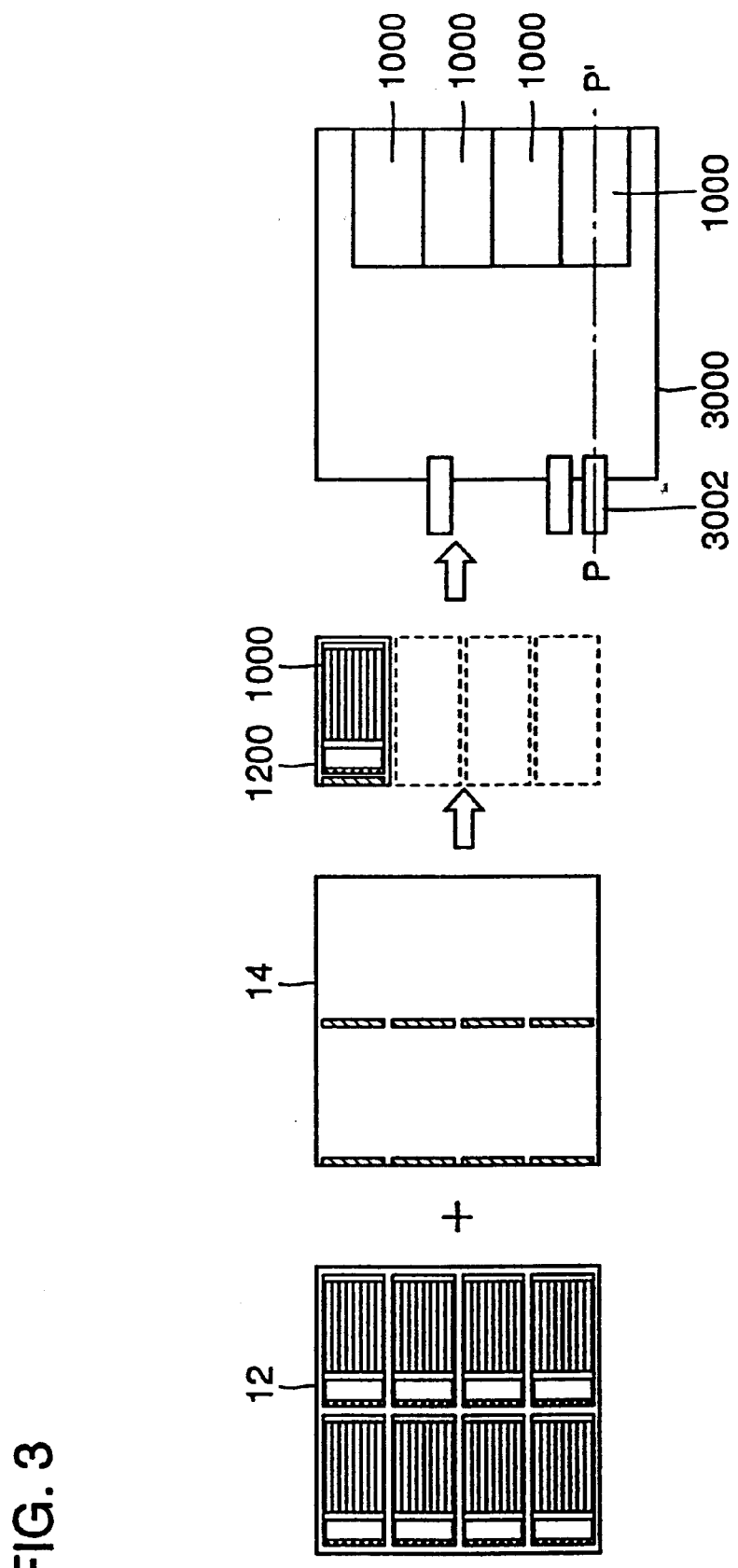
FIG. 3 conceptually illustrates a device forming step employing a memory core and forming a system combining the same with a logic circuit.

FIG. 3 conceptually illustrates a device forming step employing the memory cores formed as shown in FIG. 2 for structuring a system combined with a logic circuit.

An exposure step and the like are further repeated on the one-shot area formed by eight chips of memory cores, for example, as shown in FIG. 2, thereby additionally forming a wiring layer pattern 14 on the uppermost parts of the device of the memory core. The memory core 1000 formed in this manner is formed with an interface layer 1200 for implementing electrical connection with the logic circuit.

As described later, the memory core 1000 is connected with the logic circuit 3000 by a solder bump or the like through the interface layer 1200 so that major surfaces thereof are opposed to each other, as described later.

The logic circuit (logic core) 3000 transmits/receives signals to/from an external device through a lead 3002.

Figure 4:
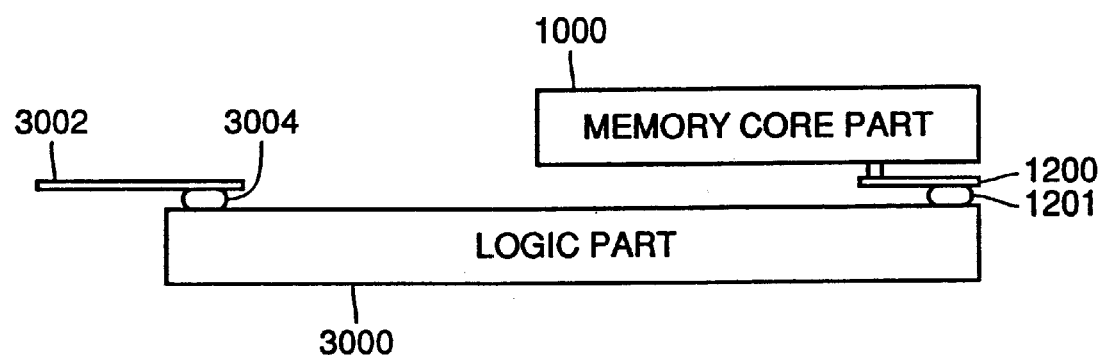
FIG. 4 is a sectional view, taken along the line P–P' in FIG. 3, showing a memory core 1000 and a logic core 3000 bonded to each other.

FIG. 4 is a sectional view taken along the line P–P' in FIG. 3 showing the memory core 1000 and the logic core 3000 bonded to each other.

The memory core part 1000 is connected with the logic core 3000 through the interface layer 1200 and a solder bump 1201. The logic core 3000 transmits/receives signals to/from the external device through a bump 3004 and the lead 3002.

Figure 5:
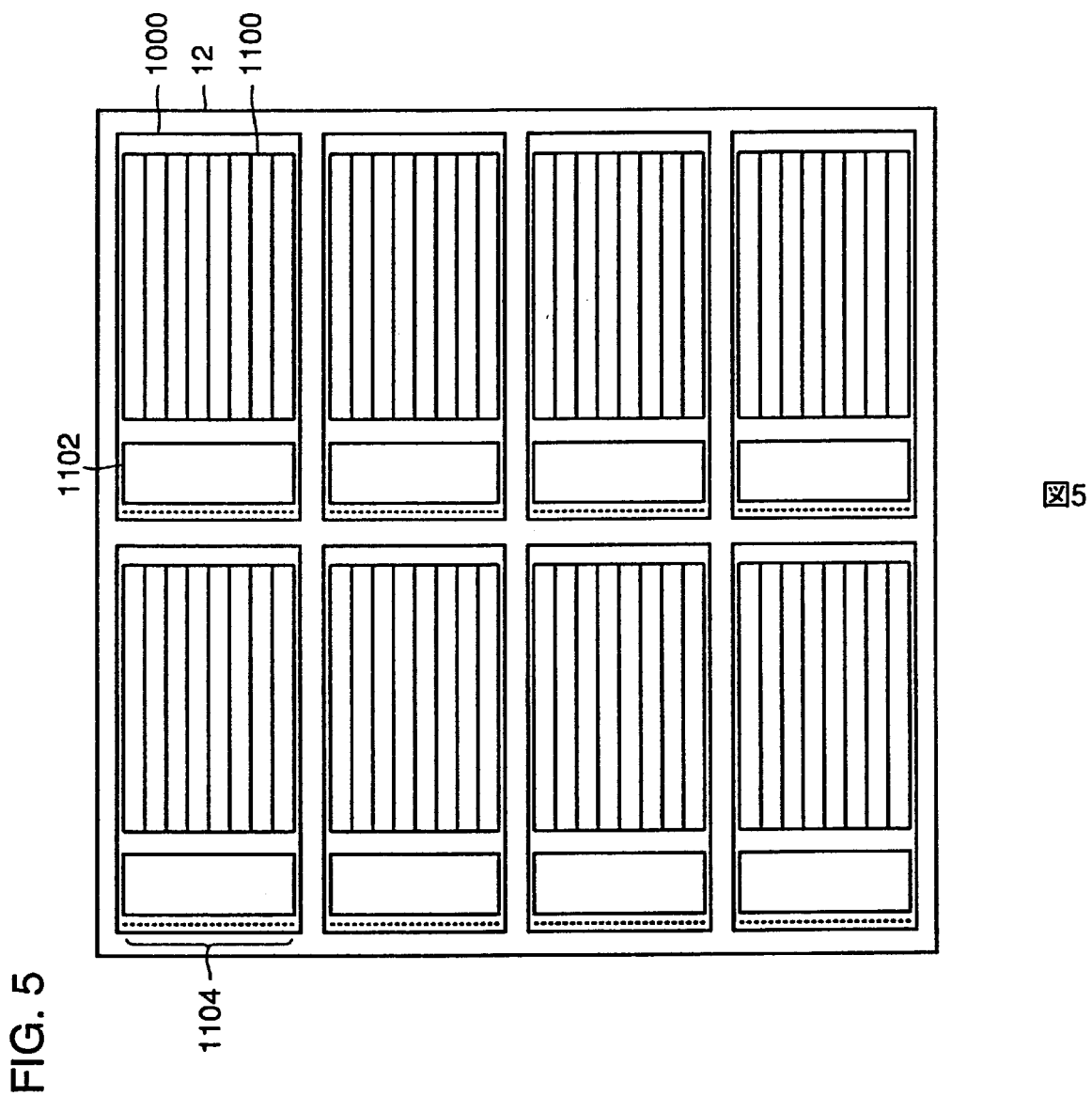
FIG. 5 is an enlarged view for illustrating the manner of arrangement of the memory core 1000 formed in a one-shot area 12 in a photolithographic step in more detail.

FIG. 5 is an enlarged view for illustrating the arrangement of the memory cores 1000 formed in the one-shot area 12 for the photolithographic step in the structure shown in FIG. 3.

As shown in FIG. 5, eight chips of memory cores 1000, for example, are arranged in the one-shot area 12, and each memory core 1000 is provided with the memory array 1100 and a peripheral circuit 1102.

In the example shown in FIG. 5, an input/output pad group 1104 corresponding to the external signal input terminal 1002, the control signal input terminal 1010, the address signal input terminal 1030 and the data input/output terminal 1070 is provided between the peripheral circuit 1102 and the shorter-side outer periphery of the memory core 1000.

Figure 6:
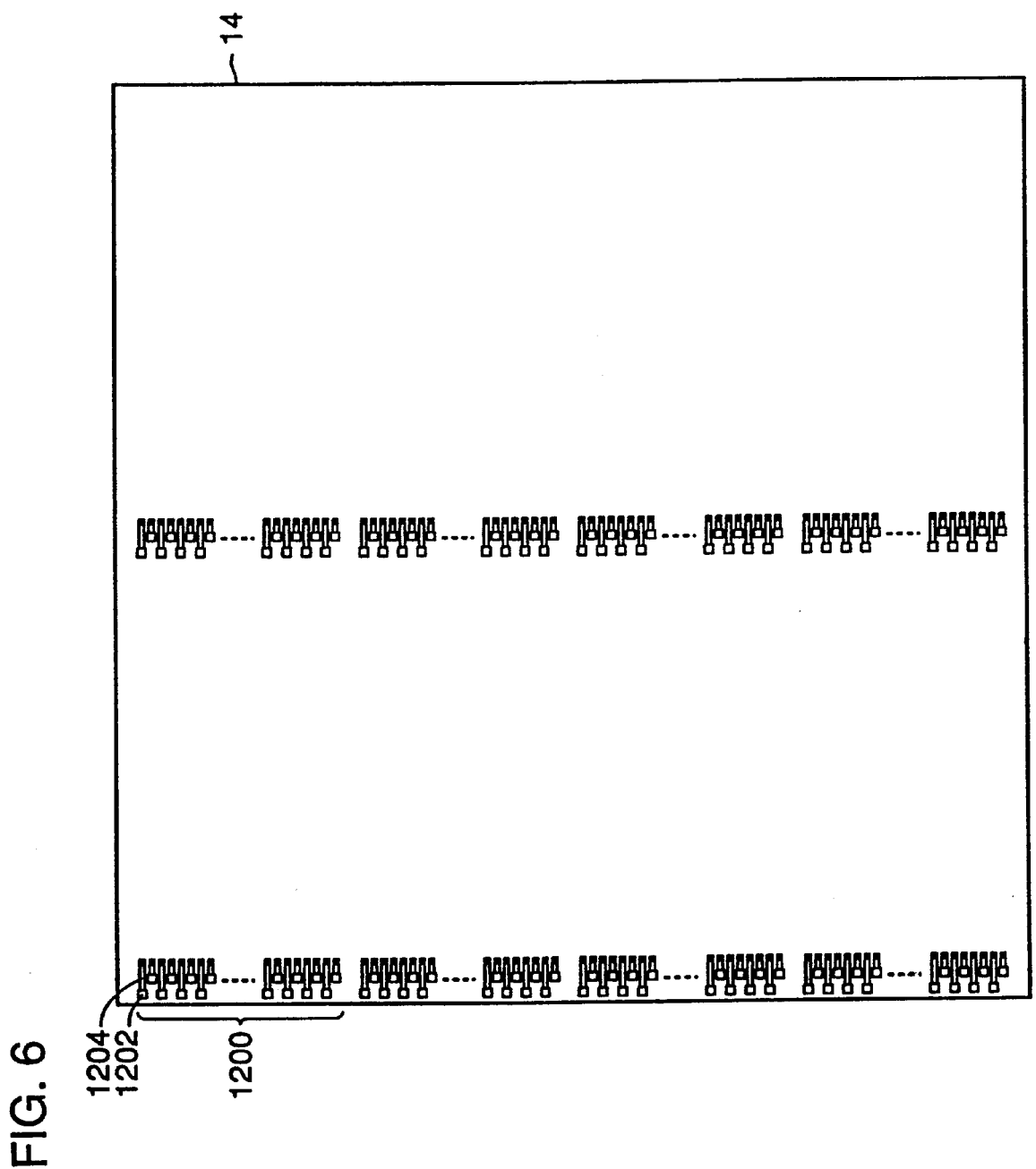
FIG. 6 is an enlarged view for illustrating the pattern of an interface layer 1200 formed on the one-shot area in the photolithographic step.

FIG. 6 is an enlarged view for illustrating the pattern of the interface layer 1200 formed on the one-shot area for the photolithographic step in the structure shown in FIG. 3.

The interface layer 1200 includes pad parts 1202 for forming connection with the logic core 3000 through the solder bump 1201 or the like as described later, and wiling parts 1204 for forming connection between the pad parts 1202 and corresponding input/output pads of the input/output pad group 1104 of the memory core.

Further, the pad parts 1202 corresponding to adjacent input/output pads of the input/output pad group 1104 respectively are so arranged that the distances from the input/output pad group 1104 alternately change to be closely arrangeable, as described later.

Figure 7:
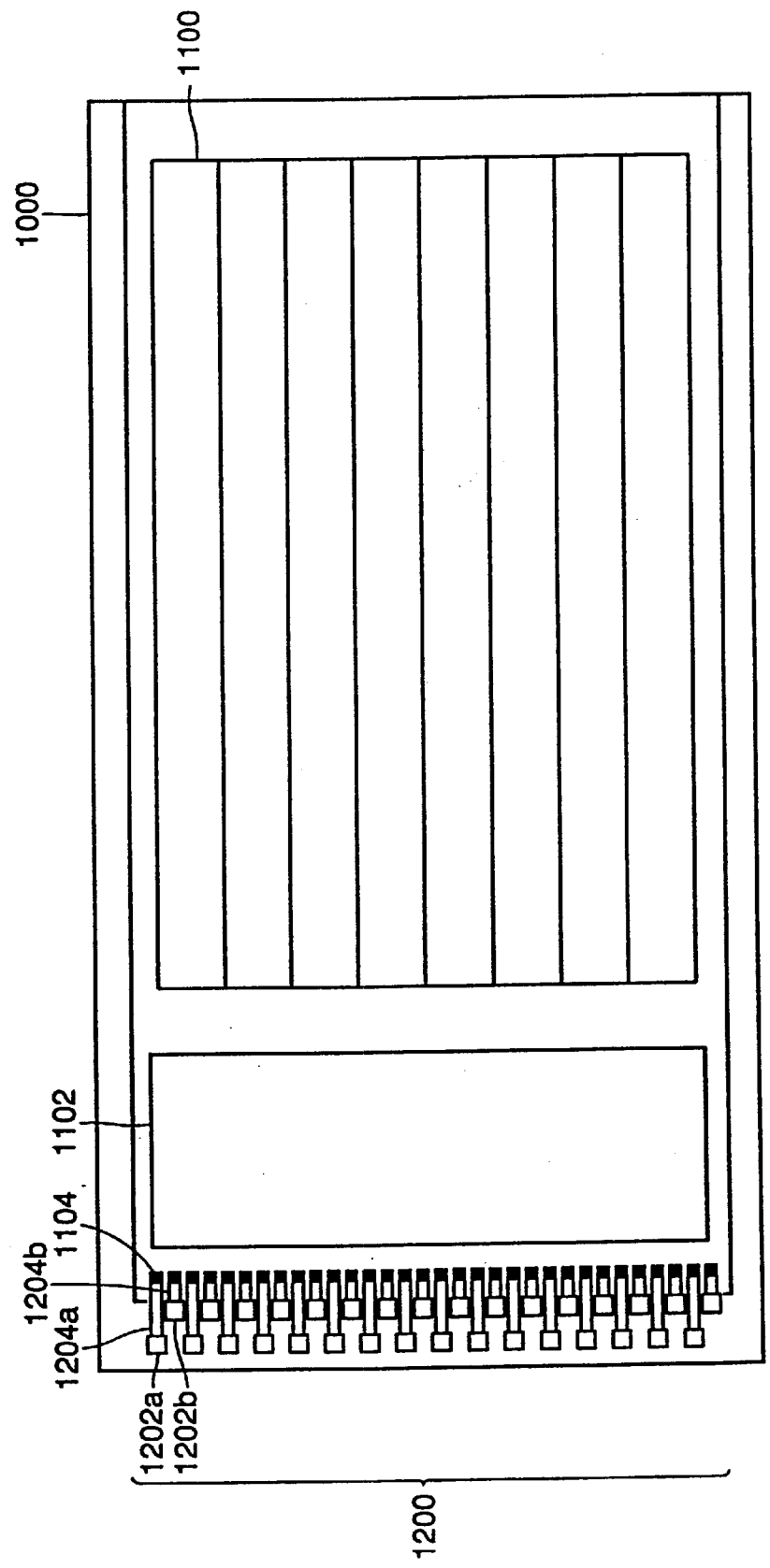
FIG. 7 is an enlarged view for illustrating the structure of the memory core formed with the interface layer 1200 in more detail.

FIG. 7 is an enlarged view for illustrating the structure of the one-shot memory core arranged as shown in FIG. 5 formed with the interface layer 1200 shown in FIG. 6 in more detail.

As described with reference to FIG. 6, the pads 1202 of the interface layer 1200 provided in correspondence to the input/output pads of the input/output pad group 1104 are alternately arranged to include a pad 1202a arranged on a position relatively separated from the input/output pad group 1104 and a pad 1202b arranged on a position relatively close thereto.

By employing this arrangement, the pads 1202 having a larger area than each pad of the input/output pad group 1104 can be closely arranged.

Therefore, a large margin can be attained for alignment when electrically connecting the memory core 1000 with the logic core 3000 through the solder bump or the like.

In the description with reference to FIGS. 3 to 7, each chip of memory core 1000 is connected with the logic core 3000 to form a memory/logic system.

Figure 8:
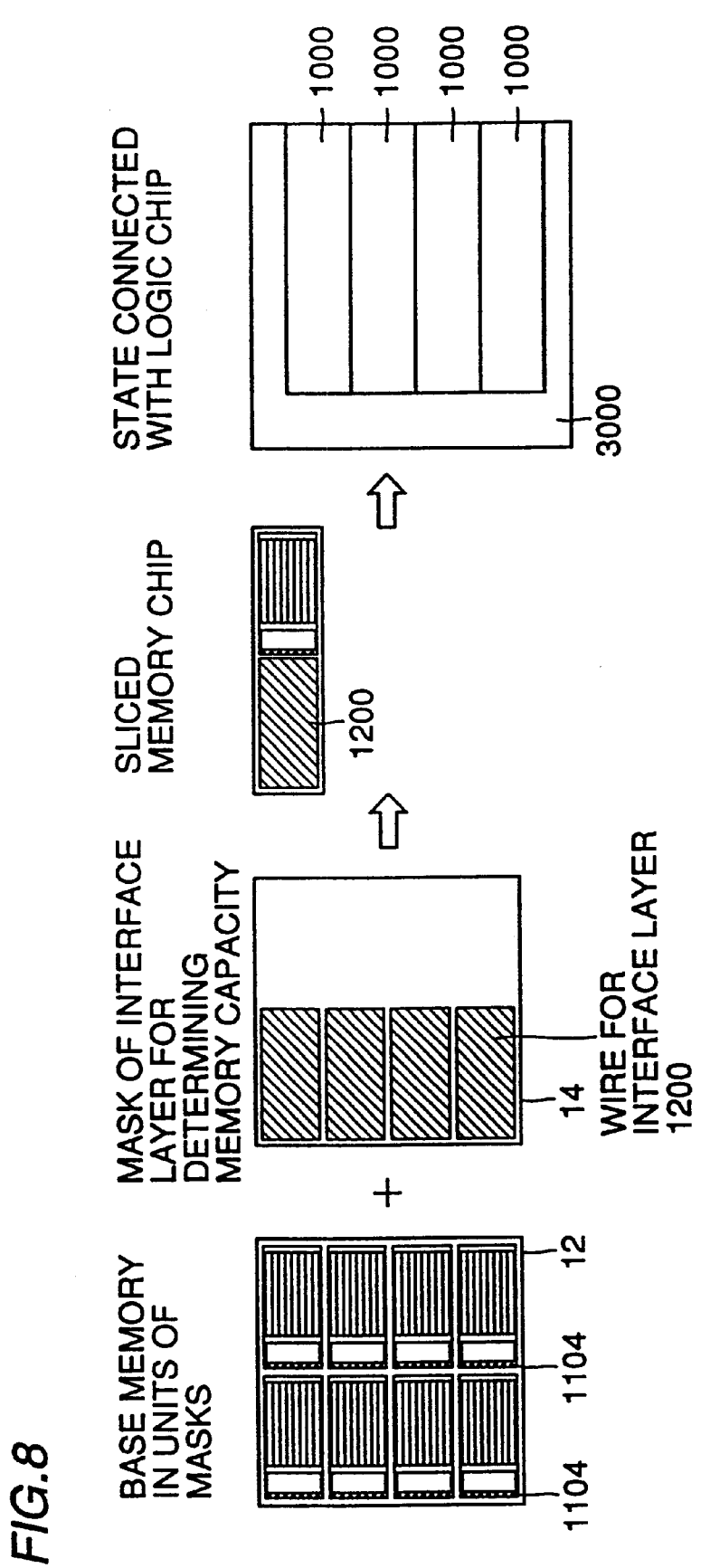
FIG. 8 is a flow diagram for illustrating a forming process for increasing the unit of a memory capacity.

However, the unit of the memory capacity connected with the logic core 3000 may be required to be more increased. FIG. 8 is a flow diagram for illustrating a forming process for structuring a memory/logic system in this case.

Referring to FIG. 8, the interface layer 1200 connects two memory cores 1000, in order to form a unit memory core by two chips.

In this regard, the mask pattern 14 for forming the interface layer 1200 corresponds to an interface layer connecting two memory cores 1000 horizontally aligned with each other, for example.

Thus, the memories connected in units of two chips are employed as chips. The rear side of the unit memory core formed in this manner is bonded to the logic core while aligning the positions of the pads with each other. This alignment can be attained by recognizing mark positions originally present on the major surface side of the memory core with light transmitted through a silicon substrate or the like, for example, grasping the positions of the pads of the memory core and the logic core and aligning the same with each other.

Figure 9:
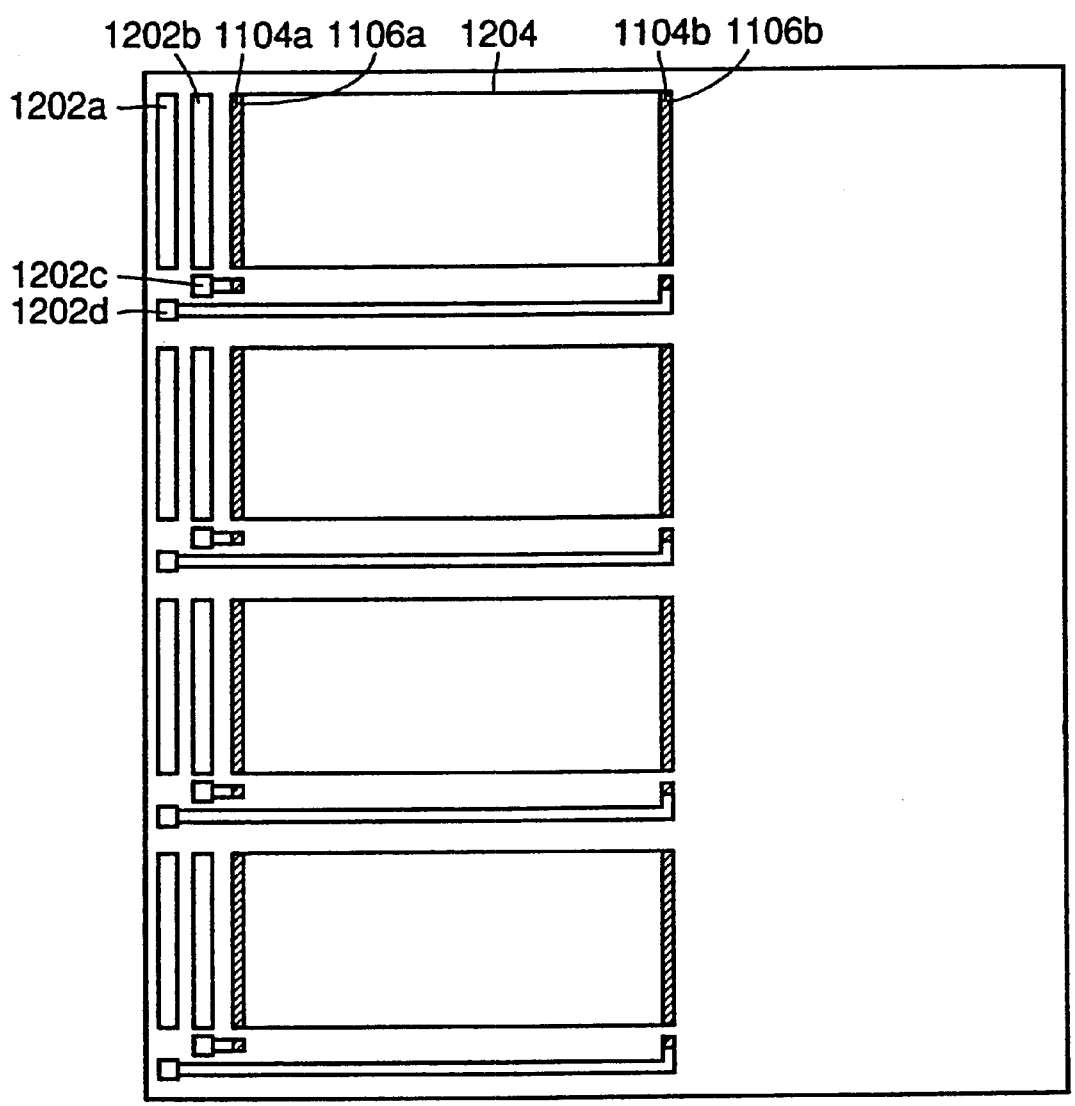
FIG. 9 is an enlarged view showing a mask pattern 14 for forming the interface layer shown in FIG. 8.

FIG. 9 is an enlarged view showing the mask pattern 14 for forming the interface layer shown in FIG. 8.

Similarly to the description with reference to FIG. 6, the pad parts 1202a and 1202b of the interface layer are arranged to be aligned with the pads of the logic core. An input/output pad group 1104a of the memory core and the pads 1202a and 1202b are connected with each other via a through hole 1106a and the wire 1204. Further, the pads 1202a and 1202b of the interface layer 1200 are connected not only with the left-side chip but also with the right-side chip via a through hole 1106b.

In this case, input/output pads which must be controlled independently of each other in the left-side chip and the light-side chip, for example, such as those corresponding to the chip select signal/CS, for example, are not connected in common by the wire 1204 between the right-side chip and the left-side chip but independent pads 1202c and 1202d are provided along with the independent wire 1204 in each chip.

Figure 10:
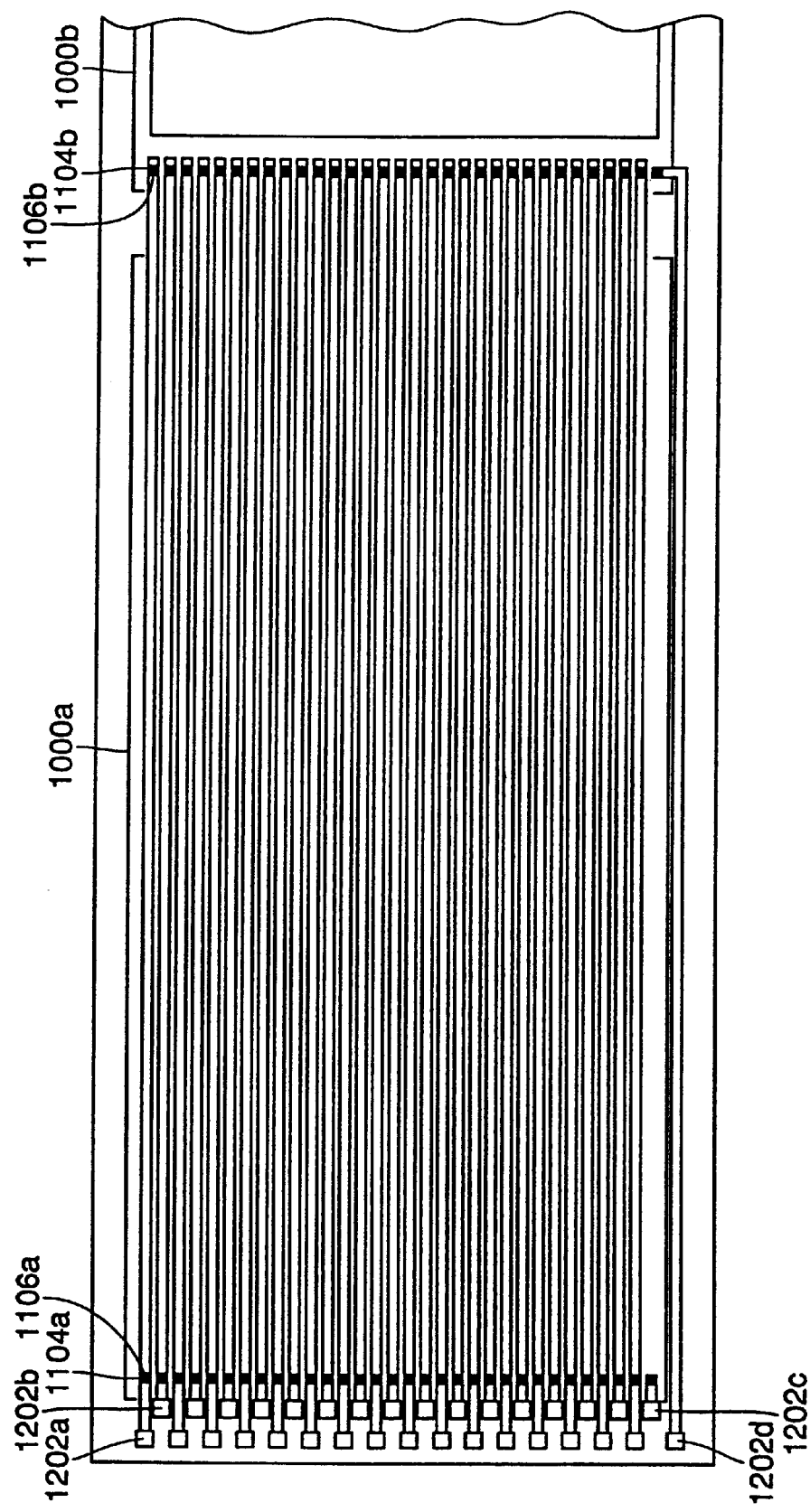
FIG. 10 is an enlarged view showing the structure of the interface layer 1200 formed for two chips 1000a and 1000b horizontally aligned with each other.

FIG. 10 is an enlarged view showing the interface layer 1200 formed for two chips 1000a and 1000b horizontally aligned with each other in the one-shot area 12.

Similarly to the structure shown in FIG. 7, the pads 1202 in the interface layer 1200 include the pad 1202a provided at a relatively long distance from the input/output pads 1104a of the left-side chip 1000a and the pad 1202b provided at a relatively short distance.

The pads 1202a and 1202b are connected with the input/output pads 1104a of the left-side chip 1000a via the through hole 1106a and with input/output pads 1104b of the light-side chip 1000b via the through hole 1106b by the wires 1204 respectively.

As described with reference to FIG. 9, the pads 1202c and 1202d are provided for the left-side chip 1000a and the right-side chip 1000b respectively as the input/output pads which must be controlled independently of each other such as those receiving the chip selector signal/CS, for example, to be connected with the corresponding input/output pads independently of each other.

By employing the aforementioned structure, the memory capacity connected with the logic core 3000 can be flexibly changed in units of the memory cores 1000 having a constant memory capacity in response to the memory capacity required by the system when forming the memory/logic system.

Figure 11:
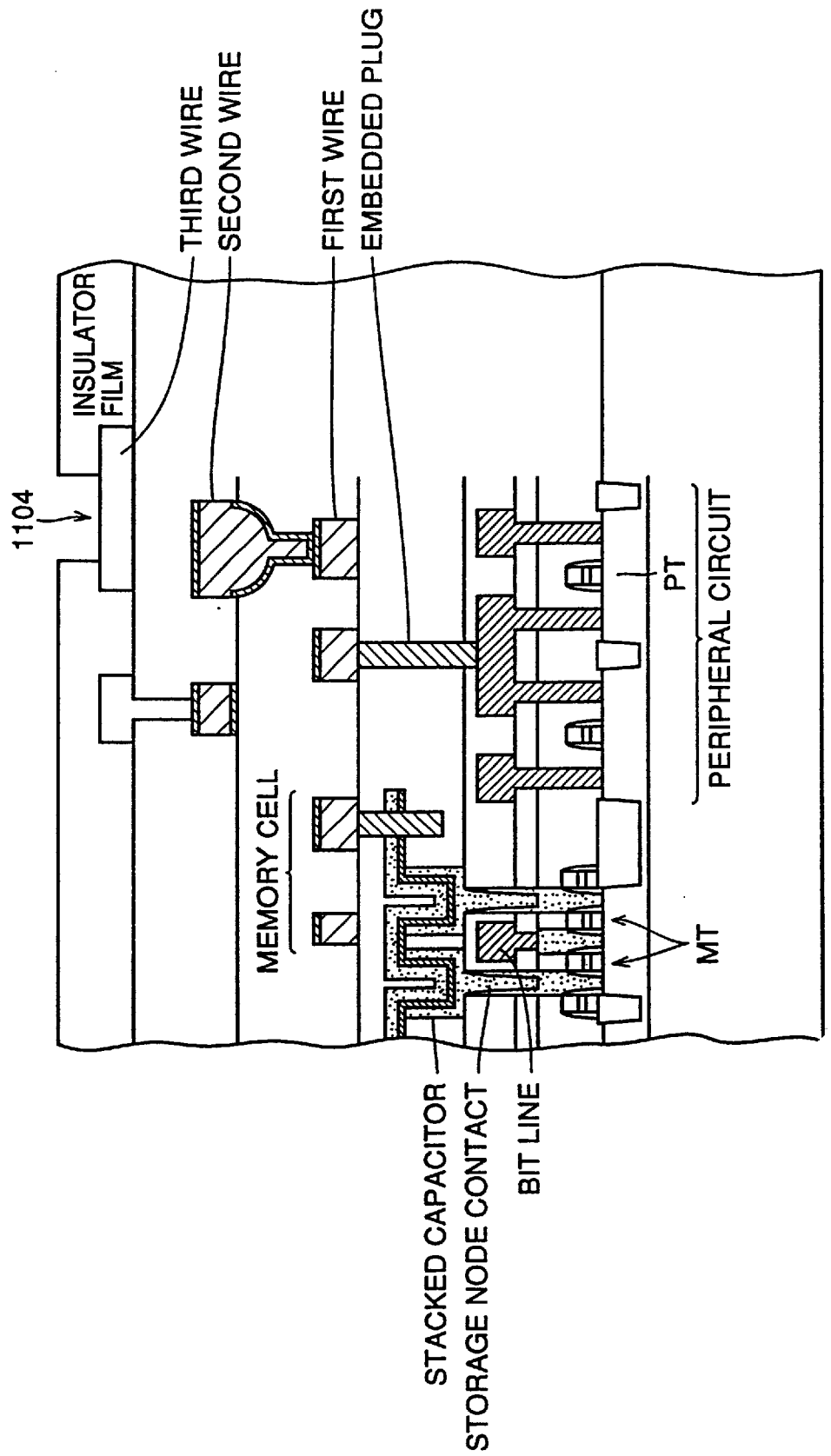
FIG. 11 is a sectional view for illustrating the structure of the memory core 1000 to be oppositely bonded to the logic part 3000.

FIG. 11 is a sectional view for illustrating the structure of the memory core 1000 to be oppositely bonded to the logic part 3000 as shown in FIG. 4.

FIG. 11 shows the sectional structure of a memory having the so-called stack memory cell.

A memory cell transistor MT is connected with a storage node of a stacked capacitor through a storage node contact, and switches connection between the storage node and a bit line in response to the potential level of a word line.

A transistor PT forming the peripheral circuit is electrically connected with the external device through an embedded plug metal, a first layer aluminum wire and a second layer wire, finally by a third layer wire. This third layer wire corresponds to the input/output pad 1104.

Figure 12:
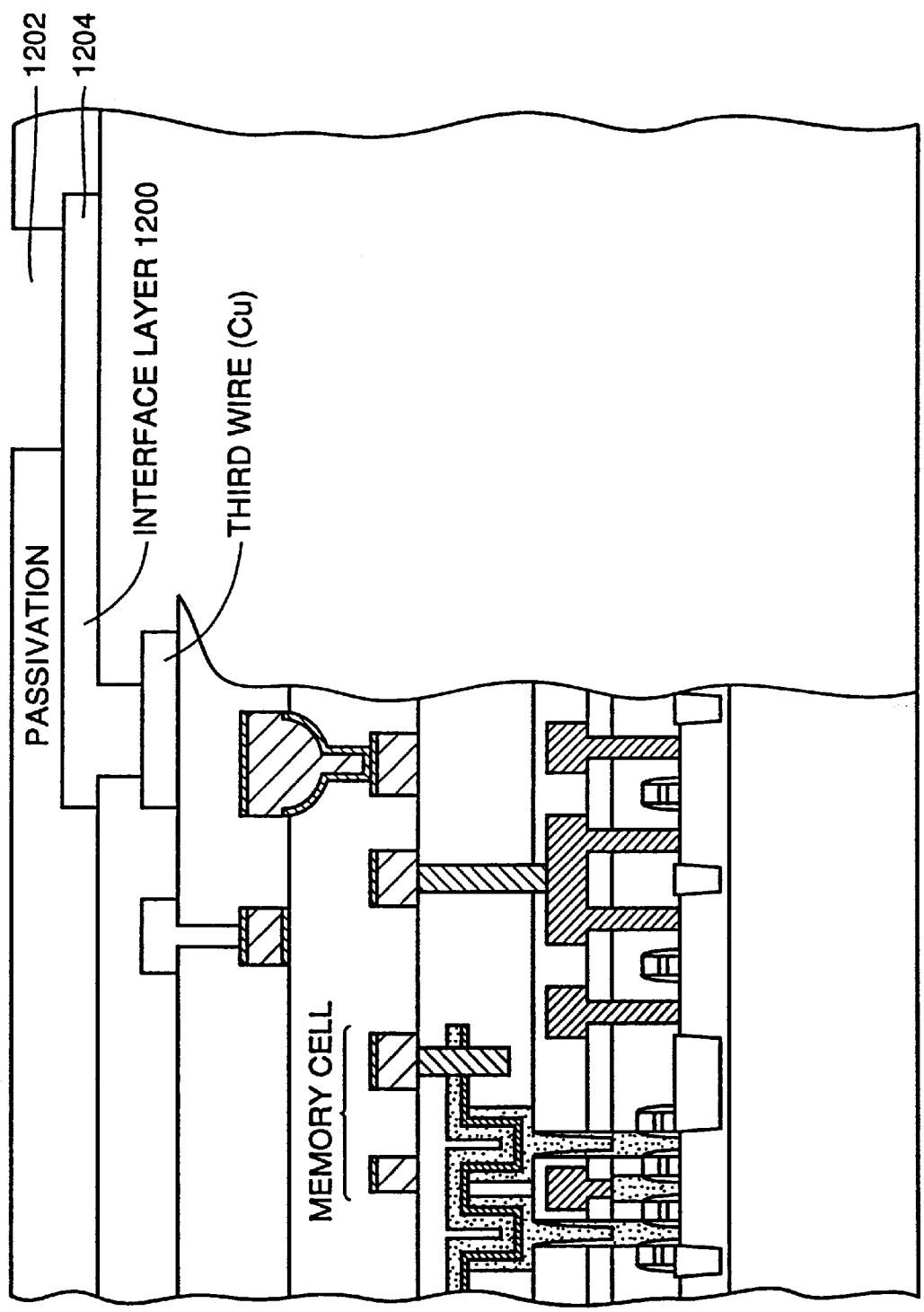
FIG. 12 is a sectional view showing a sectional structure for further forming the interface layer 1200 for the memory core shown in FIG. 11.

FIG. 12 is a sectional view showing the sectional structure of the memory core shown in FIG. 11 further formed with the interface layer 1200.

The interface layer 1200 is connected with the third layer wire (e.g., a copper wire) shown in FIG. 11. A passivation film further formed on the upper surface of the interface layer 1200 opens on the pad 1202 thereof.

Figure 13:
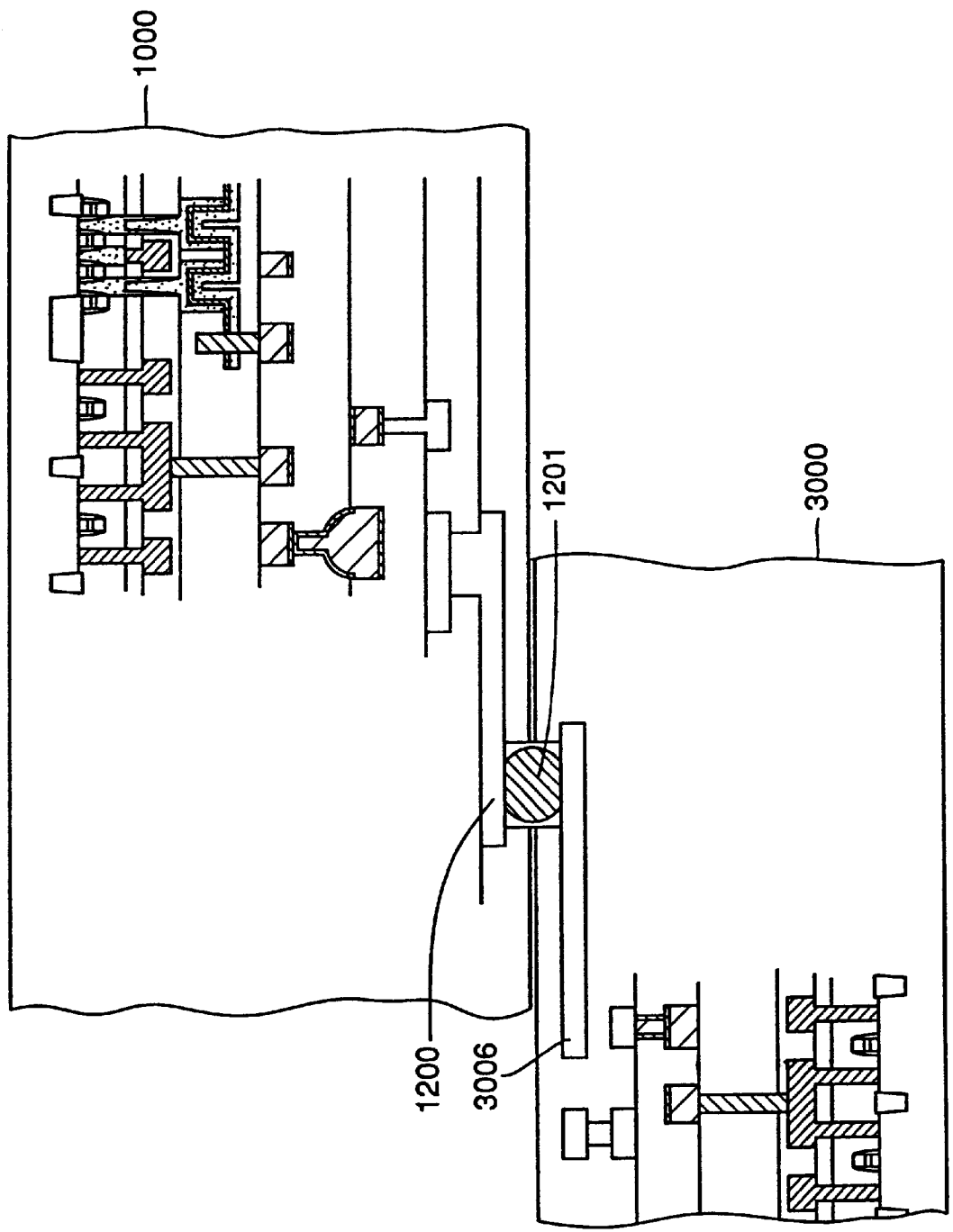
FIG. 13 illustrates a sectional structure for connecting the memory core 1000 shown in FIG. 12 onto the logic core 3000 on a flip chip.

FIG. 13 illustrates the sectional structure of the memory core 1000 shown in FIG. 12 connected with the logic core 3000 on a flip chip.

A pad 3006 of the logic core 3000 and the pad 1202 of the memory core 1000 are connected with each other through the solder bump 1201.

Figure 14:
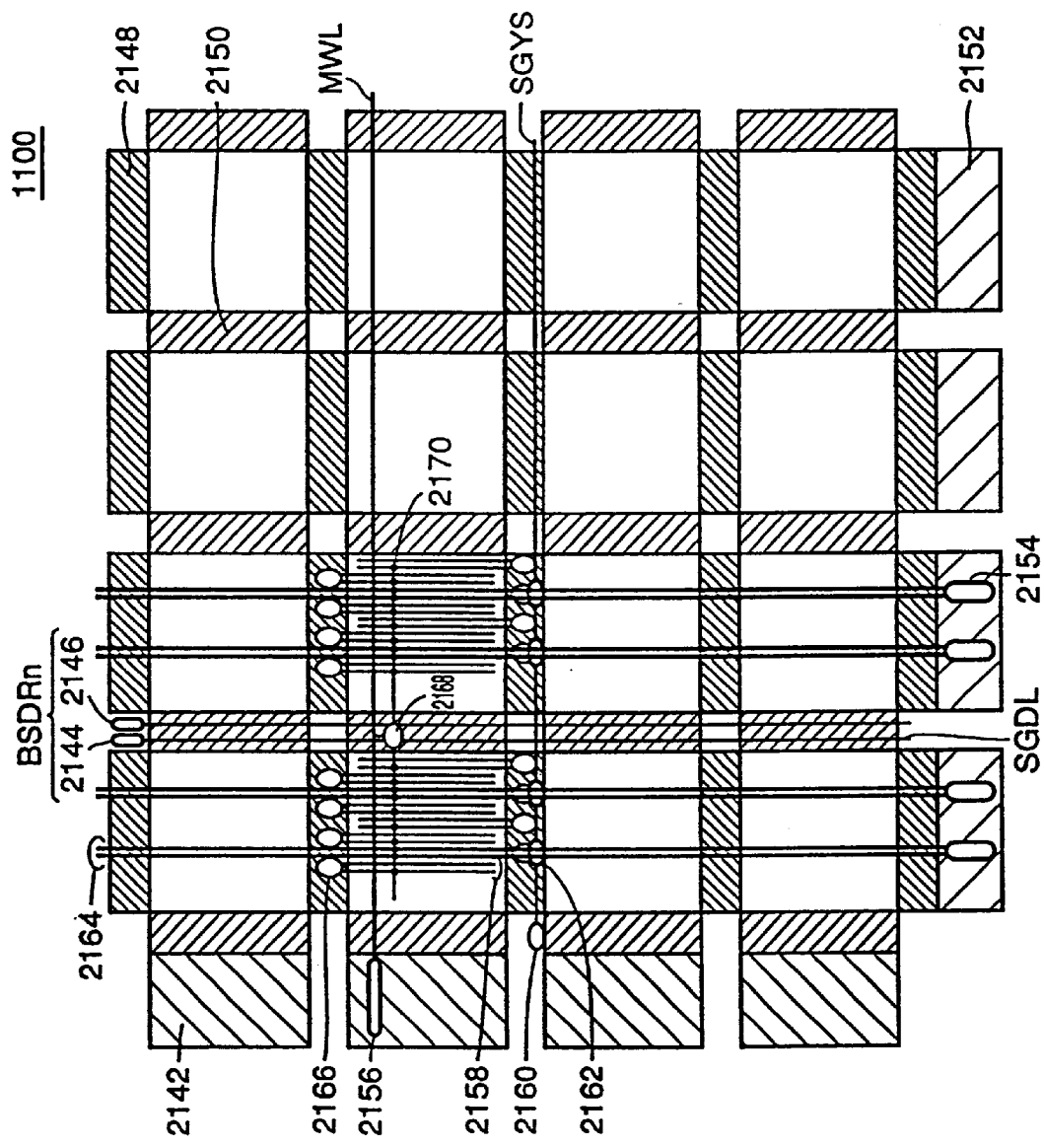
FIG. 14 is a schematic block diagram for illustrating the structure of a memory array 1100 shown in FIG. 1.

FIG. 14 is a schematic block diagram for illustrating the structure of the memory array 1100 shown in FIG. 1.

Referring to FIG. 14, the memory cell array 1100 is subdivided into memory cell array units (banks) enclosed with a sense amplifier zone and a sub word driver zone. The memory cell array 1100 is activated every such memory cell array unit.

A main word line MWL provided over the memory cell array units activates a sub word driver SVVD which must be activated. A corresponding sub word line SWL is activated in response to the activation of the sub word driver SWD. Sense amplifiers are alternately arranged through the memory cell array units.

On the other hand, a sense amplifier belonging to an area where a selection line for an activated area (bank) and a sense selection line is activated.

A segment YS line is arranged across the sense amplifier zone along the word line direction of the memory cell array units.

In data reading from any memory cell array unit, the segment YS line SGYS is activated thereby activating an area where the segment YS line SGYS intersects with an activated bank selection line. Single data is read from the activated area (bank) every four sense amplifiers, for example.

This read data is transmitted to a read/write amplifier (hereinafter referred to as RIW amplifier) 2154 through a pair of data lines running in a direction perpendicular to the word line on the memory cell array.

Thereafter the read data is transmitted to a data output part through the peripheral circuit and a data bus area. In a memory/logic hybrid chip, the data is transmitted to the logic part through the data bus area.

The memory cell array 1100 has memory mats (banks) arranged in four rows and four columns, while a main word driver group included in the main row decoder 2142 is provided in correspondence to each row and the I/O selector 2152 is provided in correspondence to each column. A sense amplifier zone 2148 and a sub word driver zone 2150 are provided for each memory mat (bank).

Row-system selection is now described. In response to a row address signal, the main word driver 2156 selectively activates the main word line MWL. Further, an SD driver 2144 activates a segment decode line SGDL (including a bank selection line BSL and a selection line SL as well as a reset line RSL). The main word line MWL and the segment decode line SGDL activate a corresponding sub word driver 2168, whereby a sub word line 2170 is activated to render an access transistor connected to a selected memory cell conductive. The selection line SL includes four selection lines SL0 to SL3.

It is assumed that the reset line RSL includes four reset lines RSL0 to RSL3.

In response to this, data is outputted to a pair of bit lines 2158 provided in correspondence to the selected memory cell column.

Column-directional selection is now described. A segment YS driver 2160 activates the segment YS line SGYS. The segment YS line SGYS includes four read source lines RGL0 to RGL3 and four write activation lines WRL0 to WRL3. A corresponding I/O gate 2162 is selectively activated due to the activation of the SGYS line, so that one of output signals from four sense amplifiers is externally read through an I/O line 2164.

The read source lines RGL0 to RGL3 are generically referred to as read source lines RGL and the write activation lines WRL0 to WRL3 are generically referred to as write activation lines WRL.

Figure 15:
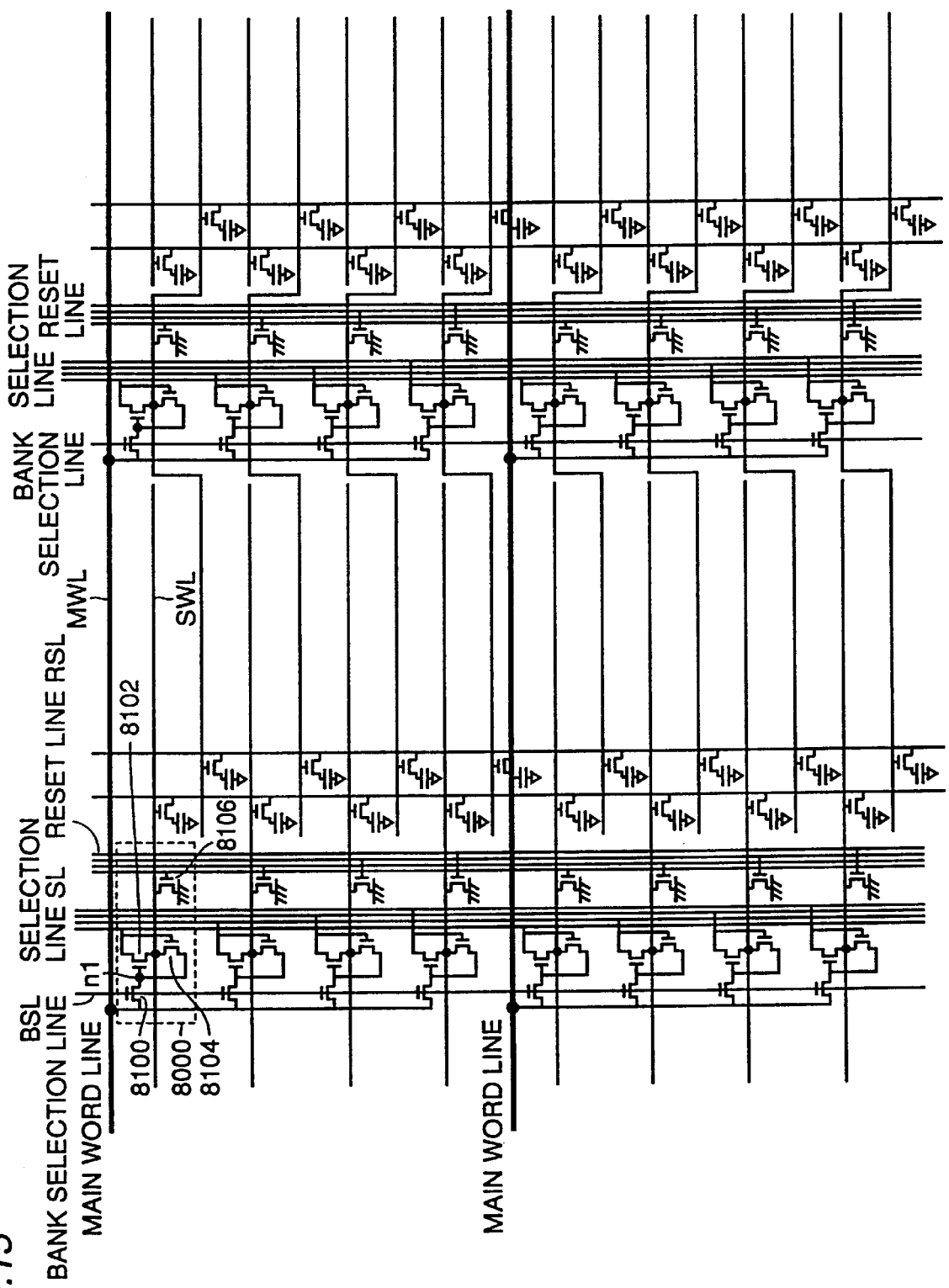
FIG. 15 is a circuit diagram showing the structure of a sub word driver zone BSDRn shown in FIG. 14 in detail.

FIG. 15 is a circuit diagram for showing the detailed structure of a sub word driver zone BSDRn shown in FIG. 14.

A driver circuit 8000 includes a selection transistor 8100 provided between the main word line and an internal node n1 with a gate controlled by the bank selection line BSL, a transistor 8102 connected between the selection line SL0 and the sub word line SWL with a gate connected to the node n1, and a transistor 8104 connected between the sub word line SWL and the node n1 with a gate potential controlled by the same selection line SL0 as that for the transistor 8102. The driver circuit 8000 further includes a transistor 8106 connected between the sub word line and a ground potential with a gate potential controlled by the reset line RSL0.

Similar structures are present also as to the remaining main word lines and sub word lines.

The main word line MWL, the bank selection line BSL and any of the selection lines SL are activated due to the aforementioned structure for bringing the corresponding sub word line SWL into an active state (high potential), while the reset line RSL is selectively activated thereby discharging the corresponding sub word line SWL to the ground potential.

In the example shown in FIG. 15, the single main word line MWL controls four sub word lines SWL in each bank, while which one of the sub word lines SWL is selected is specified by activation of one of the selection lines SL.

The potential of the bank selection line BSL reaches the level of a step-up voltage Vpp in activation, and changes to the level of the ground potential Vss after the sub word line SWL is activated. In this case, it follows that a latch circuit formed by the transistors 8102 and 8104 holds the active state of the bank selection line BSL. The potentials of the selection line SL and the reset line RSL are controlled to be complementary to each other.

In a standby operation, the bank selection line BSL and the selection line SL are at the level of the ground potential (GND), and the reset line RSL is at the level of a power supply potential (Vcc).

In activation, the corresponding reset line is set at the ground potential (GND), and the bank selection line BSL corresponding to the sub word line SWL to be activated is activated so that its potential reaches the level of the step-up potential Vpp.

Then, the main word line MWL is activated to reach the power supply potential (Vcc). Substantially simultaneously with the activation of the main word line MWL, one of the selection lines SL reaches the level of the power supply potential (Vcc), while the sub word line SWL reaches a level (Vcc-Vth). Thereafter the bank selection line BSL changes to the level of the ground potential (GND), so that charges are trapped in the latch circuit in the driver circuit 8000.

When increasing the potential of the selected one of the selection lines SL to the level of the step-up potential (Vpp) while the charges are trapped by the transistors 8102 and 8104, it follows that the potential of the sub word line SWL changes to the level of the step-up potential (Vpp).

In a reset operation, the potential of the bank selection is raised to the level of the power supply potential (Vcc), while the selection line SL is set at the level of the ground potential (GND). Further, the reset line is set at the level of the power supply potential (Vcc), thereby discharging charges stored in the sub word line SWL.

By employing the aforementioned structure, the sub word line driver 8000 can be formed by only four elements, i.e., N-channel MOS transistors, whereby the number of the elements can be reduced.

Further, activation of the main word line is performed as a one-shot pulse signal, as described later. When the transistors 8102 and 8104 hold the main word line in an active state once in the sub word driver 8000 corresponding to the selected sub word line, it follows that the potential level of the main word line is reset. In such a structure, the potential level of the main word line exerts no influence on the sub word driver 8000 unless the bank selection line BSL is activated, also when a plurality of banks are aligned along the main word line direction as shown in FIG. 14. Therefore, it is possible to drive two banks adjacent to each other along the row direction independently of each other, as shown in FIG. 14.

Figure 16:
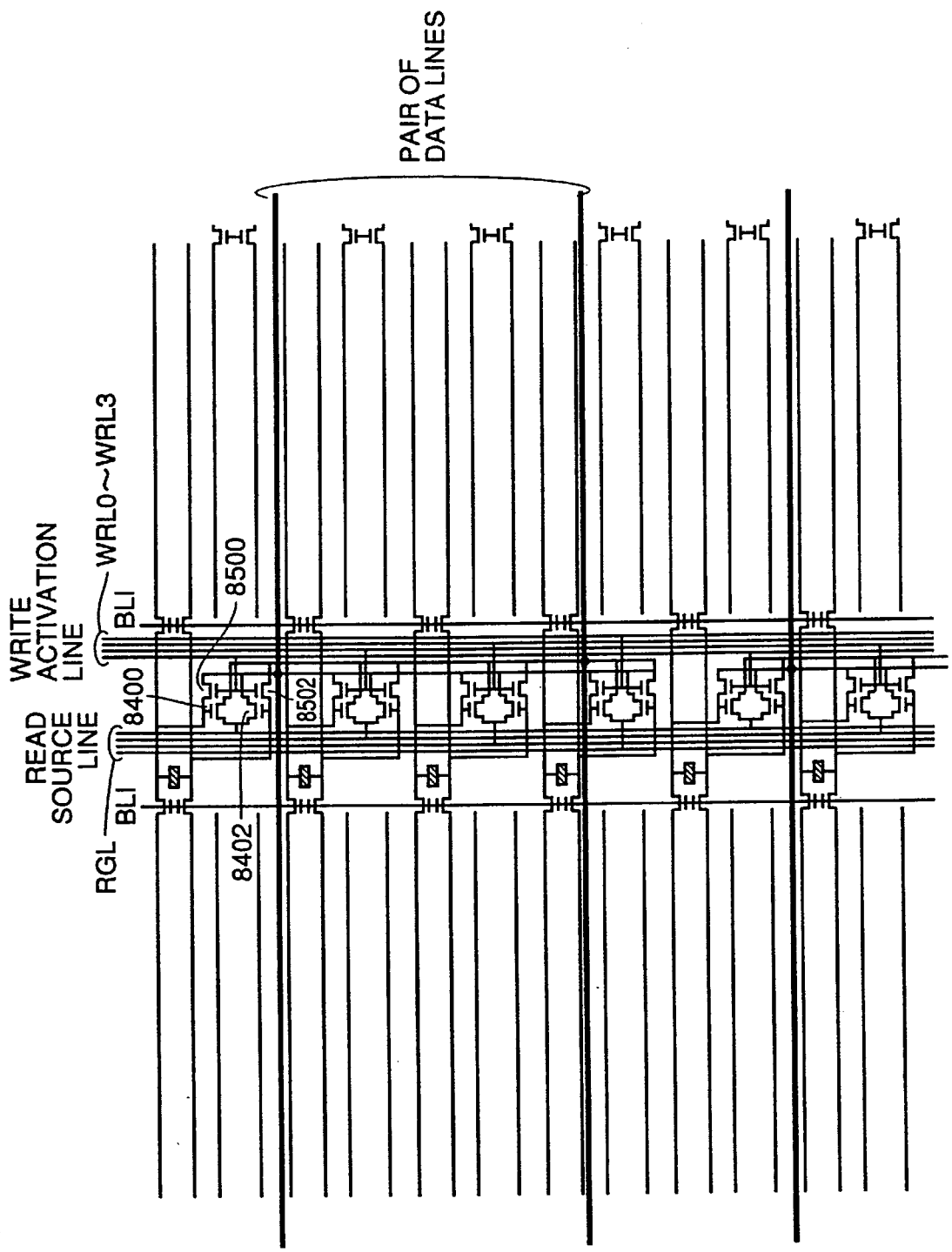
FIG. 16 is a circuit diagram showing a structure connecting a sense amplifier part with a data line part.

FIG. 16 is a circuit diagram showing a structure for connection between a sense amplifier part and a data line part.

An input/output node of a sense amplifier transmits a data signal through gate receiving transistors 8400 and 8402 and through a pair of data lines DL and /DL.

The transistors 8400 and 8402 have sources selectively set at the ground potential by the read source lines RGL, gates connected to the input/output node of the corresponding sense amplifier S/A respectively, and drains connected to the corresponding pair of data lines DL and /DL.

In the structure shown in FIG. 16, four sense amplifiers share the single pair of data lines DL and /DL.

On the other hand, the pair of data lines DL and /DL are selectively connected by transistors 8500 and 8502 connected between a corresponding bit line BL and the data line DL and between a bit line /BL and the corresponding data line /DL respectively.

In other words, input/output nodes of sense amplifiers S/A0 to S/A3 corresponding to pairs of bit lines BL0 and /BL0 to BL3 and /BL3 respectively are selectively connected to the pair of data lines DL and /DL by the transistors 8500 and 8502 whose gate potentials are controlled by the corresponding write activation lines WRL0 to WRL3 respectively.

As hereinabove described, the segment YS line shown in FIG. 14 includes the read source lines RGL (generically denoting the read source lines RGL0 to RGL3), the write activation lines WRL (generically denoting the write activation lines WRL0 to WRL3) and the like.

According to the aforementioned structure, the pair of data lines DL and /DL are not directly connected with the input/output node of the corresponding sense amplifier but the gates of the transistors 8400 and 8402 are driven by the potential level of the input/output node of the sense amplifier to change the levels of the pair of data lines Dl and /DL in a data read operation, whereby the data can be read with no destruction even if selection of a memory cell column by a column address signal, i.e., selection of any of the read source lines RGL0 to RGL3 overlaps with of precedes amplification by the sense amplifier.

This means that the read operation can be performed at a high speed, as described above. Further, the sense amplifier can be activated every limited area, whereby an operating current peak value can be suppressed and effects such as reduction of power consumption, reduction of noise and the like can be attained.

Figure 17:
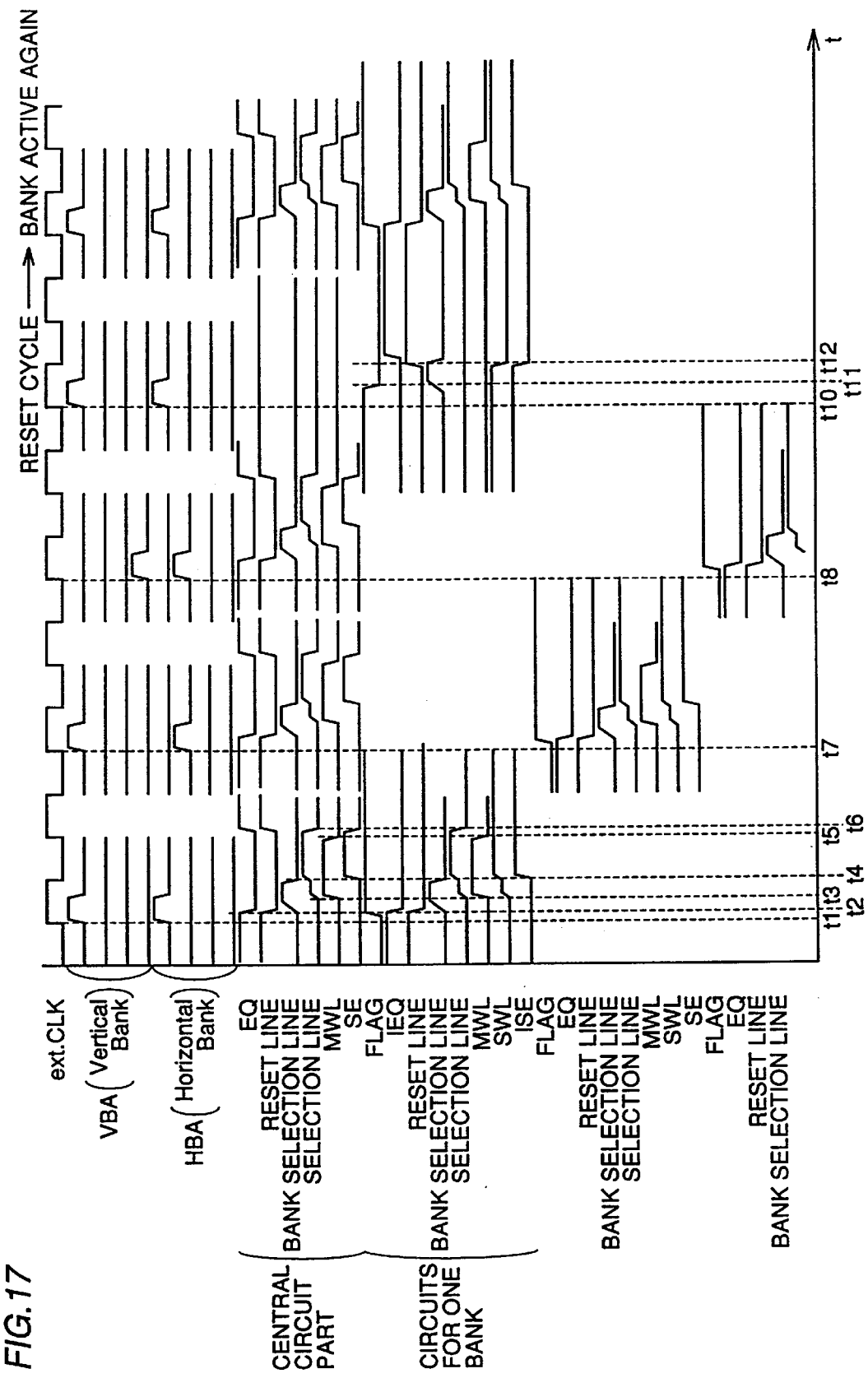
FIG. 17 is a timing chart for illustrating operations of the SDRAM 1000.

FIG. 17 is a timing chart for illustrating operations of the SDRAM 1000 described above.

Referring to FIG. 17, a signal VBA indicating a vertical address and a signal HBA indicating a horizontal address among the banks arranged in four rows by four columns shown in FIG. 14 are supplied on the edge of activation of the external dock signal ext.CLK at a time tl.

At a time t2, the bank selection line BSL is activated as a one-shot signal in response to the horizontal bank address signal HBA, the segment YS line SGYS is activated in response to the vertical bank address VBA, and a FLAG signal indicating activation of the selected bank is activated in a local control circuit provided for each bank. The transistor 8100 is rendered conductive in response to the activation of the bank selection line BSL.

At the time t2, further, levels of an equalize signal EQ indicating an equalize operation for a pair of bit lines and a pair of I/O lines and the reset signal RSL for resetting the sub word line level are inactivated (low level).

At a time t3, the main word line MWL is selectively activated at the power supply potential Vcc in response to the row address signal, and one of the selection lines SL is selectively activated at the Vcc level substantially at the same time.

At a time t4, the bank selection line BSL is inactivated (GND level), while the selection line SL is driven to the level of the step-up potential (Vpp). In response to this, the selected sub word line SWL is also driven to the level of the step-up potential.

At the time t4, further, a sense amplifier activation signal SE is also activated to amplify read data from the memory cell connected to the selected sub word line SWL.

The main word line MWL is inactivated at a time t5 and the selection line SL is inactivated at a time t6, while the selected sub word line SWL is maintained at an active level (Vpp level).

While the sense amplifier activation signal SE from outside the memory cell array 1100 is inactivated at the time t6, a sense amplifier activation signal ISE in the selected bank maintains an active state.

On the activation edge of the external dock signal ext-.CLK at a time t7, supplied are a signal VBA indicating an address in the vertical direction and a signal HBA indicating an address in the horizontal direction for a bank other than those supplied at the time t1 in the banks arranged in four rows by four columns. Thereafter a read operation is performed for this selected bank similarly to the operation at the times t1 to t6.

On the activation edge of the external clock signal ext-.CLK at a time t8, further, supplied are a signal VBA indicating an address in the vertical direction and a signal HBA indicating an address in the horizontal direction for a bank other than those supplied at the time t1 in the banks arranged in four rows by four columns. Thereafter a read operation is performed for this selected bank similarly to the operation at the times t1 to t6.

At a time t10, a signal VBA indicating an address in the vertical direction and a signal HBA indicating an address in the horizontal direction are supplied for specifying a bank to be reset. In response to this, the selected bank selection line BSL is activated while the flag signal FLAG having indicated activation of the bank is inactivated at a time t11.

Thereafter the level of the reset line RSL is activated at a time t12, and the level of the sub word line SWL is responsively inactivated. On the other hand, the sense amplifier activation signal is inactivated and thereafter the equalize signal EQ is activated to complete the reset operation.

Thereafter the banks are selected and activated again in response to external bank address signals.

Due to the aforementioned structure, each of the memory cell array units obtained by splitting the memory cell array in the row and column directions operates as a bank so that the number of transistors forming the sub word driver can be reduced in the case where the word lines are layered to operate.

[Embodiment 2]

Figure 18:
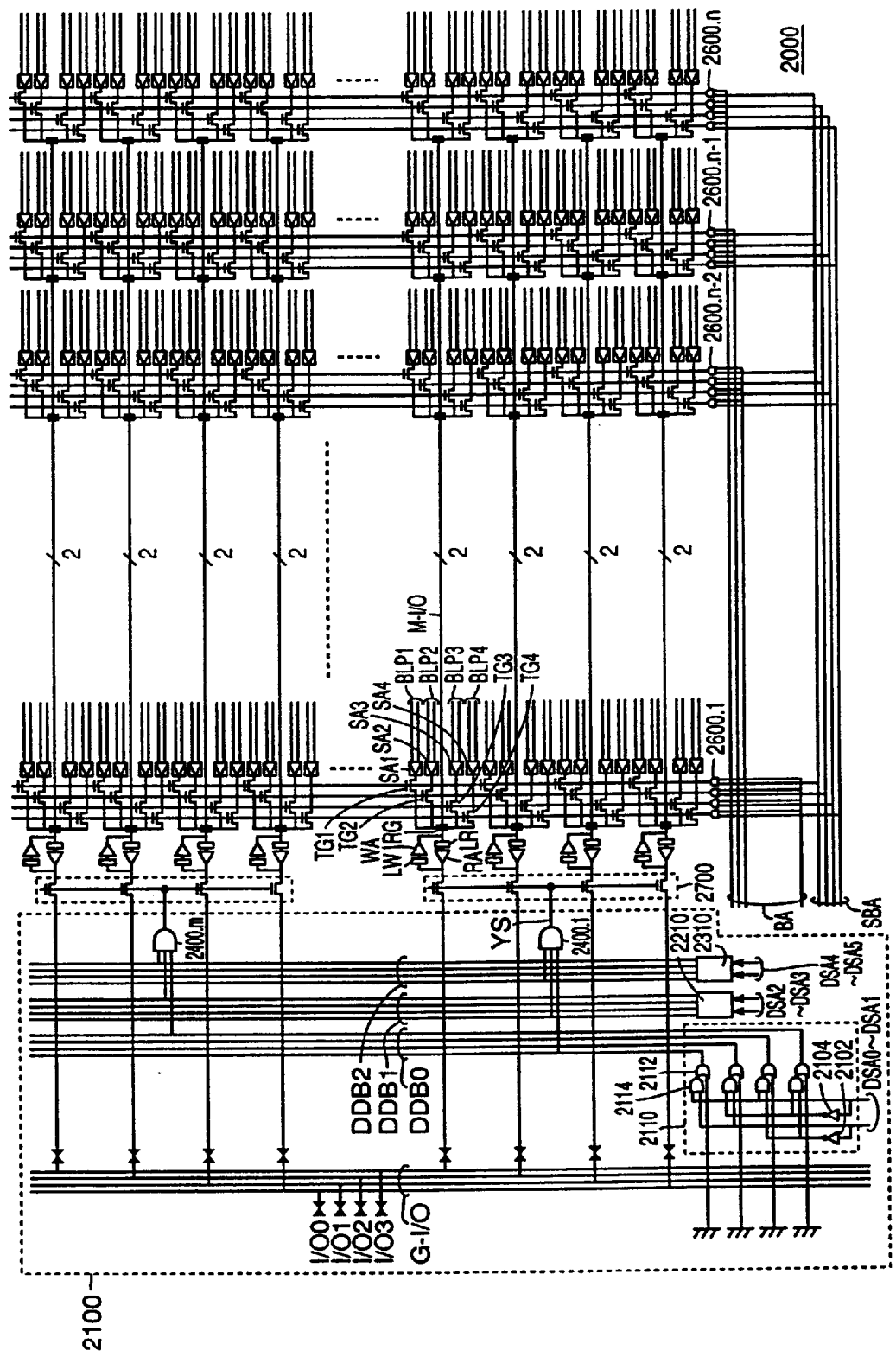
FIG. 18 is a schematic block diagram for illustrating the structure of a memory array 2000 of a semiconductor memory device according to an embodiment 2 of the present invention.

FIG. 18 is a schematic block diagram for illustrating the structure of a memory array 2000 of a semiconductor memory device according to an embodiment 2 of the present invention.

The remaining structure is similar to the structure of the semiconductor memory device 1000 according to the embodiment 1, and hence redundant description is omitted.

In the semiconductor memory device 1000 according to the embodiment 1, the number of bits (hereinafter referred to as I/O number) transferring data in the interface part in data input/output is corrected to a prescribed value such as 32 bits, for example.

As described with reference to FIG. 4 or the like for the embodiment 1, however, it may be necessary to change the I/O number when connecting the memory core 1000 to the logic core 3000, depending on the specification of the logic core 3000.

If it is necessary to also totally change the design of the memory cell array part, for example, of the memory core part in this case, it unpreferably follows that a long time is required for developing the products.

Therefore, the memory array 2000 of the semiconductor memory device according to the embodiment 2 aims at attaining a structure capable of flexibly changing the aforementioned I/O number by simply changing a partial circuit without changing principle parts of the memory array.

Referring to FIG. 18, the memory array 2000 according to the embodiment 2 is formed by each repetitive unit of four pairs of bit lines BLP1 to BLP4 and sense amplifiers SA1 to SA4 connected to these pairs of bit lines.

While the sense amplifiers SA1 to SA4 are arranged on the same side as the pairs of bit lines BLP1 to BLP4, the sense amplifiers SA1 and SA3 and the sense amplifiers SA2 and SA4 may alternatively be arranged on opposite sides through the pairs of bit lines.

The sense amplifiers SA1 to SA4 are connected to a gate circuit RG through transistors TG1 to TG4 respectively.

Which one of the sense amplifiers SA1 to SA4 is connected with the gate circuit RG is controlled by a decode signal from decode circuits 2600.1 to 2600.n (n: natural number) receiving and decoding a bank address BA and a sub bank address SAB.

The gate circuit RG connects the sense amplifier selected by the corresponding one of the decode circuits 2600.1 to 2600.n with a main I/O line.

While FIG. 18 illustrates the sense amplifier SA1 or the like and the gate circuit RG connected by a single signal, the same may be connected by a complementary pair of signals so that data is transferred between the selected one of the sense amplifiers SA1 to SA4 and a pair of main I/O lines M-I/O through the gate circuit RG. The following description is made on the assumption that data transmission is performed by a pair of main I/O lines.

The pair of main I/O lines M-I/O are provided in common for the repetitive units each formed by the aforementioned four sense amplifiers, which are arranged along the direction of the pairs of bit lines.

The pair of main I/O lines M-I/O coupled with the selected sense amplifier through the gate circuit RG are supplied with write data through a latch circuit LW latching externally supplied write data and a write driver circuit WA in data writing. In a read operation, data read on the pair of main I/O lines M-I/O is temporarily held in a read latch circuit LR and thereafter amplified by a read driver RA.

An input of the write latch circuit LW or an output of the read driver RA is connected to a global I/0 bus G-I/O through a gate circuit 2700.

In the example shown in FIG. 18, the gate circuit 2700 is provided every four repetitive units each including four sense amplifiers and selected by a data decode circuit 2100 to be connected to the corresponding global I/O bus G-I/O.

In the structure shown in FIG. 18, four data read from the four repetitive units connected to the single gate circuit 2700 are outputted to four I/O ports I/O0 to I/O3 through the global I/O data bus G-I/O.

The data selection decoder 2100 includes a predecoder 2110 receiving data selection addresses DSA0 to DSA1, a predecoder 2210 receiving data selection addresses DSA2 to DSA3, a predecoder 2310 receiving data selection addresses DSA4 to DSA5, a decode data bus DDB0 transmitting a decode signal from the predecoder 2110, a decode data bus DDB1 transmitting a decode signal from the predecoder 2210, a decode data bus DDB2 transmitting a decode signal from the predecoder 2310, and decode gates 2400.1 to 2400.m for activating the selected gate circuit 2700 in response to the decode data buses DDB0 to DDB2.

It is assumed that the predecoders 2210 and 2310 are similar in structure to each other except the data selection addresses inputted therein.

In the structure shown in FIG. 18, only one gate circuit 2700 is activated in selection, whereby all values of the data selection addresses DSA0 to DSA5 are efficiently employed for selecting the gate circuit 2700.

The predecode circuit 2110 includes an AND circuit 2114 receiving the data selection addresses DSA0 and DSA1, for example, as inputs, and an OR circuit 2112 receiving an output of the AND circuit 2114 in one input while receiving a ground potential (low level) as another input for outputting a first decode signal to the decode data bus DDB0.

The predecode circuit 2110 similarly includes AND circuits receiving two signals among the signal DSA0, a signal obtained by inverting the signal DSA0 by an invertor 2102, the signal DSA1 and a signal obtained by inverting the signal DSA1 by an invertor 2104 respectively and an OR circuit receiving outputs of these AND circuits in one input and receiving the ground potential in another input.

The OR circuit 2112 and the like entirely receive low levels in other input nodes, whereby signals outputted from the AND circuit 2114 and the like are transmitted to the decode data bus DDB0 as such in FIG. 18.

In other words, it follows that the decode data bus DDBO transmits a result obtained by decoding data of four bits generated by combination of the data selection addresses DSA0 and DSA1.

This also applies to the remaining predecode circuits 2210 and 2310.

By employing the aforementioned structure, a memory core having an I/O number for four bits can be implemented when employing the structure of the data selection decoder 2100 shown in FIG. 18 as to the memory array 2000.

Figure 19:
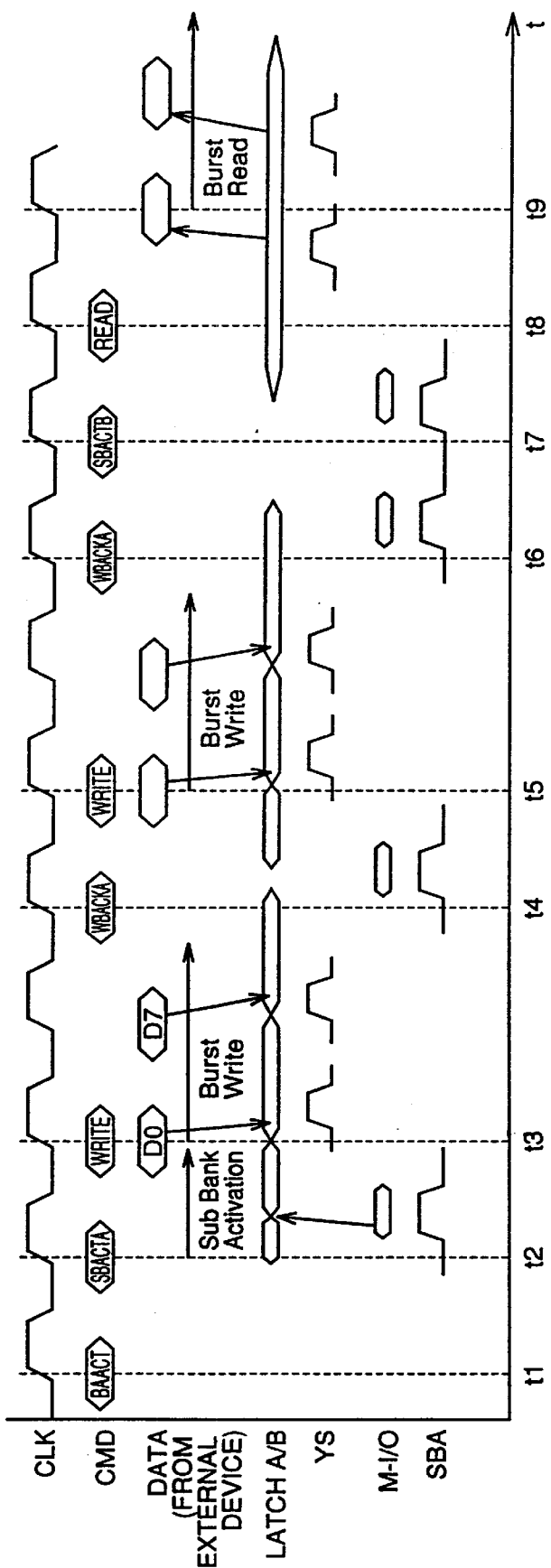
FIG. 19 is a timing chart for illustrating operations of the memory core shown in FIG. 18.

FIG. 19 is a timing chart for illustrating operations of the memory core shown in FIG. 18.

Referring to FIG. 19, a bank act signal BAACT is inputted as a command signal on the leading edge of an external clock signal CLK at a time t1, thereby activating a sense amplifier in a bank 1, for example.

On the leading edge of the external clock signal CLK at a time t2, a sub bank act signal SBACTA is inputted thereby transferring data of the sense amplifier to the read latch circuit LR.

In other words, the sense amplifier is selected in response to the output signals from the decode circuits 2600.1 to 2600.n so that read data is selectively outputted to the pair of main I/O lines M-I/O and fetched in the latch circuit LR.

The data fetched in the read latch LR at this time is also transferred to and held in the write latch circuit LW.

At a time t3, a write command WRITE is supplied while first-bit write data D0 is simultaneously supplied.

The externally write data DO is thus selectively transmitted from the I/O port to the write latch circuit LW through the gate circuit corresponding to any activated one of the decode circuits 2400.1 to 2400.m. Thereafter the decode circuits 2400.1 to 2400.m are sequentially selected by a burst length (e.g., for eight bits), for transmitting data from the I/O port to the corresponding write latch circuit.

Referring to FIG. 19, symbol YS denotes the signal outputted from the decode circuits 2400.1 to 2400.m.

At a time t4, a write back command WBACKA is supplied so that the data supplied to the write latch LW after the time t3 are batch-transmitted to the sense amplifier selected by the sub bank address SAB through the pair of main I/O lines M-I/O.

A write operation between times t5 and t6 is similar to the above.

It is assumed that, after a write back command WBACKA is supplied at the time t6, data is read at a time t7 from a bank different from that the data is written.

In response to a sub act command SBACTB, the sub bank address SBA is selectively activated so that data reading is performed from the selected sense amplifier to the pair of main I/O lines M-I/O and the corresponding read latch circuit LR stores the read data When When a read command READ is supplied at a time t8, the decoder circuits 2400.1 to 2400.m are sequentially selected in response so that data output by the burst length is performed after a time t9.

Figure 20:
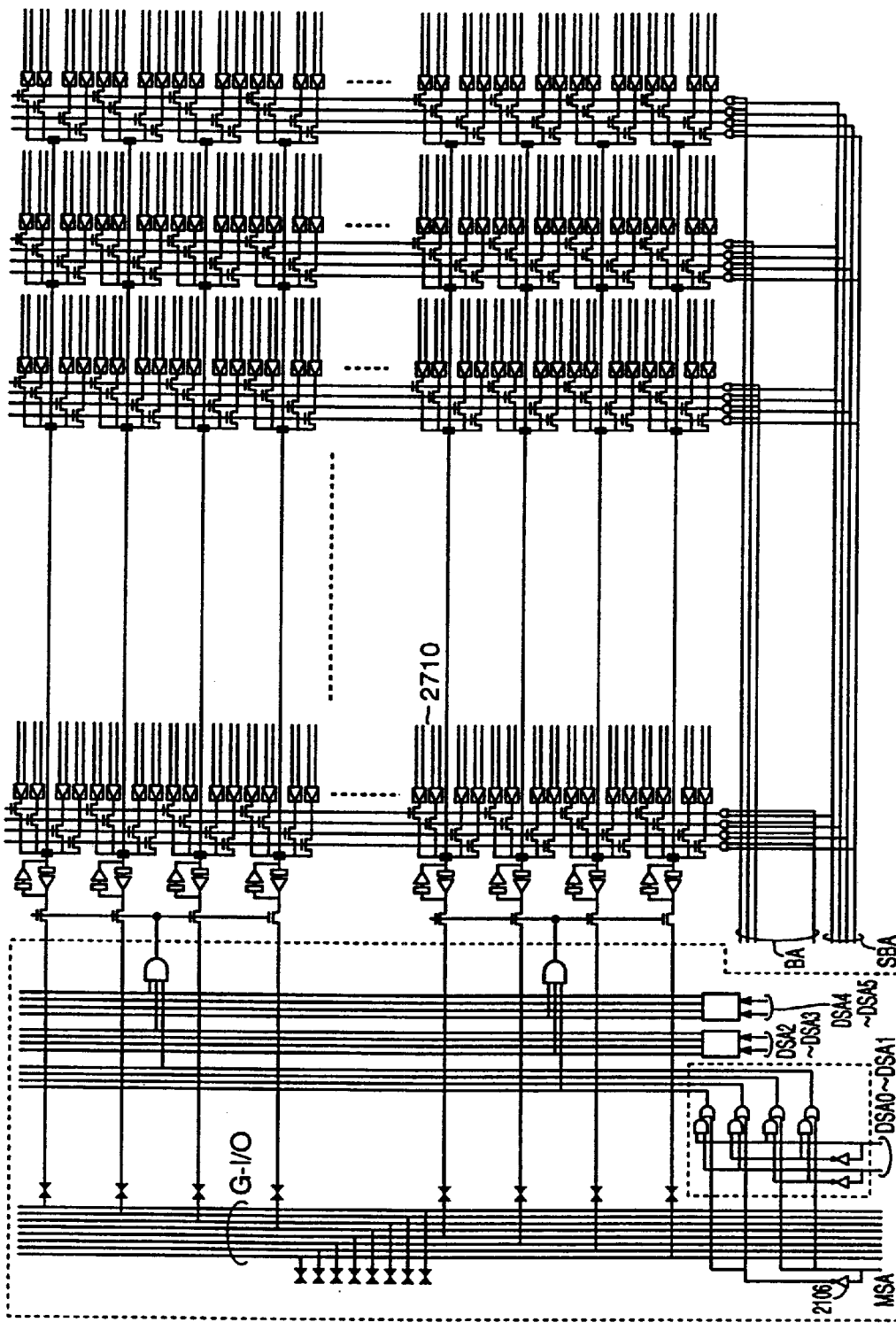
FIG. 20 illustrates a structure obtained by replacing a data selection decoder 2100 with a data selection decoder 2800 in the structure shown in FIG. 18.

FIG. 20 illustrates a structure obtained by replacing the data selection decoder 2100 with a data selection decoder 2800 in the structure shown in FIG. 18.

Dissimilarly to the data selection decoder 2100, the data selection decoder 2800 has eight global I/O buses G-I/O and I/O ports I/OO to I/O7 for eight bits.

In response to this, a multi-selection address signal MSA or a signal obtained by inverting the signal MSA by an invertor 2106 is inputted in other input nodes of an OR circuit 2112 and the like in predecode circuits 2110 to 2310.

Thus, data for one bit is disabled in a data selection address, and two decode lines in decode data buses are simultaneously activated per predecoder.

When employing the aforementioned structure, it follows that data for eight bits are simultaneously inputted/outputted in the structure shown in FIG. 20, while data for four bits are outputted by a set of data selection addresses in the structure shown in FIG. 18.

The remaining structure is similar to that of the memory array 2000 shown in FIG. 18, and hence identical parts are denoted by identical numerals and redundant description is omitted.

Figure 21:
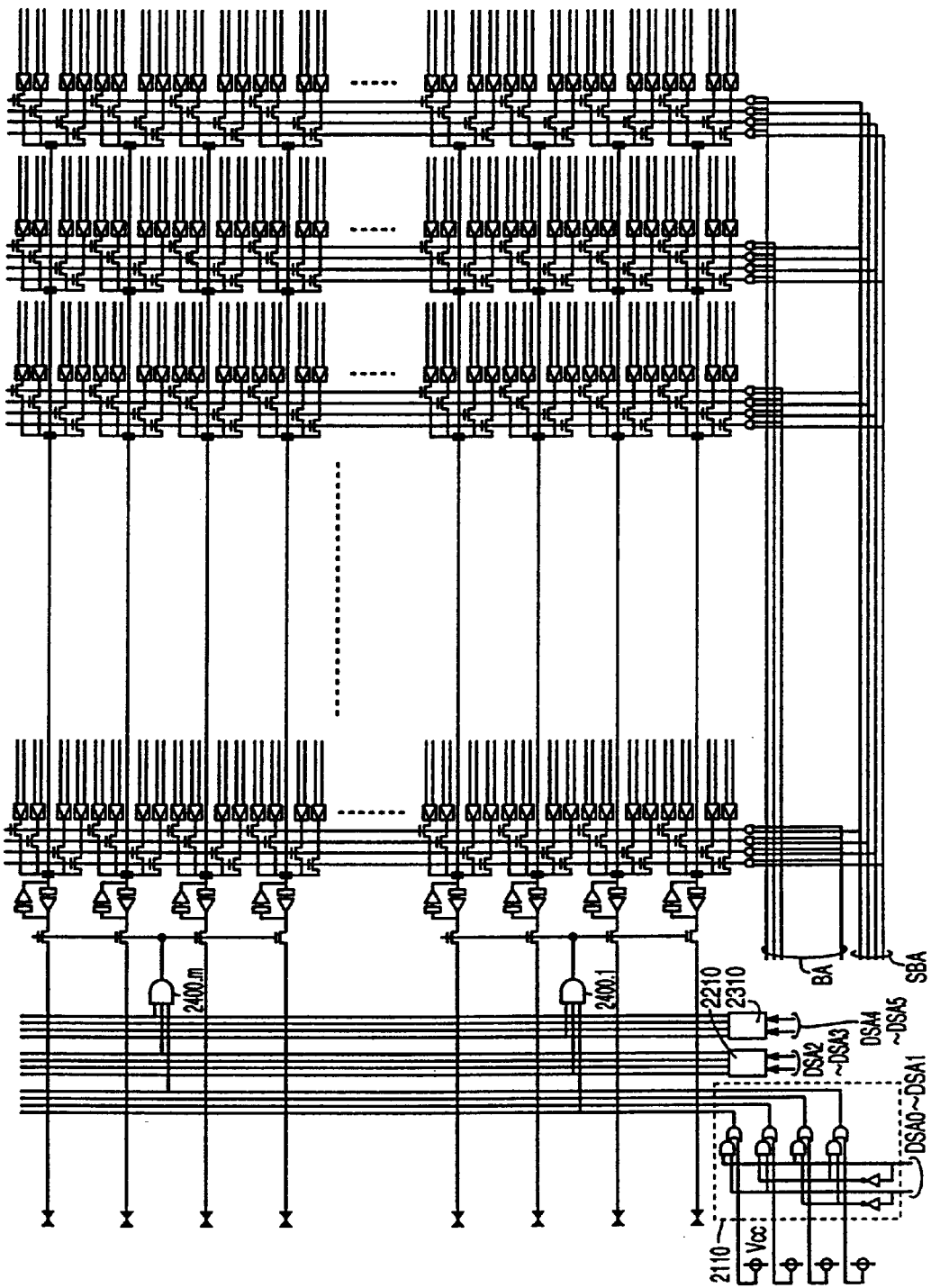
FIG. 21 is a schematic block diagram showing a second modification of the memory array 2000.

FIG. 21 is a schematic block diagram showing a second modification of the memory cell array 2000.

While the structure of FIG. 20 simultaneously inputs/outputs data for eight bits, all pairs of main I/O lines M-I/O are simultaneously activated and I/O ports are provided in a number corresponding to the pairs of main I/O lines in FIG. 21.

In the structure shown in FIG. 21, a power supply potential Vcc (high level) is supplied to another input node of an OR circuit 2112 or the like in every one of predecoders 2110 to 2310, so that outputs of all decoders 2400.1 to 2400.m go high regardless of the value of a data selection address.

As shown in FIGS. 18, 20 and 21, the I/O number can be flexibly changed in the memory array 2000 by simply changing wiring patterns of data selection decoder parts without changing the principal part.

In the structure described above, the following relational expression holds assuming that NLR represents the number of latches employed in data reading, for example:

*NLR*=(number of decoders 2400.1 to 2400.m)×(I/O number)/(degree of degeneration of multi-selection)

The degree of degeneration of multi-selection indicates disabling of one-bit data as to the data selection address, for example, and when two gate circuits 2700 are simultaneously selected, it follows that the degree of degeneration thereof is two.

Figure 22:
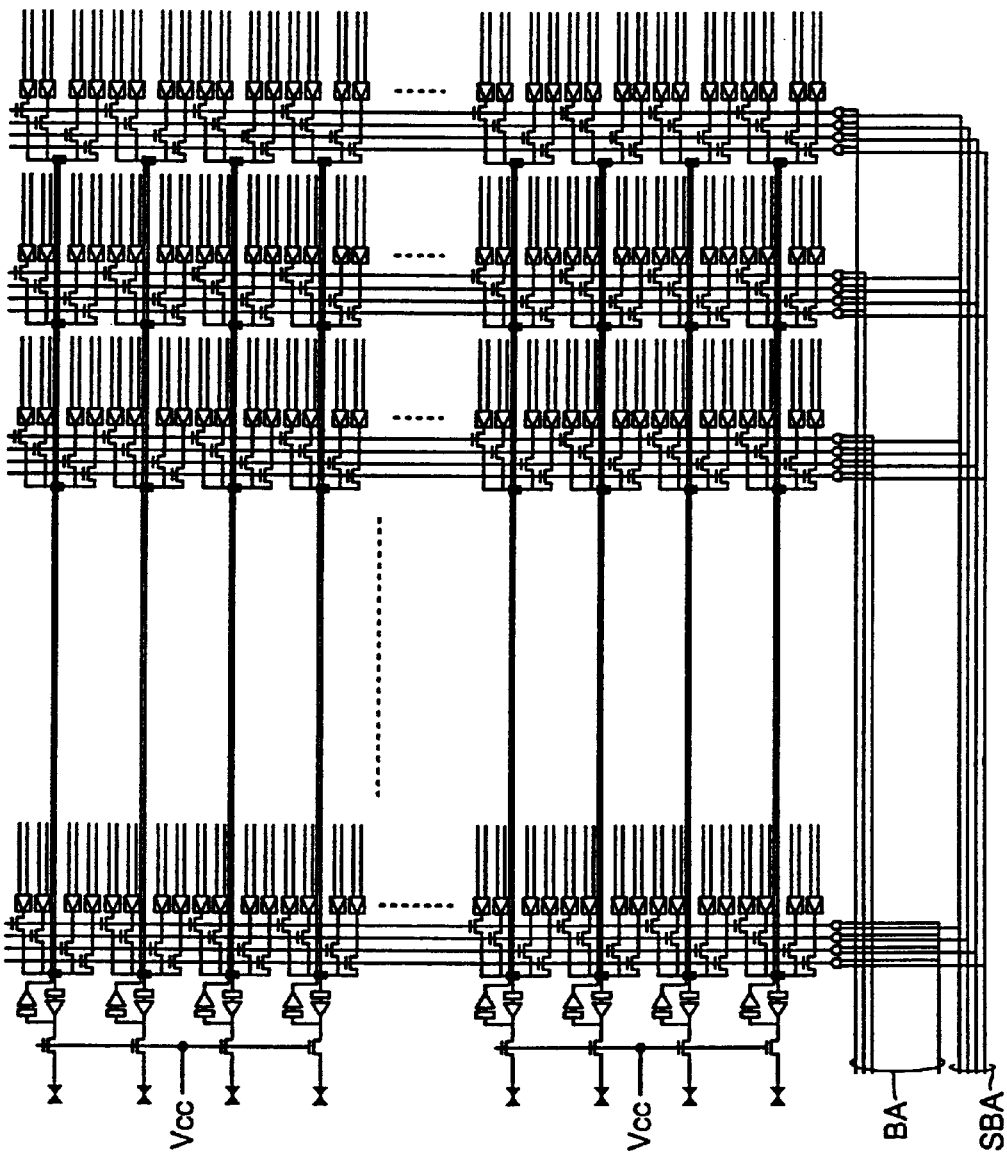
FIG. 22 is a circuit diagram showing a third modification of the structure shown in FIG. 21.

FIG. 22 is a circuit diagram showing a modification of the structure shown in FIG. 21.

In the structure shown in FIG. 22, pairs of main I/O lines for reading and pairs of main I/O lines for reading are separated from each other in the structure shown in FIG. 21.

By employing this structure, collision of read data and write data can be avoided.

As described above, I/O lines, bus wires and the like, which are shown as single lines in FIGS. 20 to 22 for simplifying the illustration, may be single or complementary lines.

[Embodiment 3]

Figure 23:
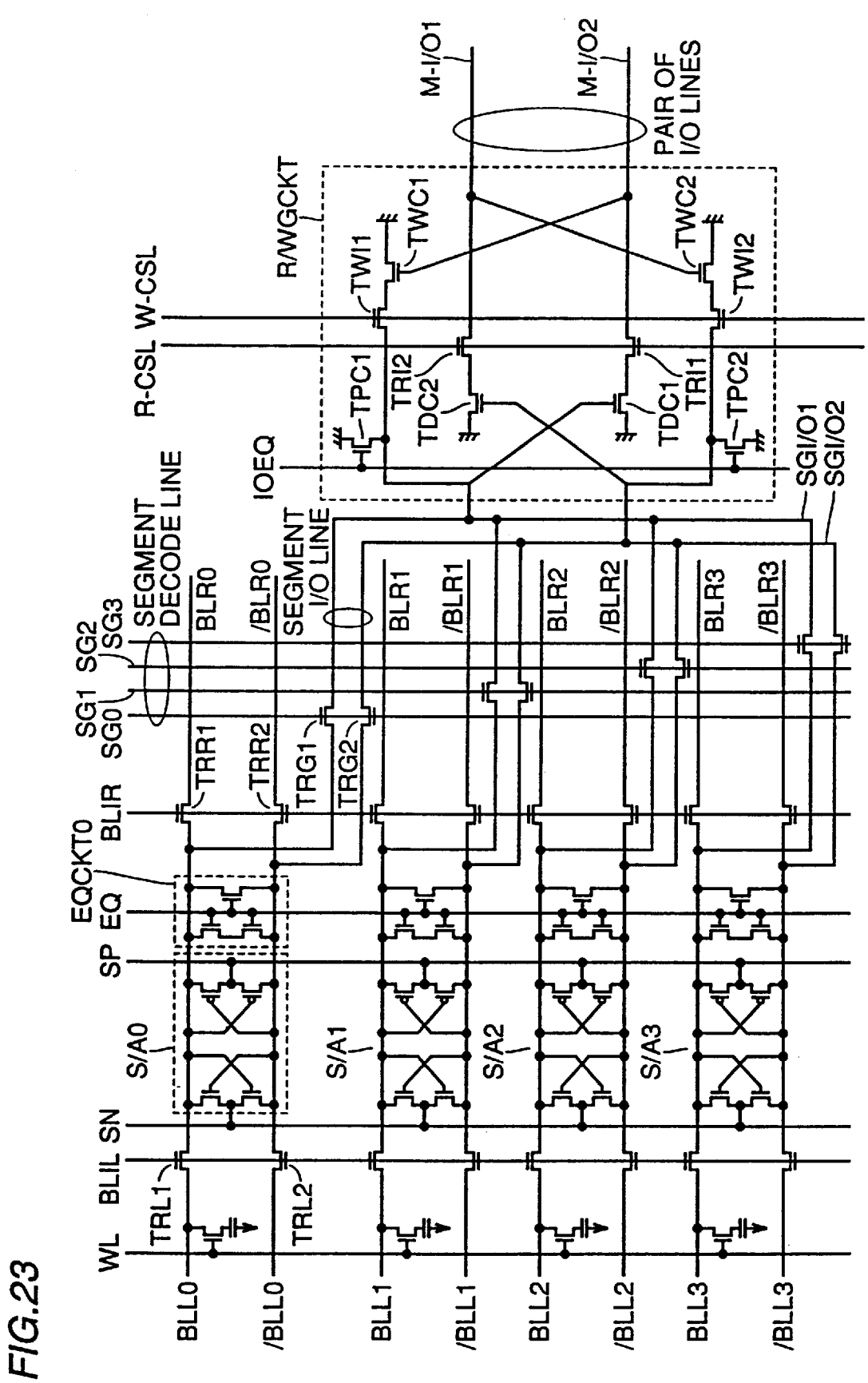
FIG. 23 is a circuit diagram illustrating the structure of a gate circuit provided between pairs of bit lines, sense amplifiers and a pair of main I/O lines according to an embodiment 3 of the present invention.

FIG. 23 is a circuit diagram illustrating the structure of a gate circuit provided between pairs of bit lines, sense amplifiers and a pair of main I/O lines according to an embodiment 3 of the present invention.

In the structure shown in FIG. 23, segment decode lines SG0 to SG3 transmit output signals from the decode circuit 2600.1 and the like shown in FIG. 18. The remaining basic structure is similar to that according to the embodiment 2 except the following points:

Referring to FIG. 23, eight pairs of bit lines BLL0 and /BLL0 to BLL3 and BLL3 and BLR0 and /BLR0 to BLR3 and /BLR3 share a pair of I/O lines. However, the present invention is not restricted to this but more pairs of bit lines may share the pair of I/O lines.

Referring to FIG. 23, the left-side pair of bit lines BLL0 and /BLL0 and the right-side pair of bit lines BLR0 and /BLR0 share a sense amplifier S/A0 and an equalize circuit EQCKT0. The sense amplifier S/A0 and the equalize circuit EQCKT0 are selectively coupled to the pair of bit lines BLL0 and /BLL0 by transistors TRL10 and TRL20 controlled by a signal BLIL, and selectively coupled to the pair of bit lines BLR0 and /BLR0 by transistors TRR10 and TRR20 controlled by a signal BLIR.

A sense node of the sense amplifier S/A0 is coupled to a pair of segment I/O lines SGI/O through transistors TRG1 and TRG2 controlled by a segment decode line SG0 respectively.

Data on the pair of segment I/O lines SGI/O are selectively transmitted to the pair of I/O lines through a read/write gate R/WCKT.

The read/write gate R/WCKT includes a transistor TDC1 having a gate connected with a first segment I/O line SGI/O1 of the pair of segment I/O lines and a source coupled to a ground potential GND, a transistor TDC2 having a gate connected to a second segment I/O line SGI/O2 of the pair of segment I/O lines and a source coupled to the ground potential GND, a transistor TRI1 provided between a drain of the transistor TDC1 and an I/O line I/O2 of the pair of I/O lines with a gate potential controlled by a signal R-CSL, a transistor TR12 provided between a drain of the transistor TDC2 and another I/O line I/O1 of the pair of I/O lines with a gate potential controlled by the signal R-CSL, a transistor TWC2 having a gate connected to the I/O line I/O1 of the pair of I/O lines and a source coupled to the ground potential GND, a transistor TWCI1 having a gate connected to the I/O line I/O2 of the pair of I/O lines I/O and a source coupled to the ground potential GND, a transistor TWI1 provided between a drain of the transistor TWC1 and the segment I/O line SGI/O1 with a gate potential controlled by a signal W-CSL, a transistor TWI2 provided between a drain of the transistor TWC2 and the segment I/O line SGI/O2 with a gate controlled by the signal W-CSL, a transistor TPC1 provided between the segment I/O line SGI/O1 and the ground potential GND with a gate potential controlled by an equalize signal IOEQ, and a transistor TPC2 provided between the segment I/O line SGI/O2 and the ground potential GND with a gate potential controlled by the equalize signal IOEQ.

Sense amplifiers, equalize circuits, gate transistors and the like similar to those for the pair of bit lines BLL0 and /BLL0 are provided also for the remaining pairs of bit lines BLL1 and /BLL1, BLR1 and /BLR1 to BLL3 and /BLL3 and BLR3 and /BLR3.

Figure 24:
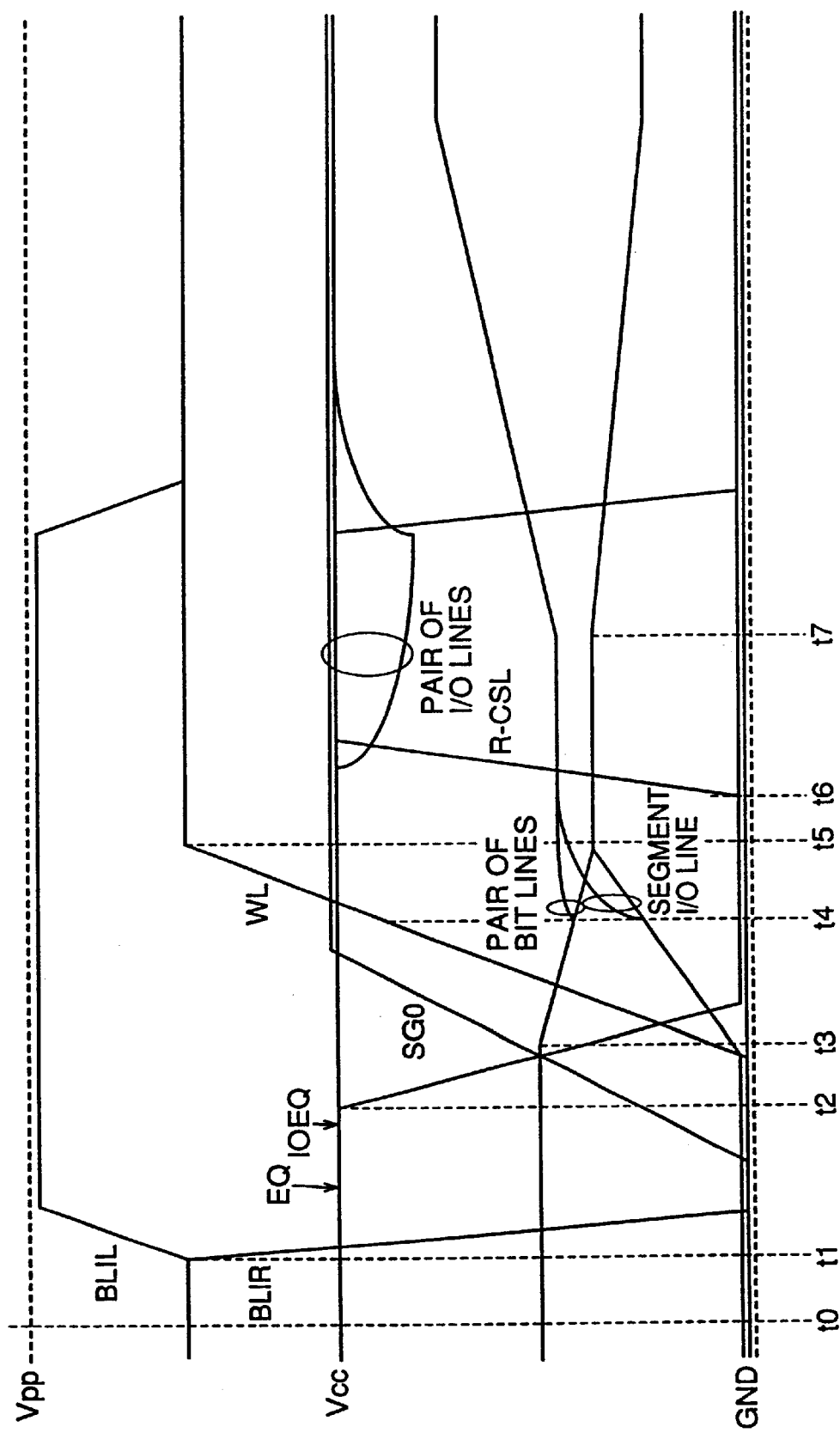
FIG. 24 is a timing chart for illustrating operations of a circuit connecting a sense amplifier part and a data line part shown in FIG. 23 in a read operation.

FIG. 24 is a timing chart for illustrating operations of a circuit connecting a sense amplifier part shown in FIG. 23 with a data line part.

Referring to FIG. 24, the pair of bit lines are precharged to the level of 1/2 Vcc in a standby state at a time t0. On the other hand, the pair of segment I/O lines SGI/O are precharged at the GND level in response to the signal IOEQ in an active state (high level). All segment decode lines SG0 to SG3 are at the ground potential GND, and transistors TRG1 and TRG2 for all pairs of bit lines are in cutoff states.

The signals BLIL and BLIR for switching connection between the sense amplifier S/A having the so-called shared sense amplifier structure and the pair of bit lines are held at an intermediate potential (between the power supply potential Vcc and a step-up potential Vpp).

A bit line equalize signal is in an active state (high level), and the pair of I/O lines are precharged to the power supply potential Vcc.

The signals BLIL and BLIR are held at the intermediate potential, in order to reduce potentials applied to the gates of the transistors TRL1, TRL2, TRR1 and TRR2 controlled by these signals. The intermediate potential is set in excess of the power supply potential Vcc, since it is necessary to equalize the potentials of the pair of bit lines.

At a time t1, the signal BLIL changes to the level of the step-up potential Vpp and the signal BLIR changes to the ground potential GND, for selecting BLL3 and /BLL3 from the left-side pair of bit lines BLL0 and /BLL0.

The equalize signals EQ and IOEQ start to change toward the ground potential GND at a time t2, and when the level of the segment decode line SG0 exceeds the threshold values of the transistors TRG1 and TRG2 at a time t3, the pair of bit lines BLL0 and /BLL0 are connected with the pair of segment I/O lines SGI/O1 and SGI/O2, and the potential level of the pair of bit lines fall below the precharge level 1/2 Vcc while that of the pair of segment I/O lines start to increase beyond a precharge level of the potential GND.

When the difference between the potential levels of the pair of bit lines and a word line WL exceeds the threshold of an access transistor TA at a time t4, difference is caused between the potential levels of the bit line BLL0 and the complementary bit line /BLL0 in response to data having been stored in a memory cell capacitor MC. Potential difference is also caused between the pair of segment lines SGI/O. At a time t5, the potential level of the word line rises to the intermediate potential. The potential levels of the pair of bit lines are smaller than 1/2 Vcc immediately before data reading from the memory cell capacitor, and hence the potential level of the word line may not be increased to the step-up potential Vpp. In other words, the word line may be at a lower potential level for reading data on the pair of bit lines as compared with the case of starting from the state where the potential levels of the pair of bit lines are 1/2 Vcc for reading data, whereby the read speed can be improved.

When the signal R-CSL changes to an active state at a time t6, it follows that the potential levels of the pair of I/O lines having been at the precharge level are driven and changed by the transistors TDC1 and TDC2 in response to the potential levels of the pair of segment I/O lines. Thus, data are read on the pair of I/O lines.

The signal R-CSL may be activated before the time tG. This is because the pair of segment I/O lines SGI/O and the pair of I/O lines are not directly connected with each other and hence data held in the memory cell is not broken by the potential levels of the pair of I/O lines.

The sense amplifier is activated at a time t7, for example, to amplify the potential difference between the pair of bit lines. Thus, a restore operation for the memory cell is performed. When reading data on the pair of I/O lines, however, it is not necessary to employ data amplified by the sense amplifier as described above, and hence the sense amplifier exerts no influence on the read speed even if its operating speed is slow. Therefore, the sense amplifier may have a size capable of guaranteeing restoration of the data, and hence the layout area for the sense amplifier can be reduced. If setting the amplitude of the amplification potential of the sense amplifier after the time t7 at a potential between the power supply potential Vcc and the ground potential GND without fully swinging the same to the power supply potential Vcc, charges held in the remaining non-selected memory cells connected to the pair of bit lines are not lost by noise caused on the pair of bit lines.

A data write operation and a precharge operation are now described.

Figure 25:
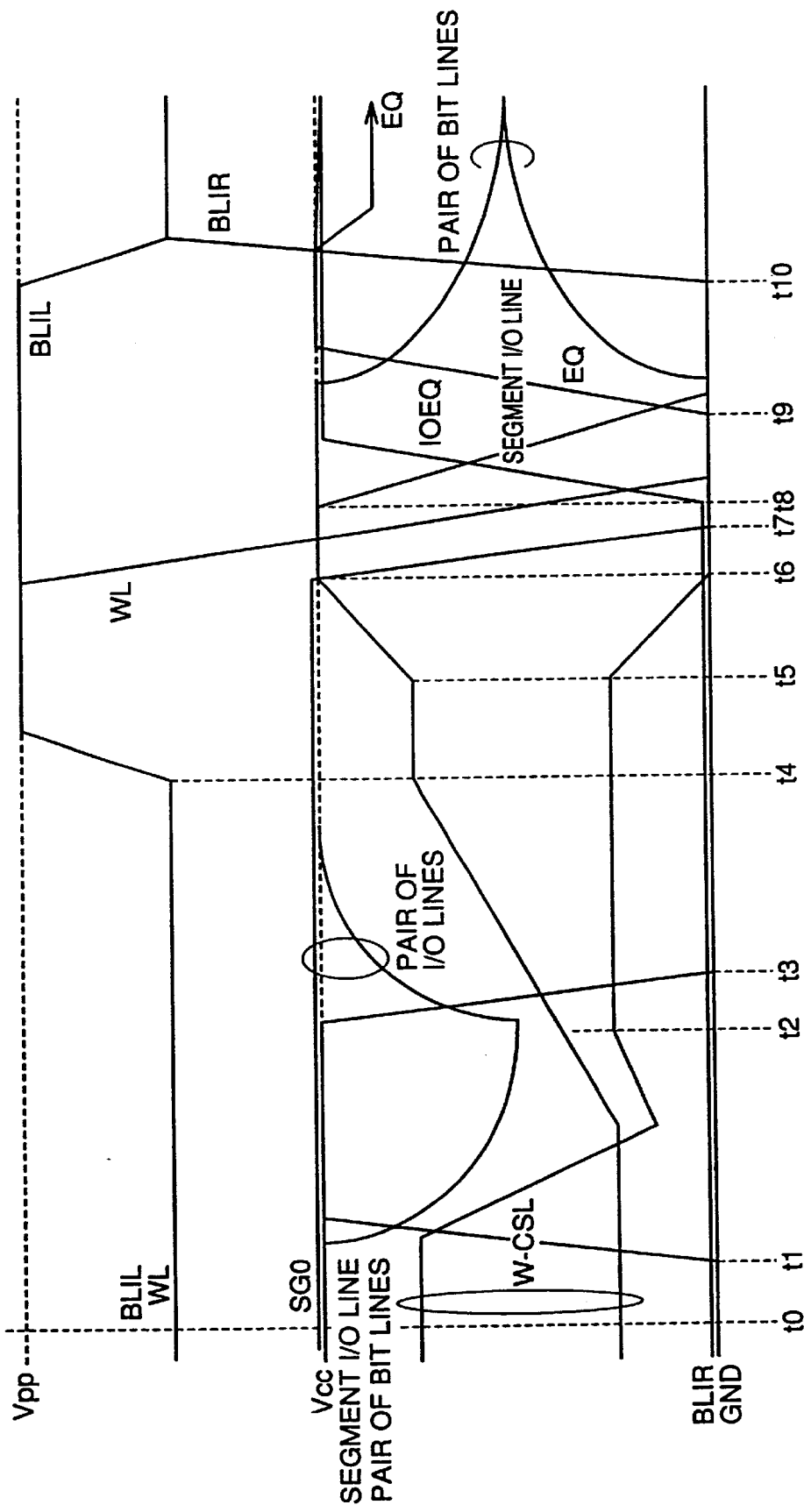
FIG. 25 is a ti ling chart for illustrating operations of the circuit connecting the sense amplifier part and the data line part shown in FIG. 23.

FIG. 25 is a timing chart for illustrating operations of the circuit connecting the sense amplifier part and the data line part shown in FIG. 23 in the write and precharge operations.

Referring to FIG. 25, the segment decode line SG0 is in an active state (high level) and the sense amplifier S/A is activated at a time t0, whereby potential difference is caused between the pair of bit lines and the pair of segment I/O lines SGI/O in response to stored data in the selected memory cell.

At a time t1, the signal W-CSL is activated to render the transistors TWI1 and TWI2 conductive so that write data transmitted by the pair of I/O lines is transmitted to the pair of segment I/O lines SGI/O. At this time, the potentials of the pair of I/O lines are transmitted not through direct connection of the pair of I/O lines to the pair of I/O lines SGI/O but by driving the potentials of the transistors TWC1 and TWC2 with the potentials of the pair of I/O lines.

Therefore, the potentials of the pair of I/O lines can be transmitted to the pair of segment I/O lines SGI/O without fully swinging the same at complementary levels. Thus, the time required for precharging the pair of I/O lines after transmitting the data to the pair of segment I/O lines SGI/O can be reduced, to enable a high-speed operation.

From a time t2, the sense amplifier starts to amplify the write data transmitted to the sense node of the sense amplifier.

At a time t3, the signal W-CSL is inactivated to cut off the data transmission from the pair of I/O lines to the pair of segment I/O lines. The pair of I/O lines are responsively precharged to the level of the power supply potential Vcc.

At a time t4, the potential level of the word line and the level of the signal BLIL are driven to the step-up potential Vpp. In response to this, the sense node of the sense amplifier and the selected memory cell are coupled with each other. At a time t5, further, the level of a signal SP driving a P-channel MOS transistor further rises while the level of a signal SN driving an N-channel MOS transistor further lowers among drive signals for the sense amplifier, whereby the potential levels of the pair of bit lines fully swing. Since the potential of the word line has risen to the step-up potential level, each of high- and low-level data is written in the memory cell with a sufficient margin.

At a time t6, the level of the segment decode line SG0 starts to make transition to an inactive state, to separate the pair of segment I/O lines and the pair of bit lines from each other. Thereafter the word line is also inactivated.

At a time t8, the signal IOEQ makes transition to an active state, and the pair of segment I/O lines SGI/O are precharged to the ground potential GND.

At a time t9, the equalize signal EQ makes transition to an active state, and the potential levels of the pair of bit lines are precharged to 1/2 Vcc, for example. At a time t10, the signals BLIL and BLIR are set at intermediate potentials.

In a standby state subsequent to the time t10, the equalize signal EQ may be set at a prescribed potential level below the power supply potential Vcc. Even if the bit line short-circuits with some wire in this case, a leakage current flowing through the bit line from a power source supplying the potential 1/2 Vcc for suppressing power consumption of the memory cell array due to low current suppliability of the transistor in the equalize circuit EQCKTO, for example.

[Modification of Embodiment 3]

Figure 26:
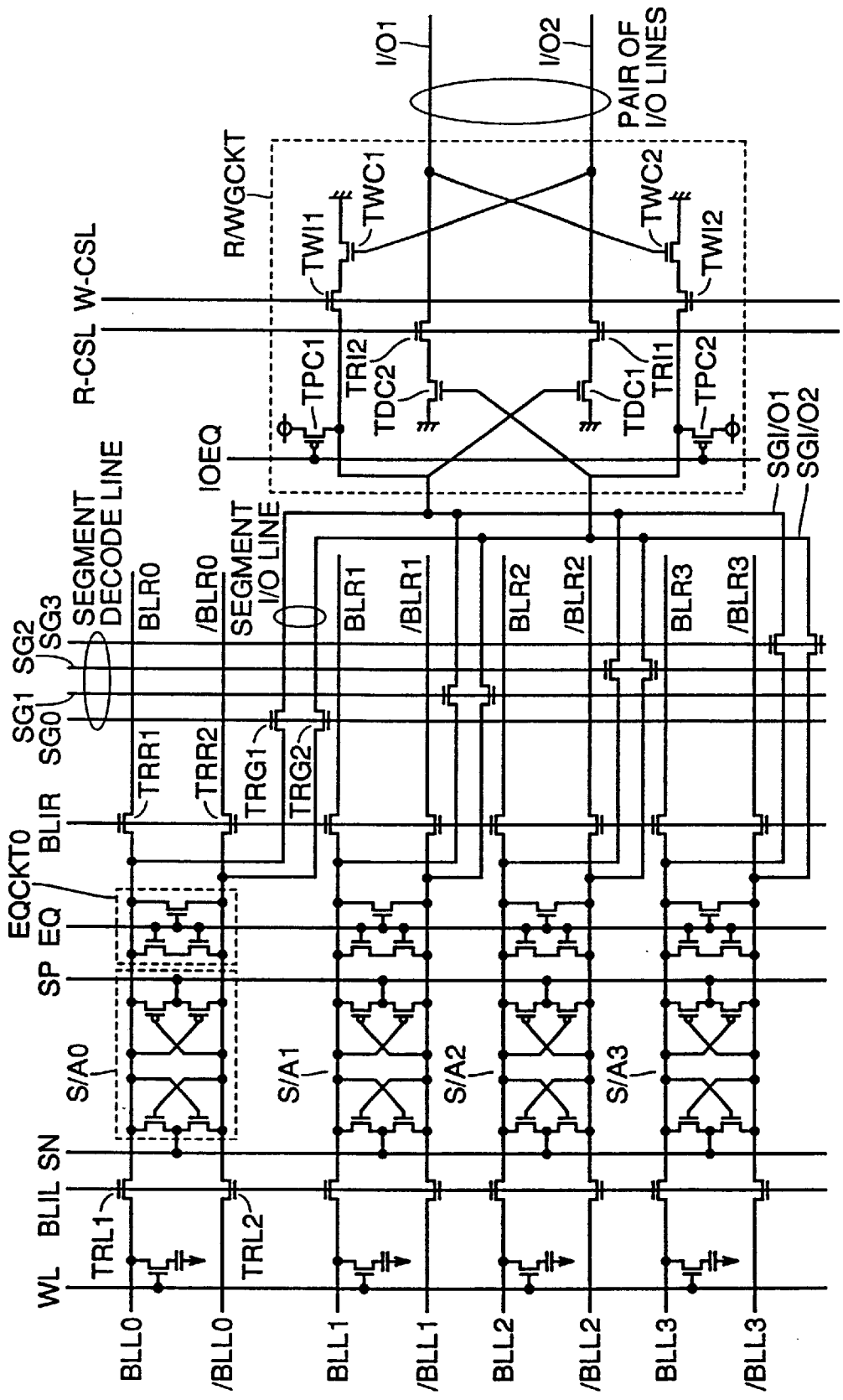
FIG. 26 is a circuit diagram showing a structure connecting a sense amplifier part and a data line part of a semiconductor memory device according to a modification of the embodiment 3.

FIG. 26 is a circuit diagram showing a structure connecting a sense amplifier part and a data line part of a semiconductor memory device according to a modification of the embodiment 3.

This structure is different from that shown in FIG. 23 in a point that both transistors TPC1' and TPC2' for precharging a pair of segment I/O lines are P-channel transistors and a precharge potential for the pair of segment I/O lines SGI/O is at the level of a power supply potential Vcc.

The remaining points are similar to those of the structure shown in FIG. 23, and hence identical parts are denoted by identical numerals and redundant description is omitted.

Figure 27:
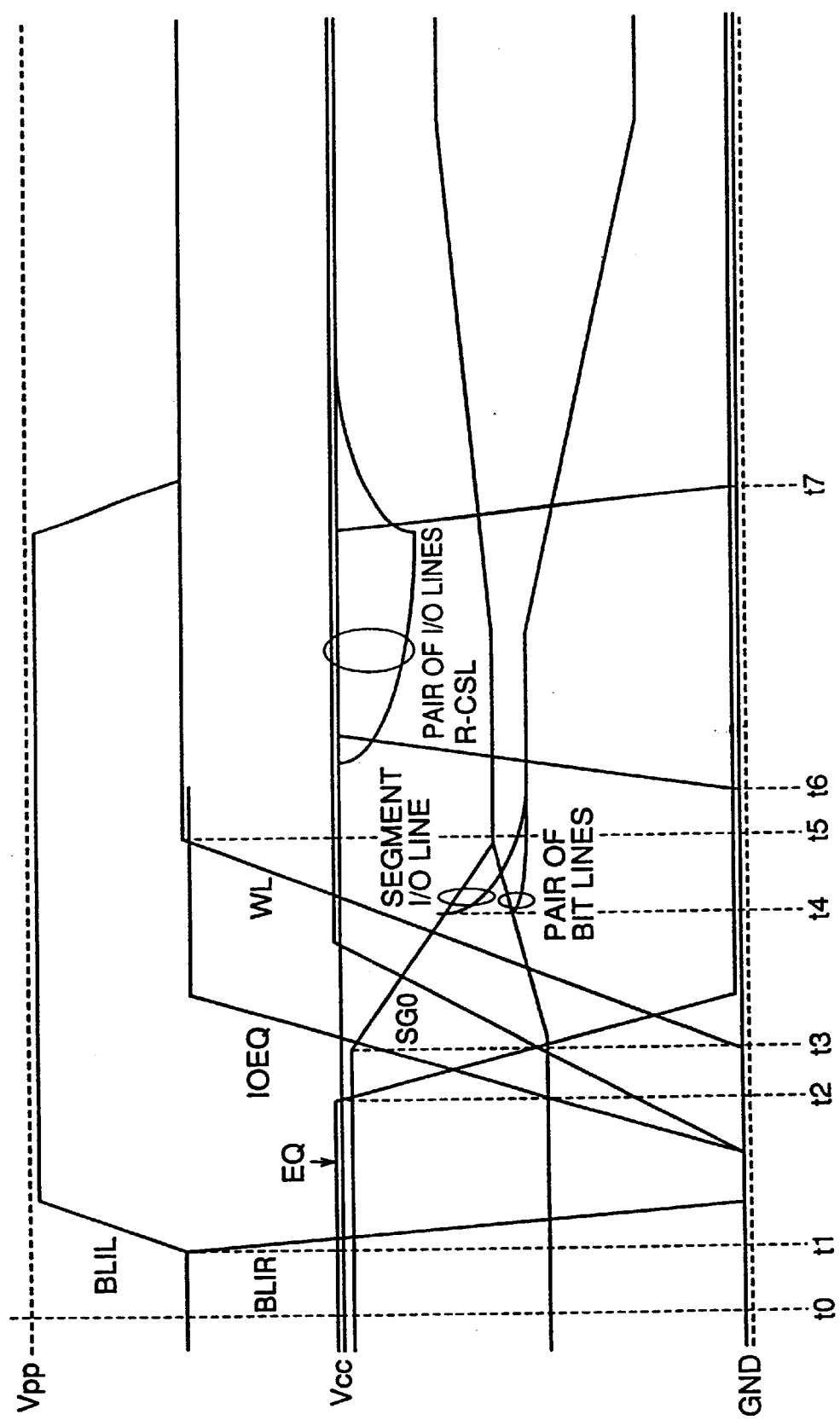
FIG. 27 is a timing chart for illustrating operations of a circuit connecting the sense amplifier part and the data line part shown in FIG. 26 in a read operation.

FIG. 27 is a timing chart for illustrating operations of the circuit connecting the-sense amplifier part and the data line part shown in FIG. 26 in a read operation.

The operations are different from those shown in FIG. 24 in a point that the pair of segment I/O lines SGI/O are precharged to the power supply potential Vcc at a time t0.

By activation of a segment decode signal SG0, therefore, the potential levels of a pair of bit lines and the pair of segment I/O lines are higher than a potential 1/2 Vcc for precharging the pair of bit lines. Thus, the time from starting of change of the potential level of a word line to data reading is not reduced dissimilarly to the case shown in FIG. 24, while the system shown in FIG. 27 has an advantage that a sense amplifier can be driven at a higher speed if a ground potential is supplied to the sense amplifier through a transistor and parasitic resistance on a source side of the sense amplifier cannot be neglected, for example.

Figure 28:
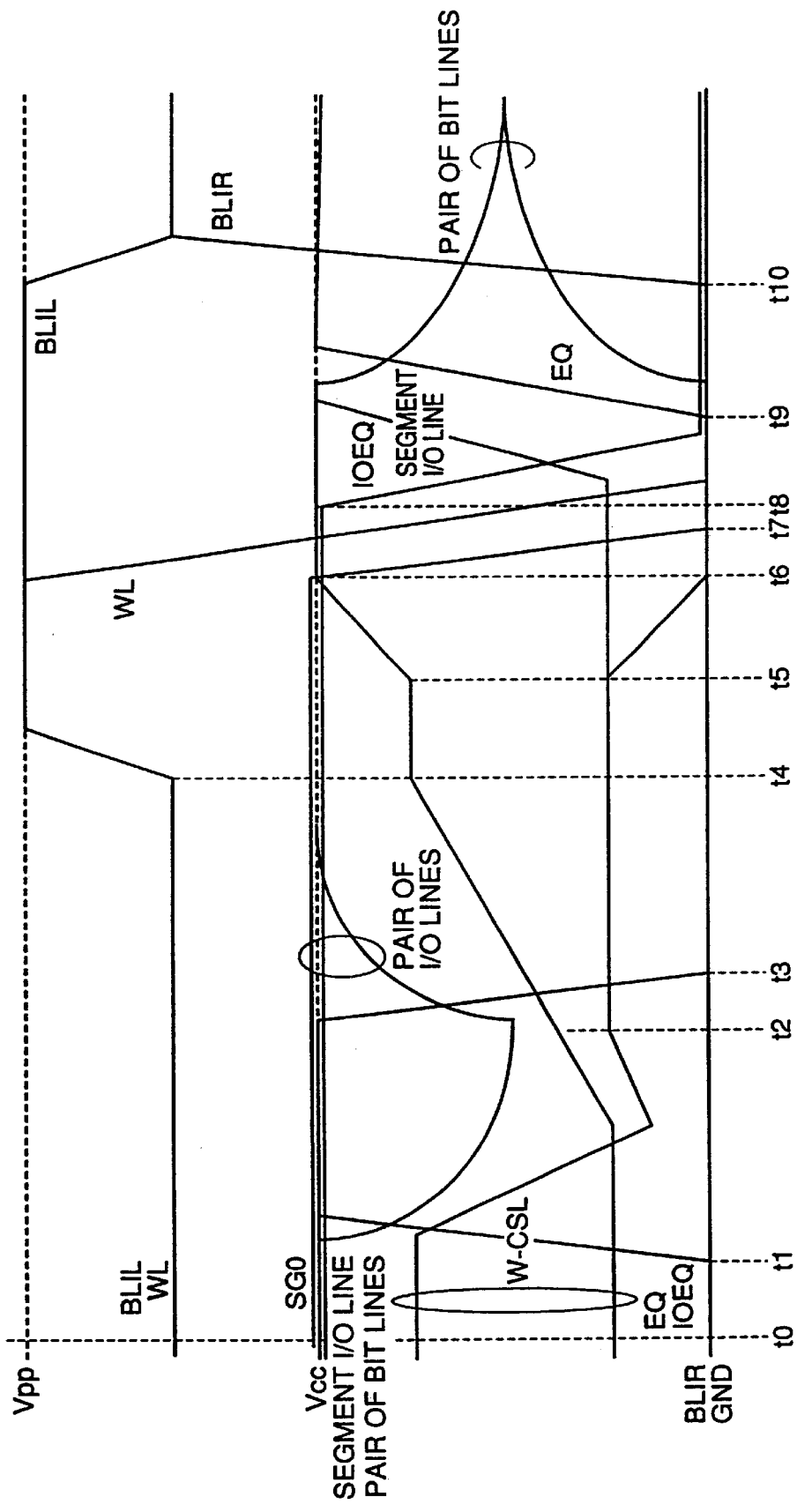
FIG. 28 is a timing chart for illustrating operations of the circuit connecting the sense amplifier part and the data line part in a write operation/precharge operation.

FIG. 28 is a timing chart for illustrating operations of the circuit connecting the sense amplifier part and the data line part shown in FIG. 26 in a write operation and a precharge operation.

The operations are basically similar to those shown in FIG. 25 except that the precharge level for the pair of segment I/O lines SGI/O is at the power supply potential Vcc.

[Embodiment 4]

Figure 29:
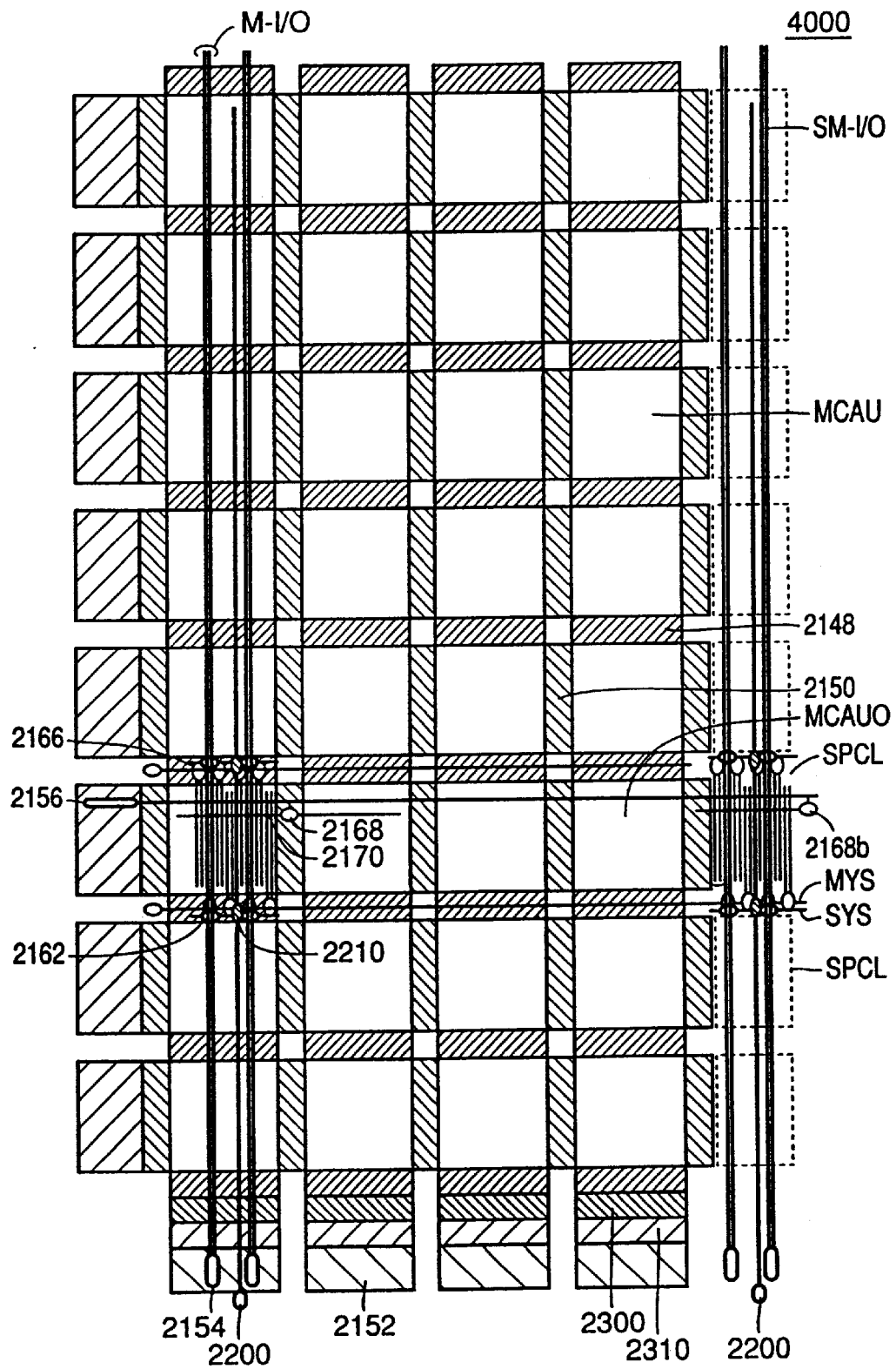
FIG. 29 is a schematic block diagram showing the structure of a memory array 4000 according to an embodiment 4 of the present invention.

FIG. 29 is a schematic block diagram showing the structure of a memory array 4000 according to an embodiment 4 of the present invention in contrast to FIG. 14 for the embodiment 1.

A semiconductor memory device according to the embodiment 4 is basically similar in structure to the semiconductor memory device 1000 according to the embodiment 1, except the memory cell array part.

Referring to FIG. 29, the memory cell array 4000 is different in structure from the memory cell array 1100 shown in FIG. 14 in the following points:

First, segment YS lines performing selection in a column direction, i.e., controlling a gate circuit 2162 selectively switching connection between a sense amplifier amplifying the potential levels of a pair of bit lines connected with a selected memory cell and a pair of main I/O lines have a hierarchical structure.

A sub YS decoder 2210 controlled in response to the level of a main segment YS line MYS arranged along a row direction and a signal from a YS segment decoder activates a sub YS line SYS for controlling the gate circuit 2162 in response.

In the memory cell array 4000, further, a redundancy structure in the row direction is totally arranged on a row redundancy part 2300 arranged on an end of the memory cell array as described later.

In addition, a redundancy structure in the column direction is provided in a spare column area SPCL independent of subdivided memory cell array units MCAU.

While FIG. 29 shows only the structure of a redundancy column arranged immediately on the right of a single memory array unit MCA0, similar structures are arranged along a pair of sub I/O lines SM-I/O in practice.

Further, memory cell array units MCAU may be further symmetrically arranged through the redundancy column area SPCL, for example, as described later.

Also in the redundancy column area, a sub word line SWL is activated in response to a sub word driver 2168b activated in response to activation of a main word line MWL and a bank selection line, similarly to the normal memory cell array unit area MCAU.

In addition, a gate circuit 2210b selectively controlling connection between a selected memory cell column of the redundancy column area and a pair of sub I/O lines is also controlled by the hierarchical segment YS lines, similarly to the normal memory cell array unit area.

Figure 30:
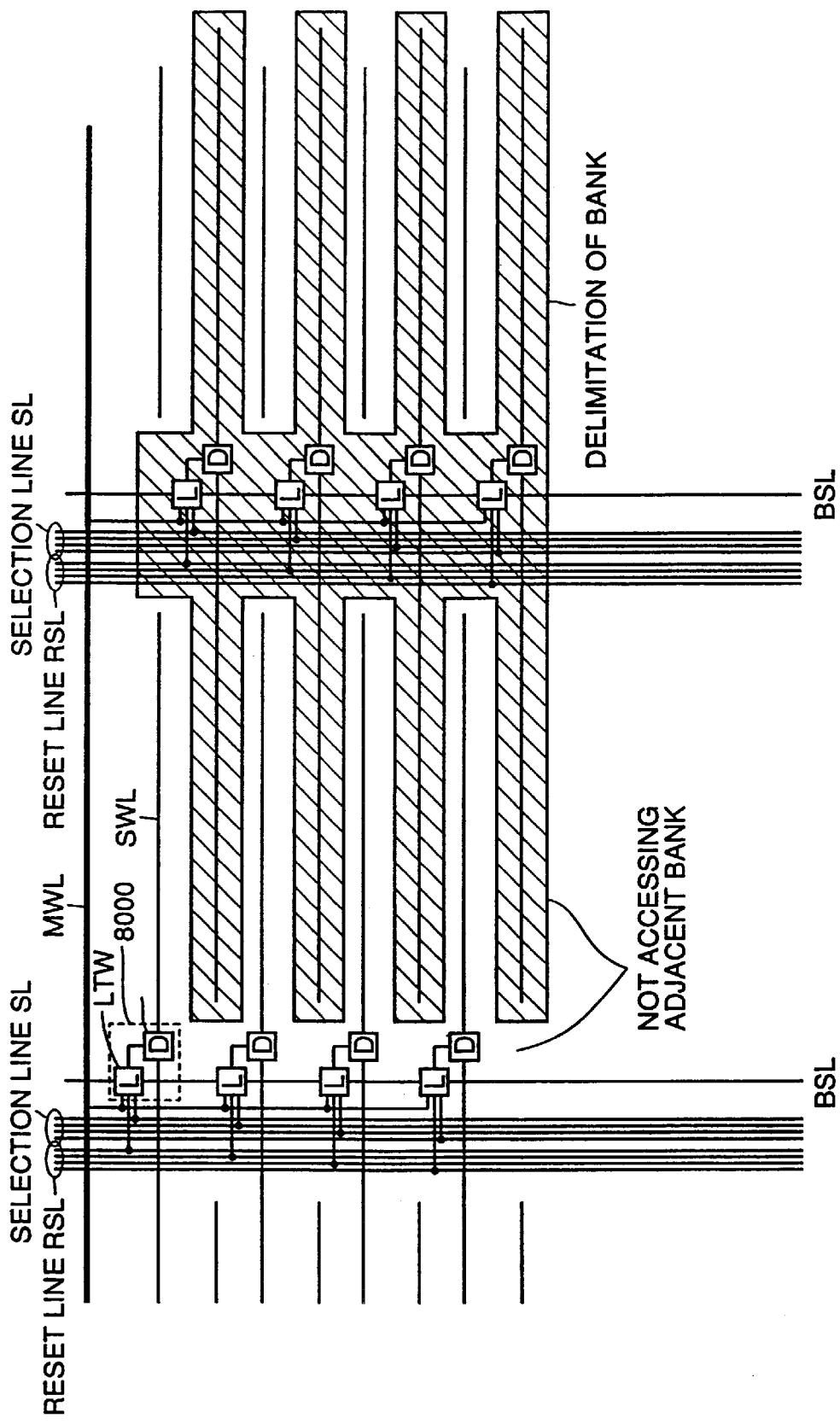
FIG. 30 is an enlarged view for illustrating the structure of a sub word driver part 8000 of the memory cell array 4000 shown in FIG. 29.

FIG. 30 is an enlarged view for illustrating the structure of a sub word driver part 8000 of the memory cell array 4000 shown in FIG. 29.

A single main word line MWL controls four sub word lines in each bank. Any of the four sub word lines SWL is selected by selectively activating any of selection lines SL.

It is assumed that the structure of the sub word driver part 8000 shown in FIG. 30 is basically similar to that shown in FIG. 15.

A latch circuit LTW is formed by the transistors 8100 and 8102 in the structure shown in FIG. 15, and a driver circuit WDC is formed by the transistors 8104 and 8106 in the structure of FIG. 15.

A bank selection line BSL is at the level of a step-up potential Vpp (a potential level stepped up beyond an internal power supply potential Vcc) in activation, and held at the level of a ground potential Vss after activation of the sub word line SWL. In response to this, the latch circuit LTW latches a potential level corresponding to the active state of the sub word line SWL. The potential levels of the selection line SL and a reset line RSL change complementarily to each other.

During a standby operation, the potential levels of the bank selection line BSL and the selection line SL are held at the ground potential Vss, while that of the reset line is held at power supply potential Vcc. During the standby operation, a collector couples the sub word line SWL with the ground potential level Vss.

In activation, the potential of the corresponding reset line RSL first reaches the level of the ground potential Vss, and the bank selection line BSL corresponding to the sub word line SWL to be activated is activated to reach the level of the potential Vpp. Substantially at the same time when the main word line MWL is selectively activated to reach the potential level Vcc, the selection line SL is also selectively set at the potential Vcc. In response to this, the potential level of the selected sub word line SWL reaches a level Vcc−Vth, where Vth represents the threshold voltage of the transistor 8102. Thereafter the bank selection line BSL is set at the ground potential Vss, charges are trapped in the latch circuit, and an active potential level is held.

When further raising the potential level of the selection line SL to the step-up potential Vpp in the state holding the charges, the potential of the sub word line SWL also rises to the step-up potential Vpp.

Thus, the potential level of the selected sub word line SWL is stepped up to the step-up potential.

In a reset operation, on the other hand, the potential of the bank selection line is raised to the power supply potential Vcc, while the selection line SL is set at the ground potential Vss. The reset line is set at the potential Vcc, to discharge the charges of the sub word line to the ground.

In relation to the structure shown in FIG. 30, it is assumed that banks are delimited along alternately arranged sub word lines, as shown by slant parts in FIG. 30.

Thus, it is possible to activate the sub word line only in a selected bank.

Figure 31:
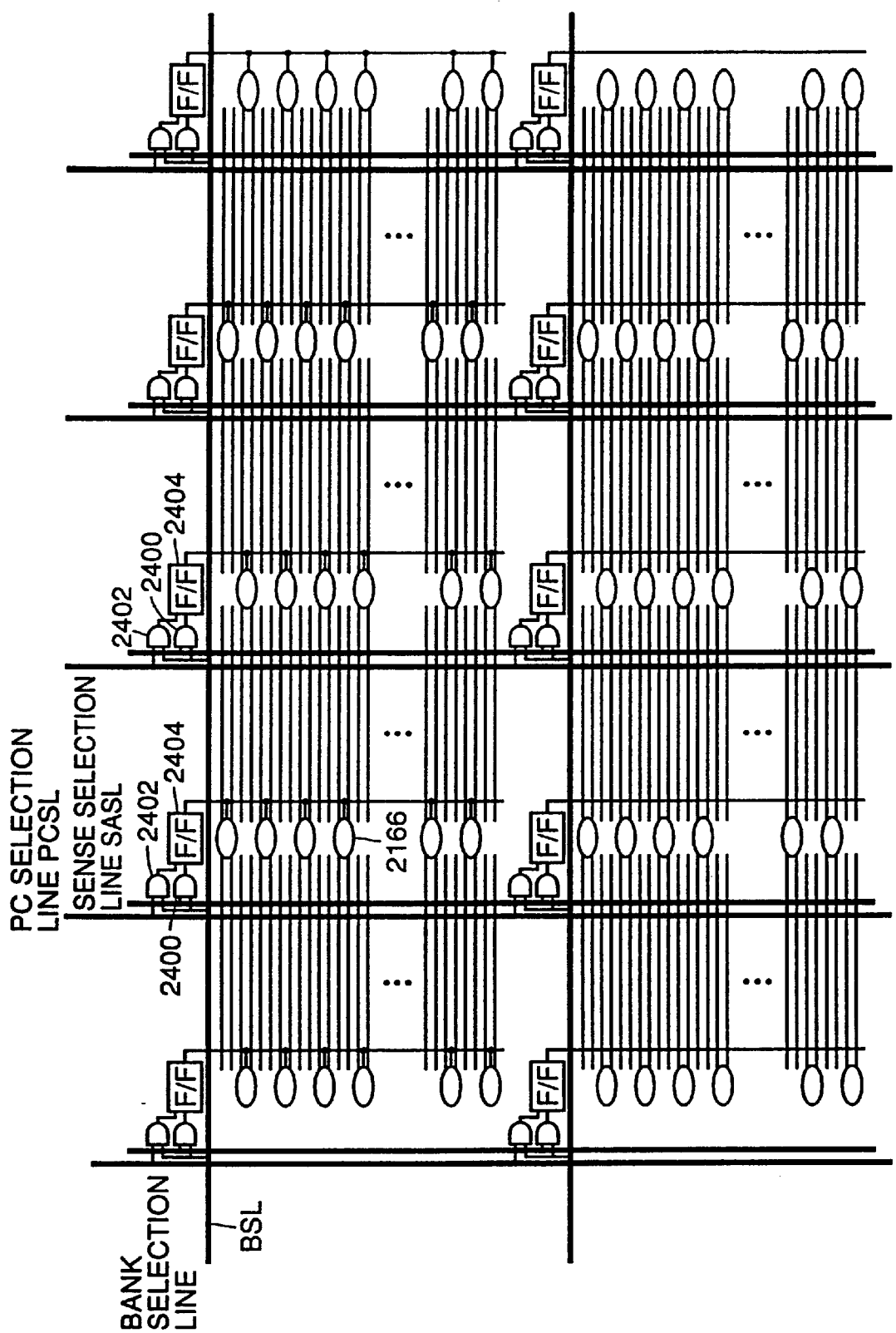
FIG. 31 illustrates a structure selectively activating a sense amplifier in the structure shown in FIG. 29.

FIG. 31 illustrates a structure selectively activating the sense amplifier in the structure shown in FIG. 29.

Referring to FIG. 31, a sense amplifier selection line SASL and a precharge selection line PCSL are arranged along the row direction. On the other hand, the bank selection line BSL is arranged along the column direction.

An output level of-a flip-flop 2404 is set in response to an AND circuit receiving the potential levels of the sense amplifier selection line SASL and the bank selection line BSL, and reset in response to an output level of an AND circuit 2402 receiving the levels of the precharge selection line PCSL and the bank selection line BSL as inputs. A sense amplifier 2166 is activated in response to the output level of the flip-flop circuit 2404.

Thus, it follows that the bank selection line and the sense amplifier selection line activate only the sense amplifier in the selected bank, and the precharge selection line PCSL and the bank selection line BSL precharge only the sense amplifier in the selected bank.

By employing the aforementioned structure, only a sense amplifier in an activated bank can be activated among sense amplifiers arranged on a sense amplifier zone, for reducing power consumption.

Figure 32:
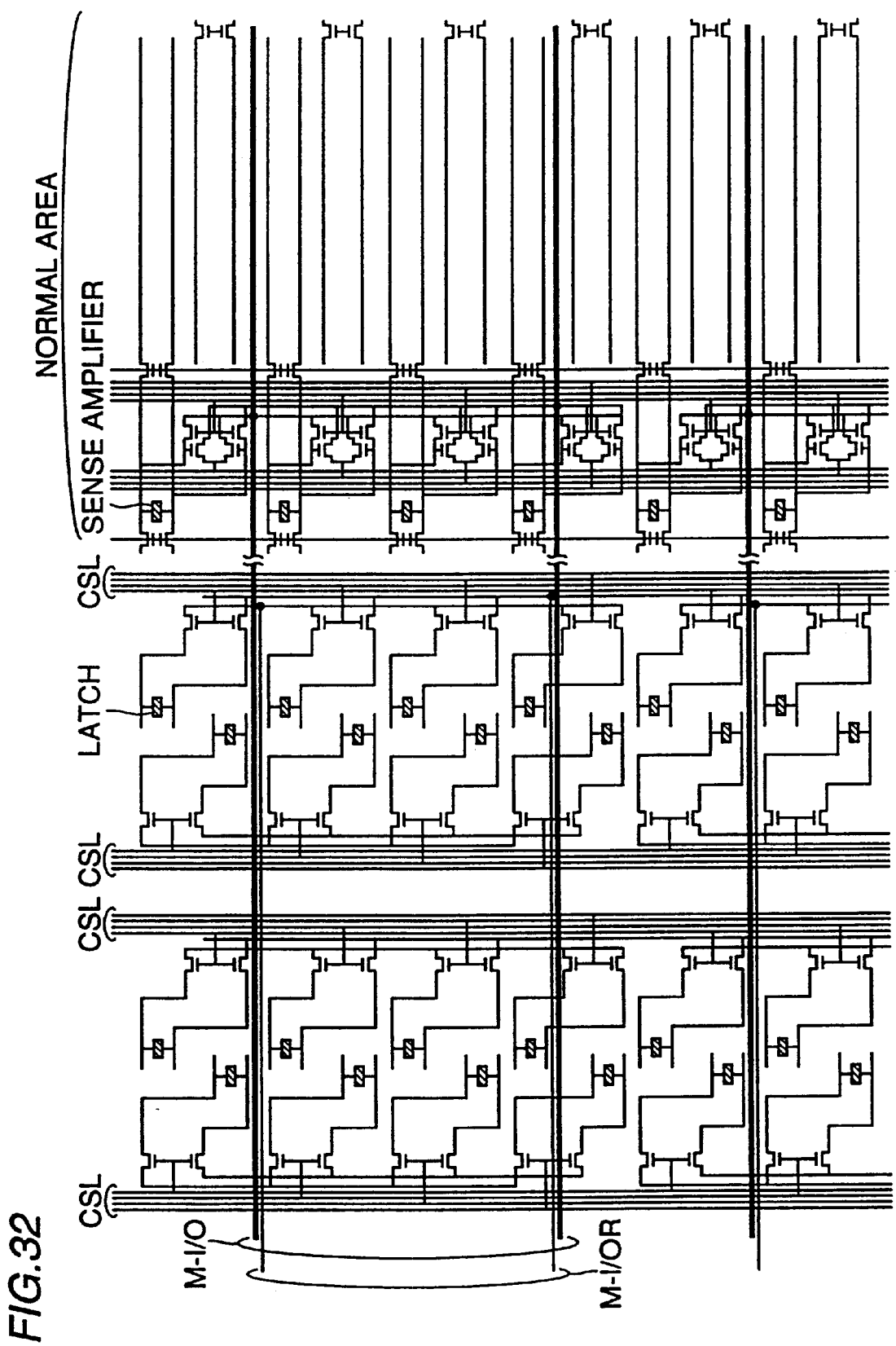
FIG. 32 is a schematic block diagram showing the structure of a row redundancy part 2300 in the memory cell array shown in FIG. 29.

FIG. 32 is a schematic block diagram showing the structure of the row redundancy part 2300 in the memory cell array shown in FIG. 29.

In the structure shown in FIG. 32, a latch circuit is provided on an end portion of each memory cell array unit as a redundancy element. A redundancy compare/determination part compares a bank address and a row address, to access the latch circuit when the addresses match. In this case, an access operation to a memory cell in a normal area may be performed in parallel with the redundancy determination, similarly to the above. The access time can be reduced as compared with the case of waiting for the result of redundancy determination and then starting access to the memory cell of the normal area.

In the structure shown in FIG. 32, the latch circuit holds data and hence it is not necessary to activate the word line in accessing.

When a programmed address matches with an input address in each of read and write operations, a corresponding column selection signal CSL is activated so that data can be read or written.

When forming the redundancy circuit by the latch circuit such as a line amplifier, the word line may not be activated dissimilarly to a structure of a memory cell in a DRAM. Therefore, the access operation may be executed on the normal memory cell area in row access regardless of normality/faultiness of the accessed portion. In other words, no redundancy determination is necessary in row access, whereby the row access time can be reduced.

In column access, whether to access a normal bank (or memory cell mat) or the redundancy part formed by the latch circuit is sufficiently determined by determining only a bank address of a faulty address or a mat address, and hence the access time is not increased.

A pair of redundancy main I/O lines M-I/OR are provided for transmitting/receiving data to/from a redundancy row independently of a pair of main I/O lines M-I/O for transmitting/receiving data to/from a normal area consisting of a normal memory row.

Figure 33:
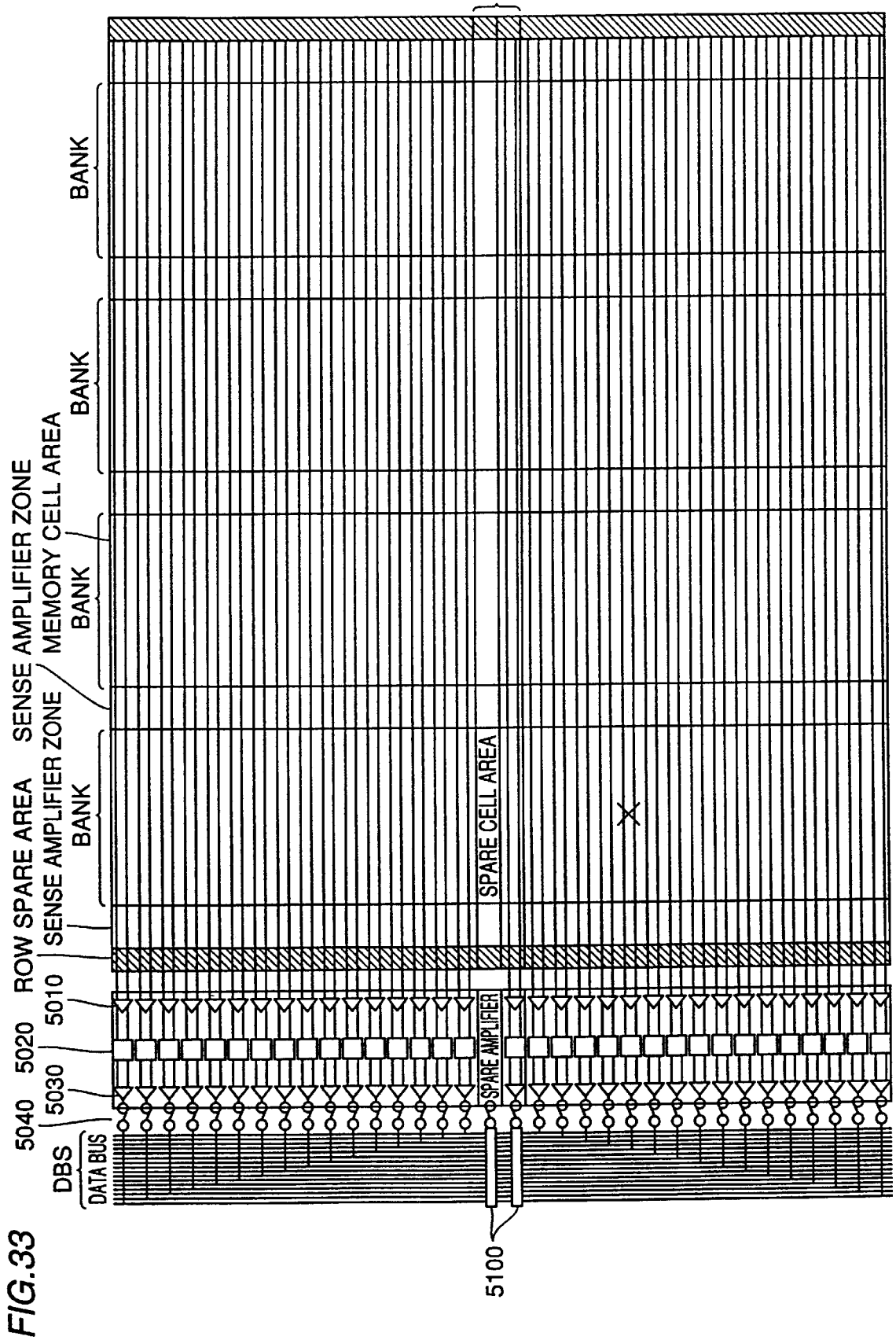
FIG. 33 is a schematic block diagram for illustrating arrangement of a row redundancy area and a redundancy area in a column direction in the structure of the memory cell array 4000.

FIG. 33 is a schematic block diagram for illustrating arrangement of a row redundancy area (row spare area) and a redundancy area (spare cell area) in the column direction in the structure of the memory cell array 4000 shown in FIG. 29.

Referring to FIG. 33, the row spare area for replacing the memory cell row is provided on the outermost periphery of the memory cell array.

On the other hand, the spare cell in the column direction is provided on the boundary portion between the banks of the memory cell array. Data read on the pair of I/O lines respectively are amplified by an amplifier 5010 and held in a latch circuit 5020. A driver circuit 5030 provided in correspondence to the latch circuit 5020 transmits the data of the latch circuit 5020 to any of data buses DBS selected by a shift switching circuit 5040.

Figure 34:
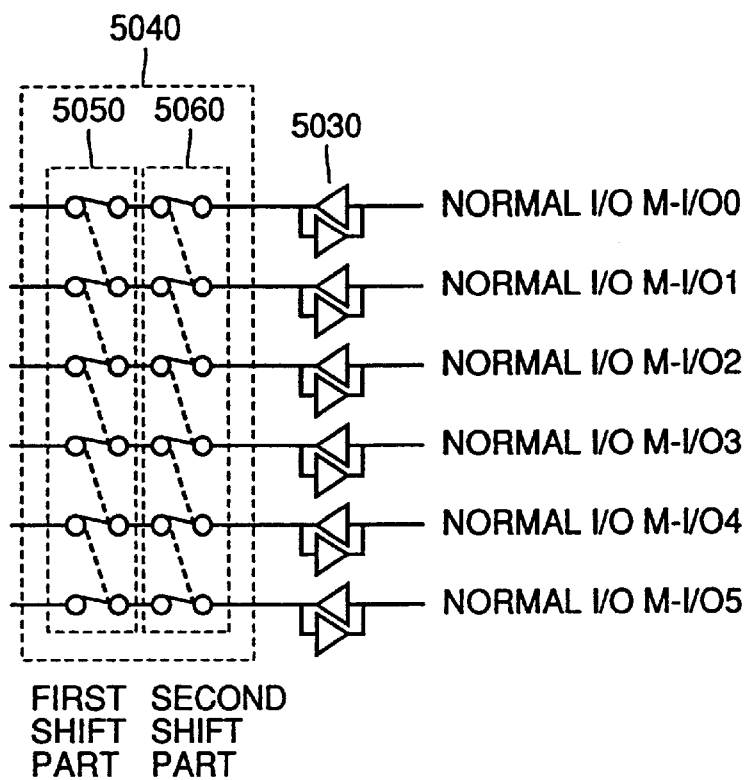
FIG. 34 is a conceptual diagram for illustrating the structure of a shift switching circuit 5040 in the structure shown in FIG. 33.

FIG. 34 is a conceptual diagram for illustrating the structure of the shift switching circuit 5040 in the structure shown in FIG. 33.

As shown in FIG. 34, the shift switching circuit 5040 is formed by two stages of shift parts, for example. A first shift part 5050 and a second shift part 5060 are controlled independently of each other, to switch the connection state between the pair of main I/O lines and the data buses DBS.

In the state shown in FIG. 34, no faulty memory cell is present in the part corresponding to normal pairs of main I/O lines, which are connected to the data buses DBS as such.

Figure 35:
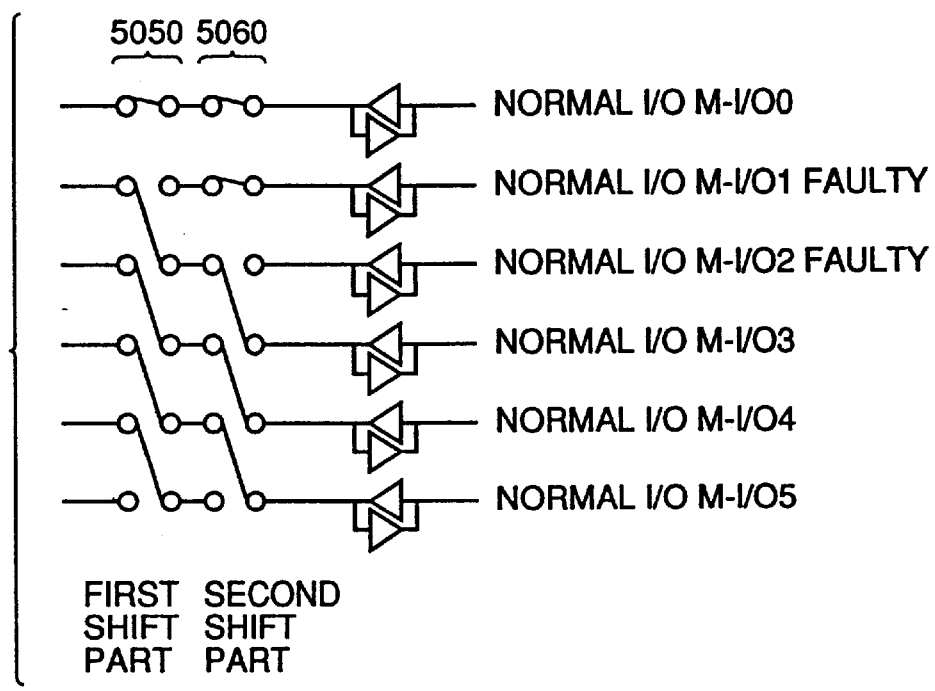
FIG. 35 is a conceptual diagram showing a state of the shift circuit 5040 performing a shift operation when a faulty memory cell is present.

FIG. 35 is a conceptual diagram showing a state where the shift circuit 5040 performs a shift operation due to presence of faulty memory cells.

In the example shown in FIG. 35, it is assumed that memory cells corresponding to pairs of main I/O lines M-I/O1 and M-I/O2 are faulty.

In this case, the first and second shift parts 5050 and 5060 perform shift operations respectively, so that the two pairs of main I/O lines M-I/O1 and M-I/O2 are not connected to the data buses DBS. Substitutionally, a pair of main I/O lines M-I/O3 are connected to the data bus which has been originally connected with the pair of main I/O lines M-I/O1. Further, a pair of main I/O lines M-I/O4 are connected to the data bus which has been originally connected with the pair of main I/O lines M-I/O2.

The remaining adjacent pairs of main I/O lines are thereafter sequentially shifted by the shift parts and connected to the corresponding data buses.

When employing the aforementioned structure, pairs of main I/O lines having faulty memory cells are not connected to the data buses but redundancy replacement can be performed.

Alternatively, a multiplexer 5100 can select the data buses connected with data read from a pair of spare I/O lines in the spare cell area.

[Another Exemplary Connection of First and Second Shift Parts]

Another structure and operation for replacement with a redundancy column by the shift switching circuit 5040 are now described in more detail with reference to FIG. 36.

Figure 36:
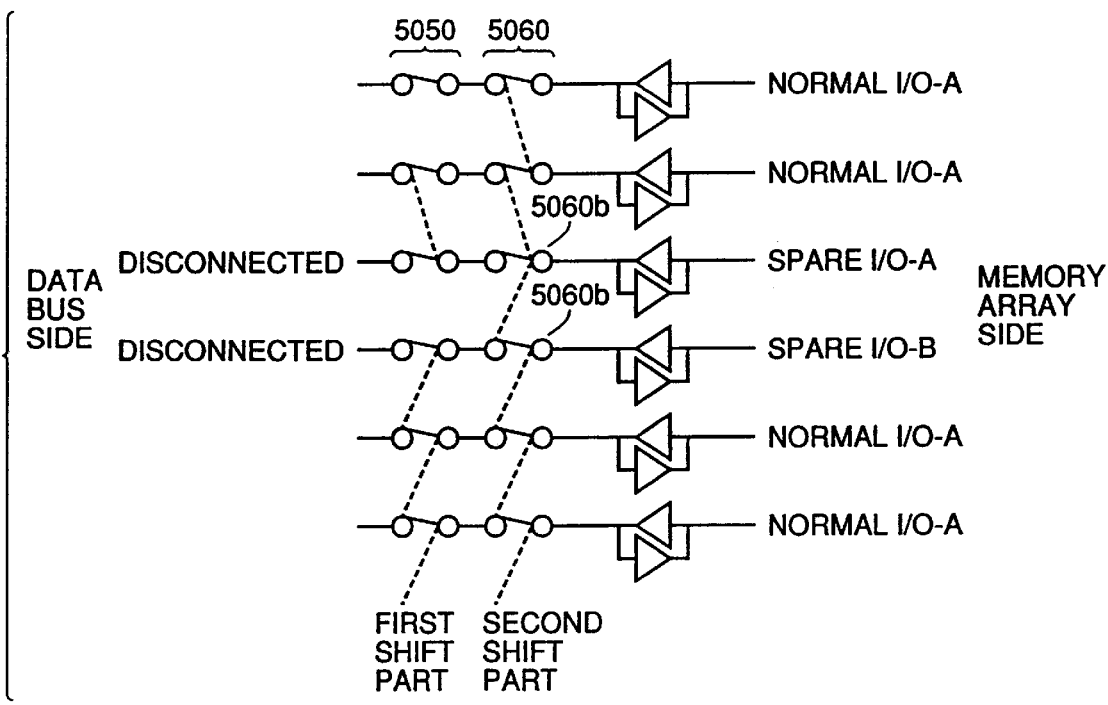
FIG. 36 illustrates another structure and operation for replacement with a redundancy column by the shift switching circuit 5040 in more detail.

FIG. 36 is a schematic block diagram showing the structure of a shift switching circuit 5040 performing shift redundancy.

FIG. 36 shows a structure having two spare I/Os on its central part. This figure shows the structure of shift parts provided between a data bus side and a read/write amplifier side along the aforementioned spare I/O part.

The central two spare I/Os can repair not only memory cell columns corresponding to upper I/Os but also those corresponding to lower I/Os in FIG. 36. When performing the shift operations by two stages, further, both of two faults in the upper I/O lines and two faults in the lower side can be repaired.

In this regard, a second shift part 5060 for unidirectional singlestage shifting is arranged following a first shift part 5050 for performing unidirectional single-stage shifting. On the other hand, a second shift part 5060b for a spare I/O-A and a spare I/O-B performs bidirectional shifting, as described later.

The first shift part 5050 shifts the upper I/O lines by one stage upward, and shifts the lower I/O lines by one stage upward.

The second shift part 5060 basically performs operations similar to those of the first shift part, while the second shift part 5060b for the two spare I/Os shifts the same upward as well as downward.

FIG. 36 shows a connection state before general repair. Before repair or if no repair is required, the initial connection state is maintained. The normal I/O lines are connected to corresponding left-side connection nodes while the spare I/O lines are connected to no data buses.

Figure 37:
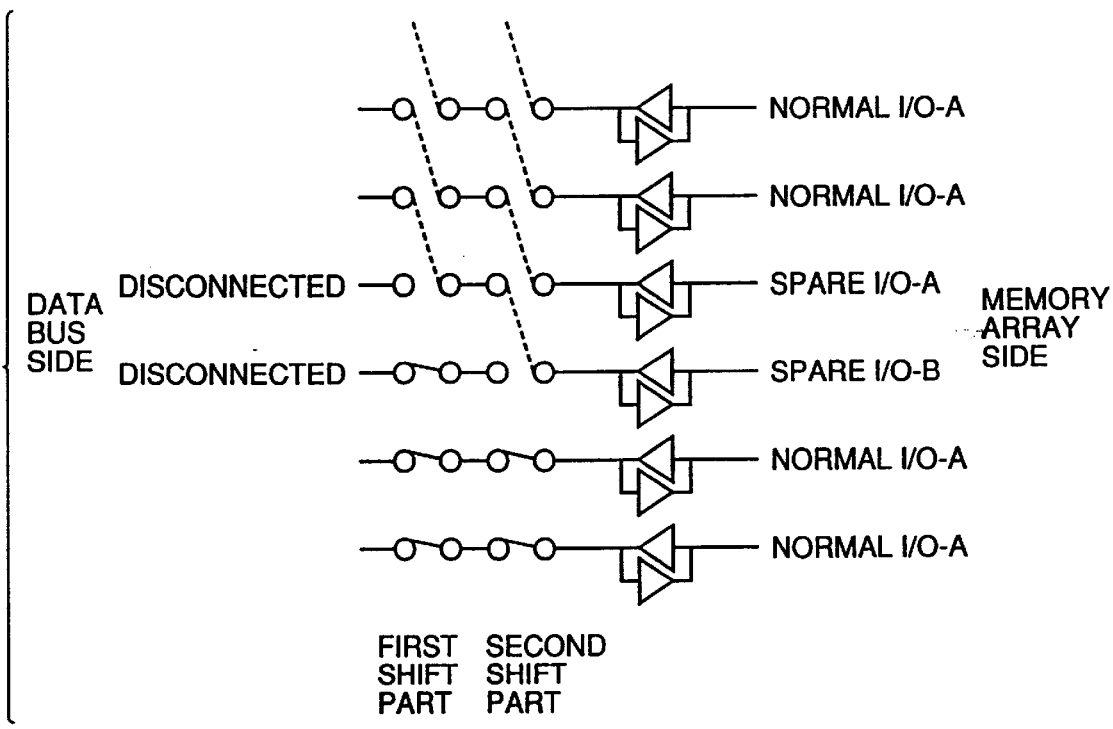
FIG. 37 is a conceptual diagram showing a structure in a case where two spare I/O lines must be shifted upward for repair.

When both spare I/Os must be shifted upward for repair as shown in FIG. 37, the second shift parts 5060 and 5060b shift the spare I/O-A and the spare I/O-B upward. Similarly, the first shift part 5050 also performs shifting upward, to implement redundancy replacement.

Figure 38:
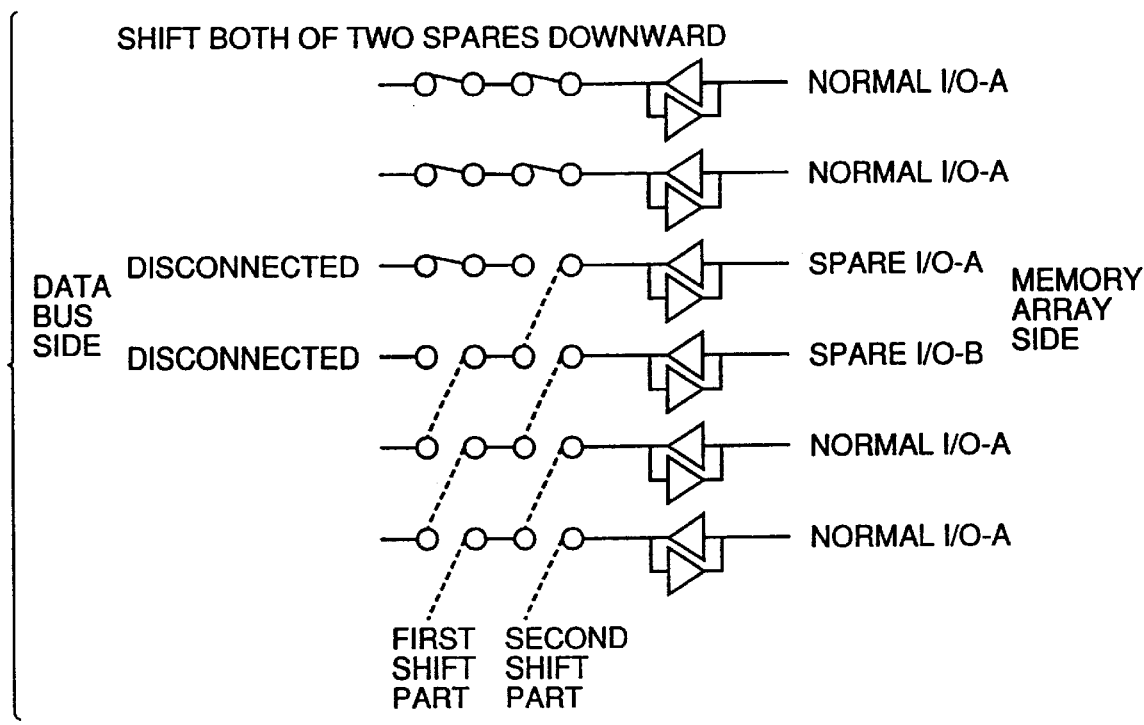
FIG. 38 is a conceptual diagram showing a structure in a case where two spare I/O lines must be shifted downward for repair.

When both spare I/Os must be shifted downward for repair as shown in FIG. 38, on the other hand, the second shift parts 5060 and 5060b shift the spare I/O-A and the spare I/O-B downward. Similarly, the first shift part 5050 also performs shifting downward, to implement redundancy replacement.

Figure 39:
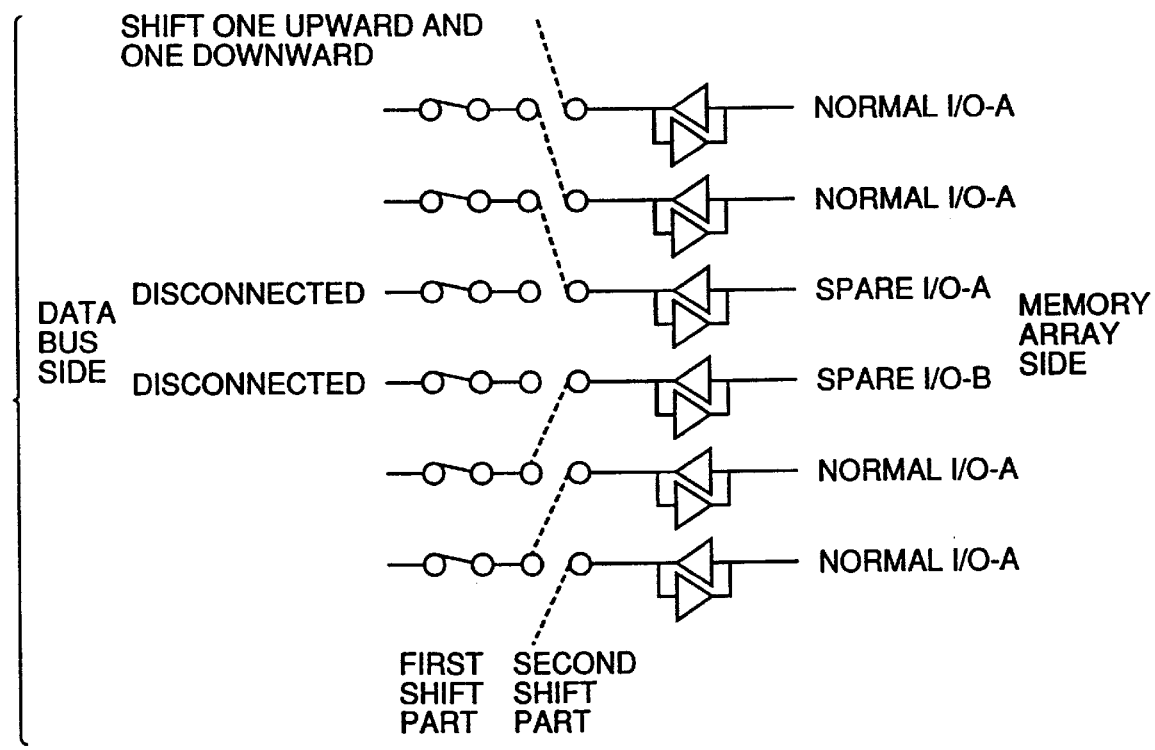
FIG. 39 is a conceptual diagram showing a structure in a case where two spare I/O lines must be shifted upward and downward respectively for repair.

When the spare I/O lines must be shifted upward and downward respectively for repair as shown in FIG. 39, the first shift part performs no shift operation but the second shift parts 5060 and 5060b perform shift operations upward and downward respectively.

[Structure of Shift Operation by Fuse Element]

Figure 40:
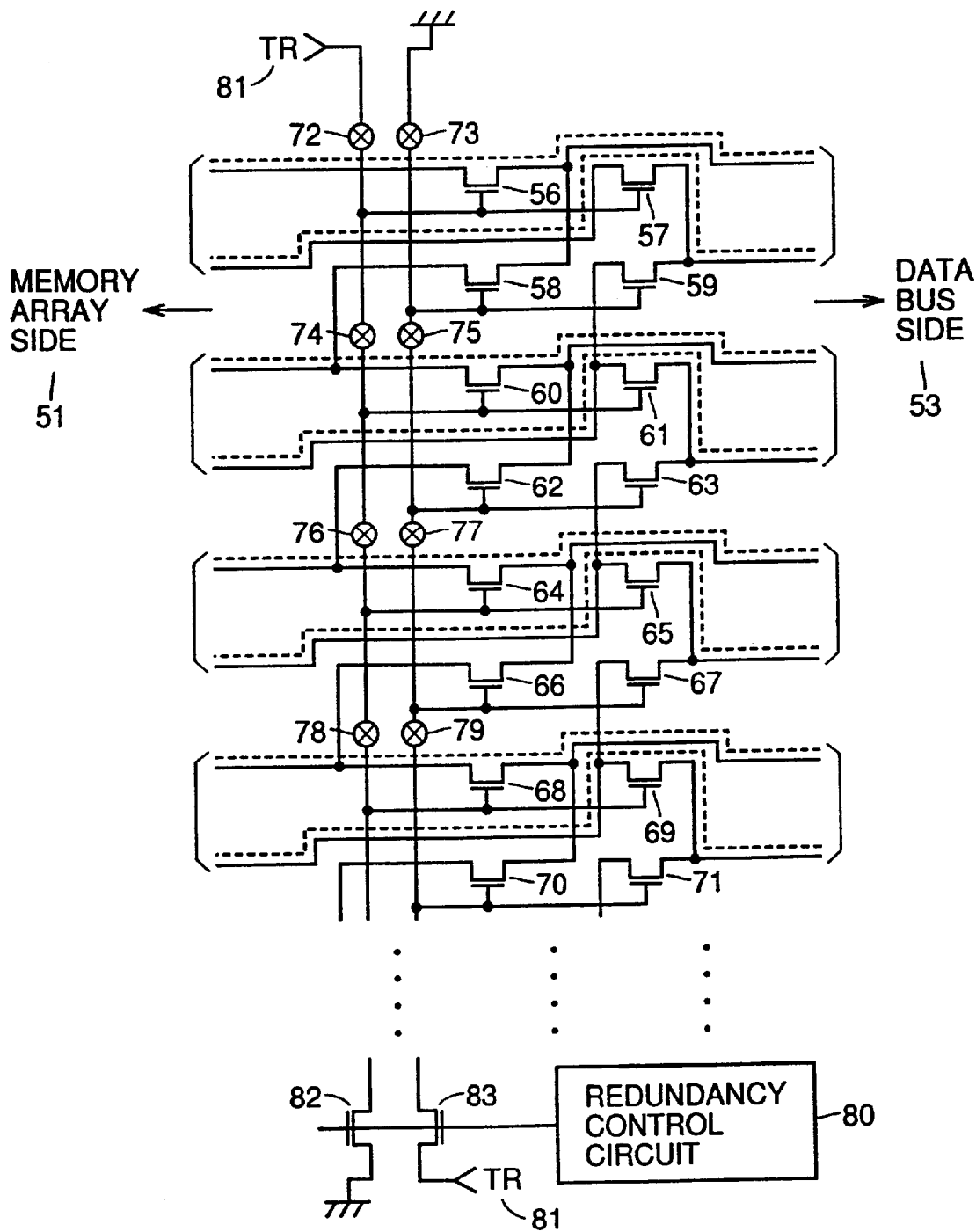
FIG. 40 is a schematic block diagram showing a structure of the shift switching circuit 5040 employing fuse elements in more detail.

FIG. 40 is a schematic block diagram showing a structure of the shift switching circuit 5040 employing fuse elements in more detail.

For simplifying the illustration, the structure of a portion of a first shift part including a lower spare I/O is noted with connection transistors formed by N-channel MOS transistors for performing fixed connection change by laser-blowing fuse links arranged in parallel with each other.

Before repair or if no repair is required, initial connection (right complementary I/O and left complementary I/O are connected in one-to-one correspondence) is maintained. When redundancy connection is determined, a signal TR goes high to feed a current through transistors controlled by a redundancy control circuit.

In a non-blown connection state of fuse elements (referred to as fuse links), a series of fuses 73 to 93 are set at a ground potential GND while a series of fuses 72 to 78 are set at a high level among the fuse links, to maintain the aforementioned connection state shown by dotted lines.

In the uppermost I/O shown in FIG. 40, transistors 56 and 57 are turned on and connected to a left connection node. Transistors 58 and 59 are in OFF states and cut off from connection to the lower stage.

Figure 41:
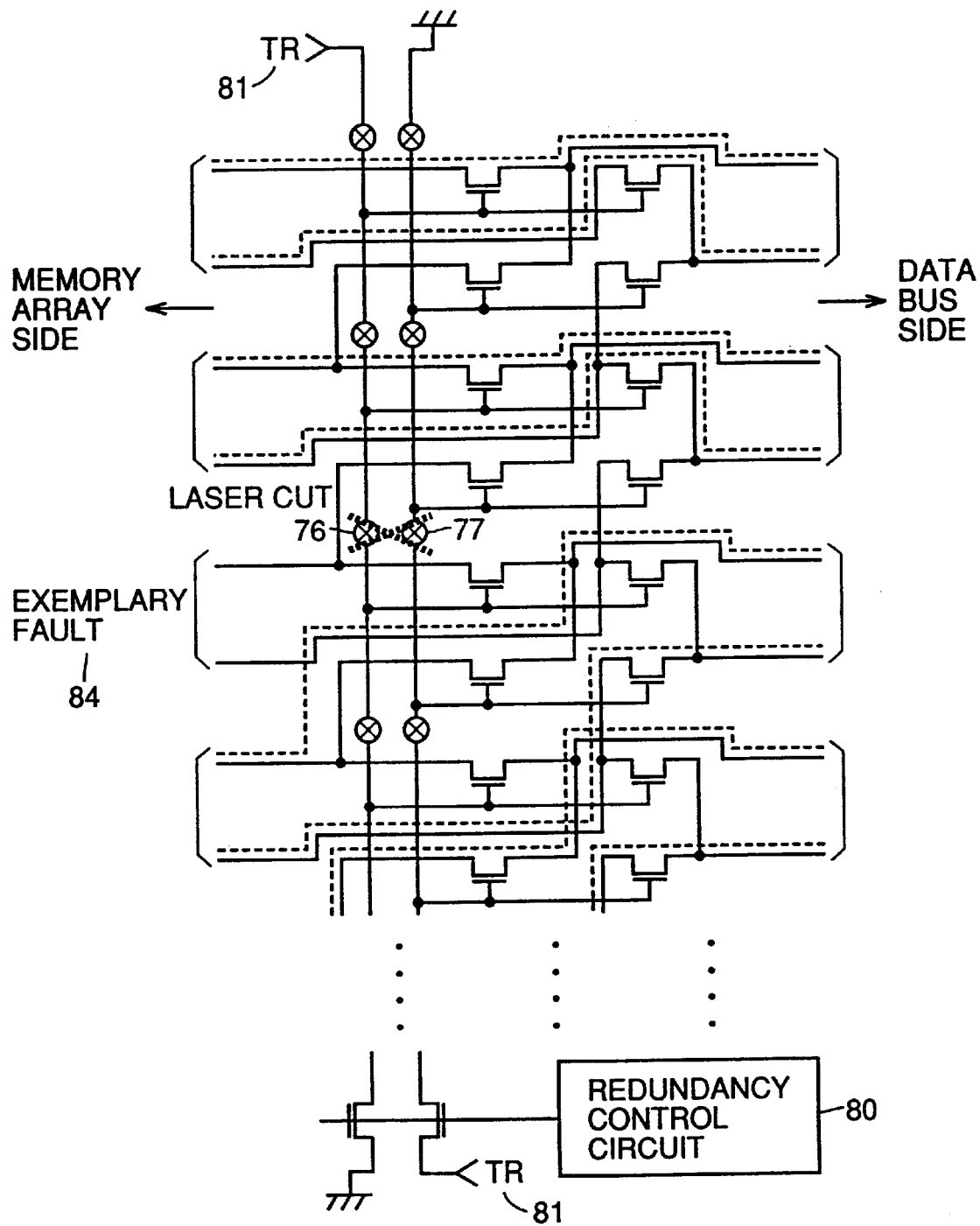
FIG. 41 illustrates a structure for repair when a fault is present in a memory cell column 84.

FIG. 41 shows a structure for repairing a faulty memory cell column 84.

When faulty portions are caused in correspondence to the pair of I/O lines 84, fuse link parts 76 and 77 corresponding to the faulty portions are laser-blown for attaining downward shifting with no connection to the faulty portion as shown by dotted lines.

Figure 42:
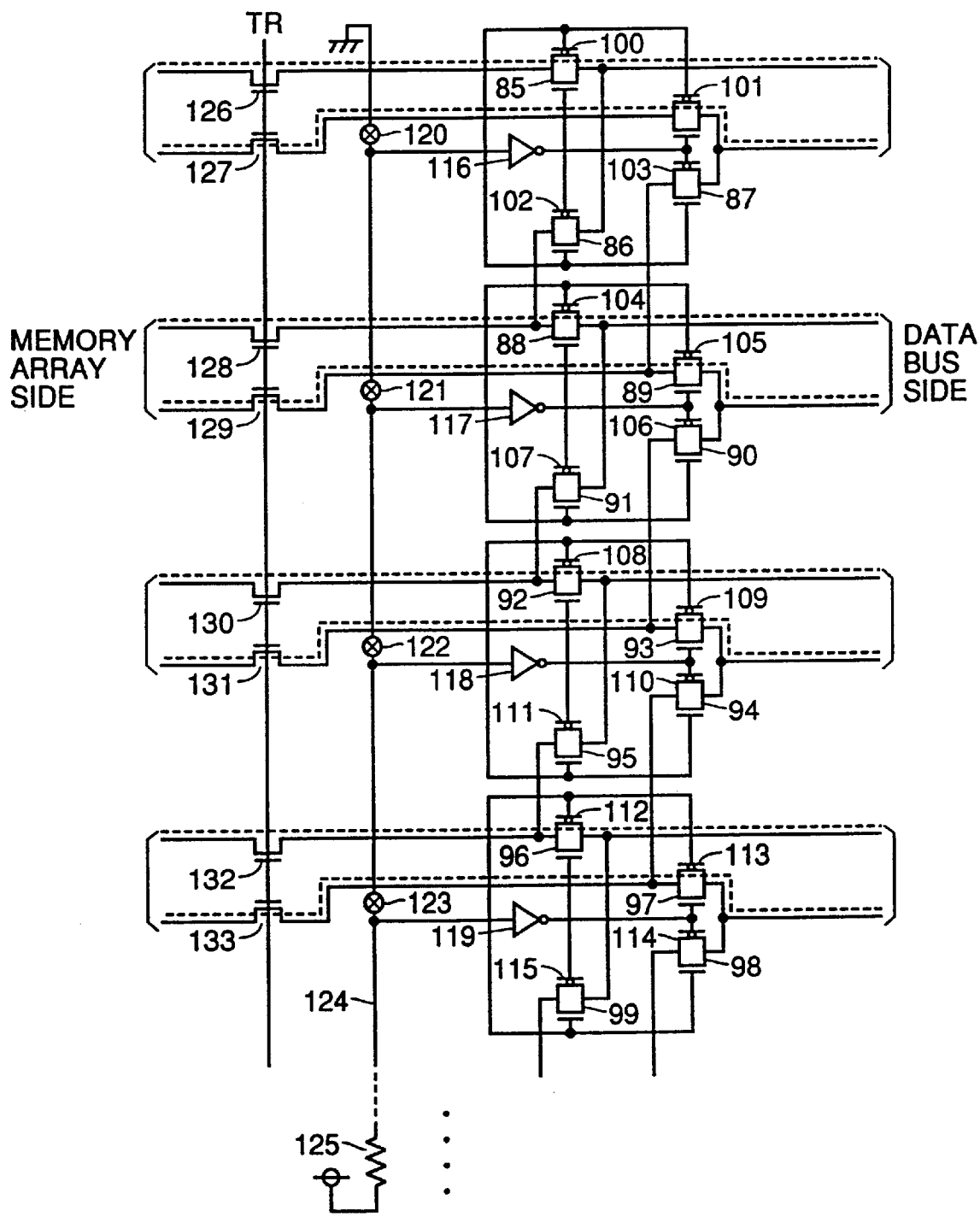
FIG. 42 illustrates a structure of arranging fuse link parts in a line by forming a switching circuit by CMOS transistors.

FIG. 42 shows a structure arranging fuse link parts in a line by forming the switching circuit by CMOS transistors in place of the Nchannel MOS transistors. A resistive element is simply arranged in place of the redundancy control circuit for current limitation. Further, transfer gates of a connection part are formed by CMOS transistors to reduce resistance of I/O lines (dotted lines show the connection state).

Figure 43:
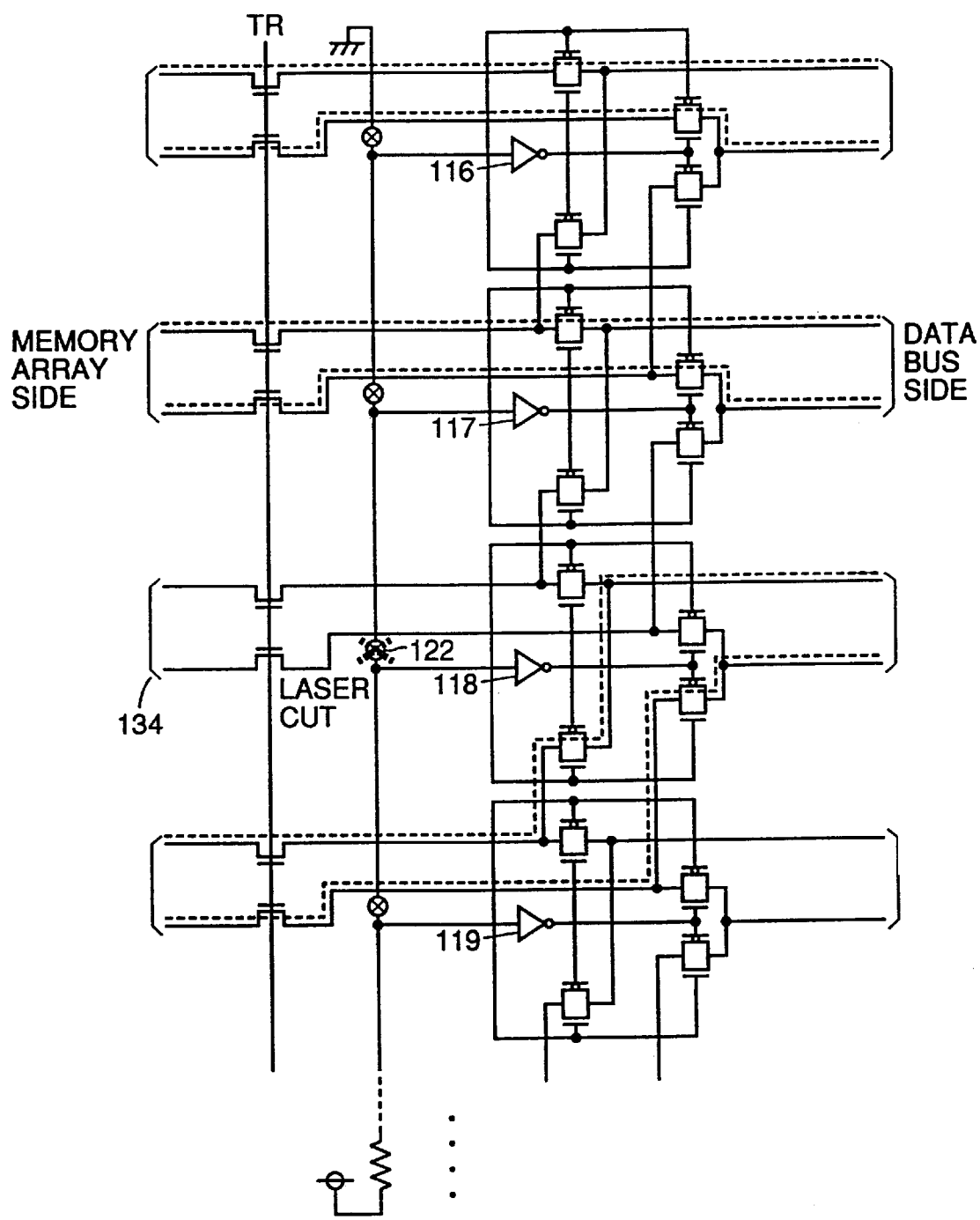
FIG. 43 illustrates such a state that a fuse link part 122 of an unnecessary portion is laser-blown to be shifted by one stage.

FIG. 43 shows such a state that a fuse link part 122 of an unnecessary portion is laser-blown to attain single-stage shifting.

Referring to FIG. 43, dotted lines show the connection state in this case.

In the above description, the connection of the pairs of I/O lines is switched by fuse elements. In the structure shown in FIG. 33, however, the connection switched by the fuse elements can alternatively be switched by shift transistors. In this case, it follows that the shift transistors are controlled by an encode signal in response to replacement with pairs of spare I/O lines.

In the first shift part for the spare I/O parts, the fuse elements may be replaced with shift transistors in this case, as described above.

However, the second shift part for the spare I/O parts must be capable of performing switching upward as well as downward. If all encode signals for upper shift portions are at low levels, for example, a spare I/O-A maintains connection with the left side or is shifted downward. If all encode signals for lower shift portions are at low levels, on the other hand, a spare I/O-B maintains connection with the left side or is shifted upward.

Figure 44:
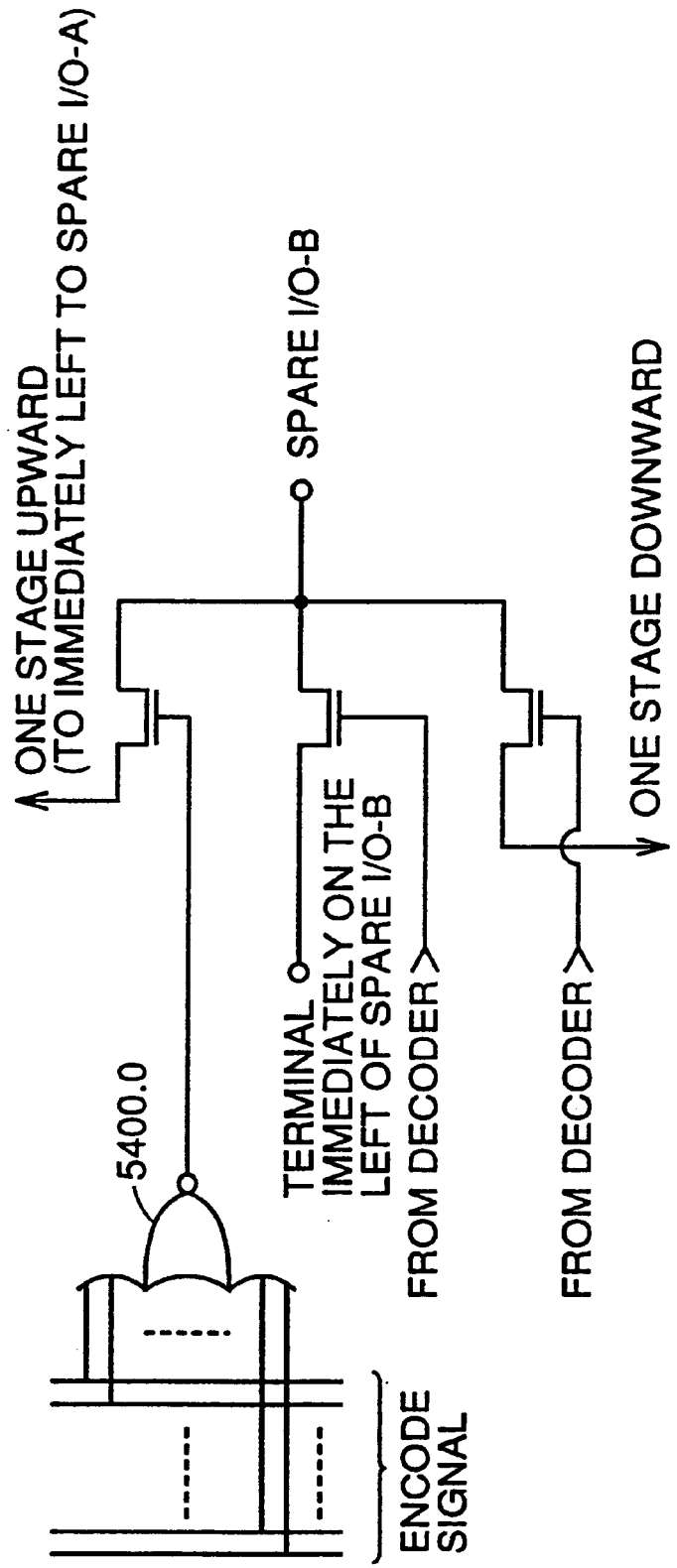
FIG. 44 illustrates a structure basically similar to a second shift part corresponding to a spare cell area.

FIG. 44 is a circuit diagram showing the structure of this part. A NOR gate 5400.0 processes encode signals from below so that the spare I/O-B is connected to a terminal upward by one stage, i.e., a terminal immediately on the left of the spare I/O-A when all signals inputted in the NOR gate 5400./0 are determined as at low levels.

A redundancy structure of a multiple I/O output structure can be implemented by performing replacement per I/O line. By employing the structure of performing two-stage shifting, further, a plurality of faulty portions can be repaired for performing efficient replacement. While the above description has been made with reference to two stages, a larger number of I/O lines can be redundancy-replaced by employing more stages.

[Structure Performing Shift Operation by Shift Transistor]

Figure 45:
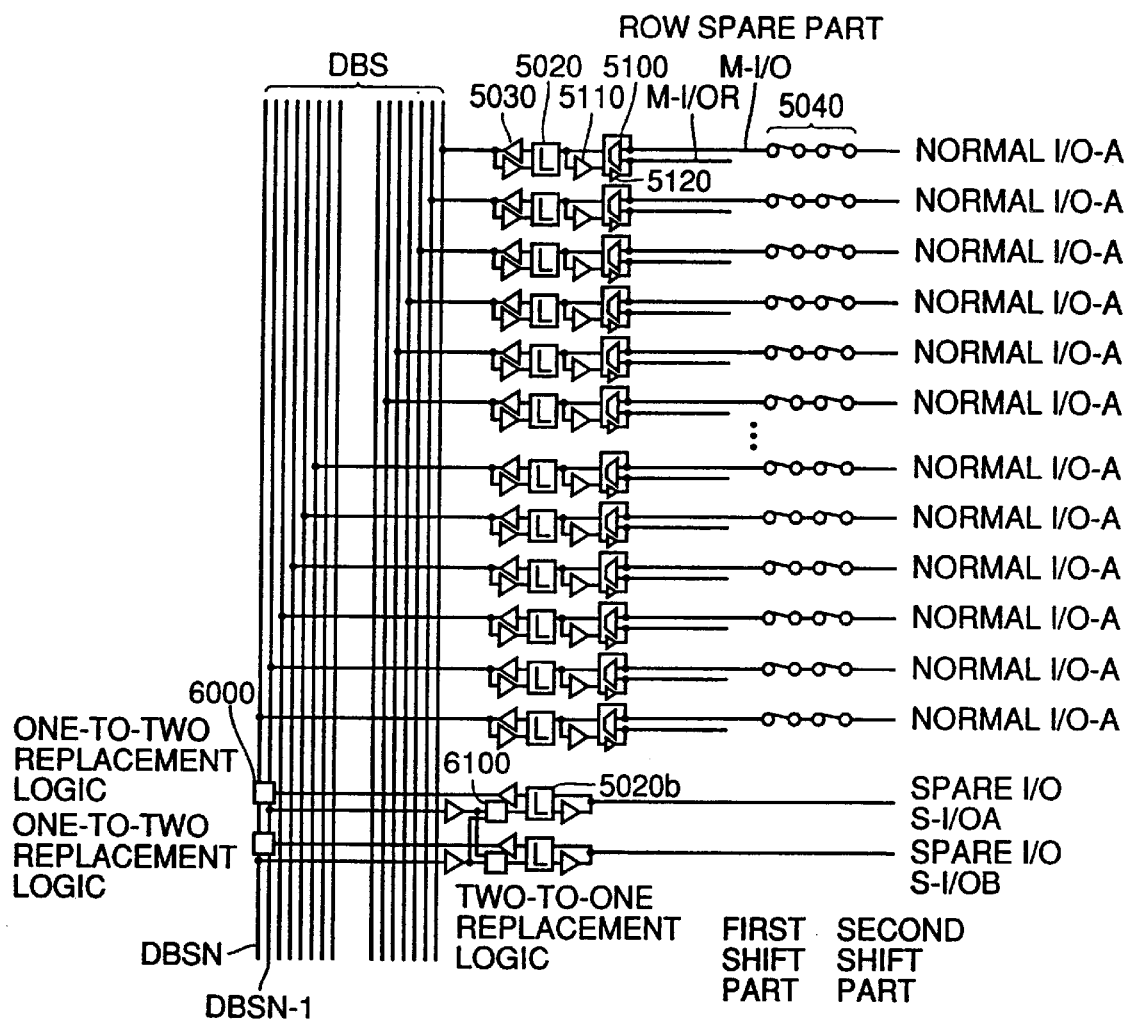
FIG. 45 is a circuit diagram showing another structure of shift redundancy.

FIG. 45 is a schematic block diagram showing another structure of shift redundancy.

This structure is different from that shown in FIG. 33 in the following points:

First, no structure corresponding to a redundancy column is present in an area provided with spare I/Os.

In the structure shown in FIG. 45, a shift switching circuit 5040 shifts data from normal pairs of main I/O lines but does not shift data read from a row spare area.

In this case, a multiplexer circuit 5100 selectively supplies read data from the shift switching circuit 5040 and that from the row spare area to a latch circuit 5020.

In the structure shown in FIG. 45, further, two pairs of spare I/O lines S-I/OA and S-I/OB are arranged on an end of the memory array.

The data read from the normal pairs of main I/O lines are multiplexed with the data read from the row spare area in a read operation, fetched in the latch circuit 5020, amplified and thereafter connected to data buses through a read amplifier 5030.

If the result of redundancy determination for a row address indicates employment of the normal I/O lines, the data thereof is held as a flag for recognizing the employment of normal I/O lines when accessing a column of a bank, fetching and amplifying the data on the normal I/O lines in the latch as such.

If the result of the redundancy determination indicates spare employment, the data thereof is held as a flag for recognizing the spare employment when accessing a column of a bank, fetching and amplifying the data read from the row spares in the latch as such.

The part of the normal pairs of main I/O lines initially performs an access operation regardless of the result of the determination, while whether to continue or terminate the access operation is decided depending on the result of the determination.

In a write operation, the amplifier circuit 5030 receives data of a data bus, so that a write driver 5110 thereafter drives a normal pair of I/O lines M-I/O by the data fetched in the latch circuit 5020 while a shift driver circuit 5120 receiving an output of the write driver 5110 drives a pair of I/O lines on the row spare.

On the basis of the result of redundancy determination on a row address fetched and held as a flag, whether to activate a normal column selection line and write data or to terminate activation of the normal column selection line, terminate data writing and perform data writing through connection with a spare row is decided. If the flag for a bank for column access indicates redundancy employment in response to correspondence between the flag holding the result of redundancy determination for the row address and the bank in column in relation to the spare row and a pair of I/O lines on the spare row, a sub YS line corresponding to the redundancy is activated.

A row spare part, formed by a latch, requires no activation of a word line itself. Further, redundancy for a column is unnecessary due to such a low possibility that a faulty portion is caused in the row spare part, whereby the pair of I/O lines M-I/OR and the read/write amplifier may be in one-to-one correspondence in the row spare (row redundancy) part.

In response to two-stage shifting of connection between the pairs of normal I/O lines through column-system shift redundancy with non-connection between the end pair of I/O lines and data buses DBSN and DBSN-1, first pairs of spare I/O lines S-I/O-A and S-I/O-B serving as spares for columns are activated to be connected to the data bus parts DBSN and DBSN-1.

In the spare I/O parts, therefore, no shift circuits but replacement circuits 6000 and 6100 for connection with the data buses are present. In a read operation, the two pairs of spare I/Os transmit data to latches 5020b.

The replacement logic circuits 6000 and 6100 corresponding to the respective ones of the data of the latches 5020b decide to which data buses the data are connected in response to results of redundancy determination. If any pair of I/O lines have already been set to be replaced with a pair of I/O lines of another bank, the remaining pair of spare I/O lines can be employed in this case. According to this structure, different banks can be repaired by the same spares, whereby the degree of freedom in redundancy replacement is improved to improve the yield even if the total number of arranged spares is small.

Further, the spare I/Os, capable of replacing faulty addresses in units of sub YS lines, can make repair in units of pairs of bit lines including a prescribed number of pairs of bit lines. This also contributes to improvement of the yield. While FIG. 44 shows two stages of shift circuits, the shift circuits may be provided in three or more stages, for example.

When performing an operation test of memory cells of the spare I/O part in the aforementioned structure, data can be read from/written in the memory cells of the spare I/O part by simply automatically setting the value of a faulty address at an arbitrary address if a nonvolatile memory circuit rewritably holds the faulty address, for example. When clearing a faulty address programmed once, further, the faulty portion can be read/written again.

Figure 46:
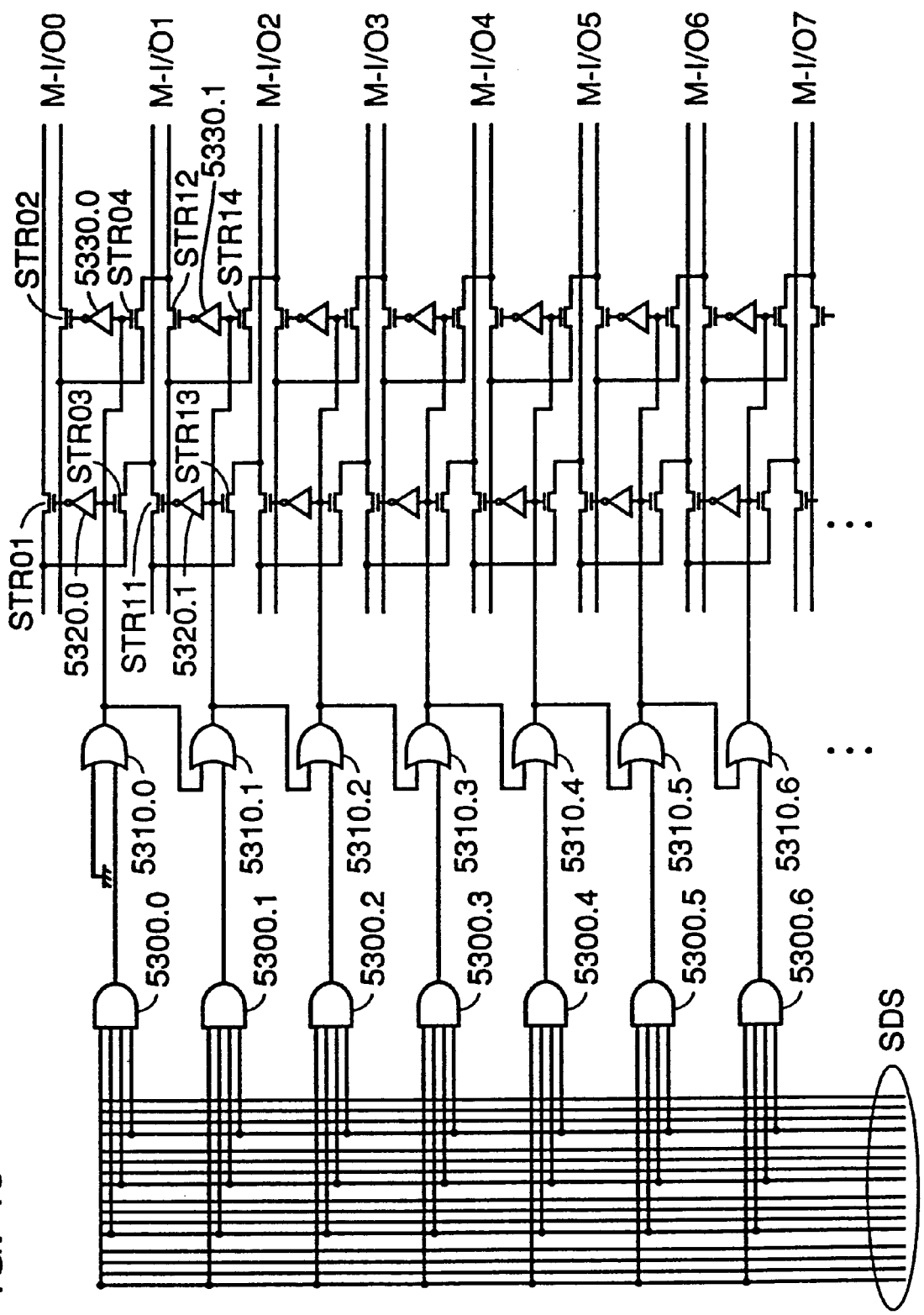
FIG. 46 is a schematic block diagram showing a structure of performing a shift operation in response to a decode signal SDS.

FIG. 46 is a schematic block diagram showing a structure performing a shift operation in response to a decode signal SDS for deciding a shift position for connection between array side pairs of I/O lines and a read/write amplifier side.

While FIG. 46 shows only one stage of shift circuit, the two-stage shift circuit shown in FIG. 45 can be formed by providing two stages of such structures.

In response to an output from an OR circuit 5310.0 receiving an output of an AND circuit 5300.0 receiving the signal SDS in one input node while receiving the ground potential in another input node, signals from invertors 5320.0 and 5330.0 switch shift transistors STR01, STR02, STR03 and STR04.

In response to an output from an OR circuit 5310.1 receiving an output of an AND circuit 5300.1 receiving the signal SDS in one input node while receiving the output of an OR circuit 5310.1 in another input node, signals from invertors 5320.1 and 5330.1 switch shift transistors STR11, STR12, STR13 and STR14.

Similar structures are provided also in correspondence to the remaining pairs of main I/O lines.

While the first shift part has been described, the second shift part is basically similar in structure to the above.

A redundancy structure of a multiple I/O structure can be implemented by performing replacement every I/O line. In a conventional structure arranging n redundancy structures per block, on the other hand, the redundancy structure must be arranged per I/O, to result in an unnecessarily large number of redundancy parts and wasted areas.

Further, a plurality of faulty portions can be repaired due to the twostage shifting structure, to perform efficient replacement. While the above description has been made with reference to two-stage shifting, a larger number of I/O lines can be redundancy-replaced by employing a larger number of stages. In addition, faulty portions can be replaced every bank or mat of a multi-bank structure by dynamically changing the connection mode, whereby the repairability can be more improved.

Figure 47:
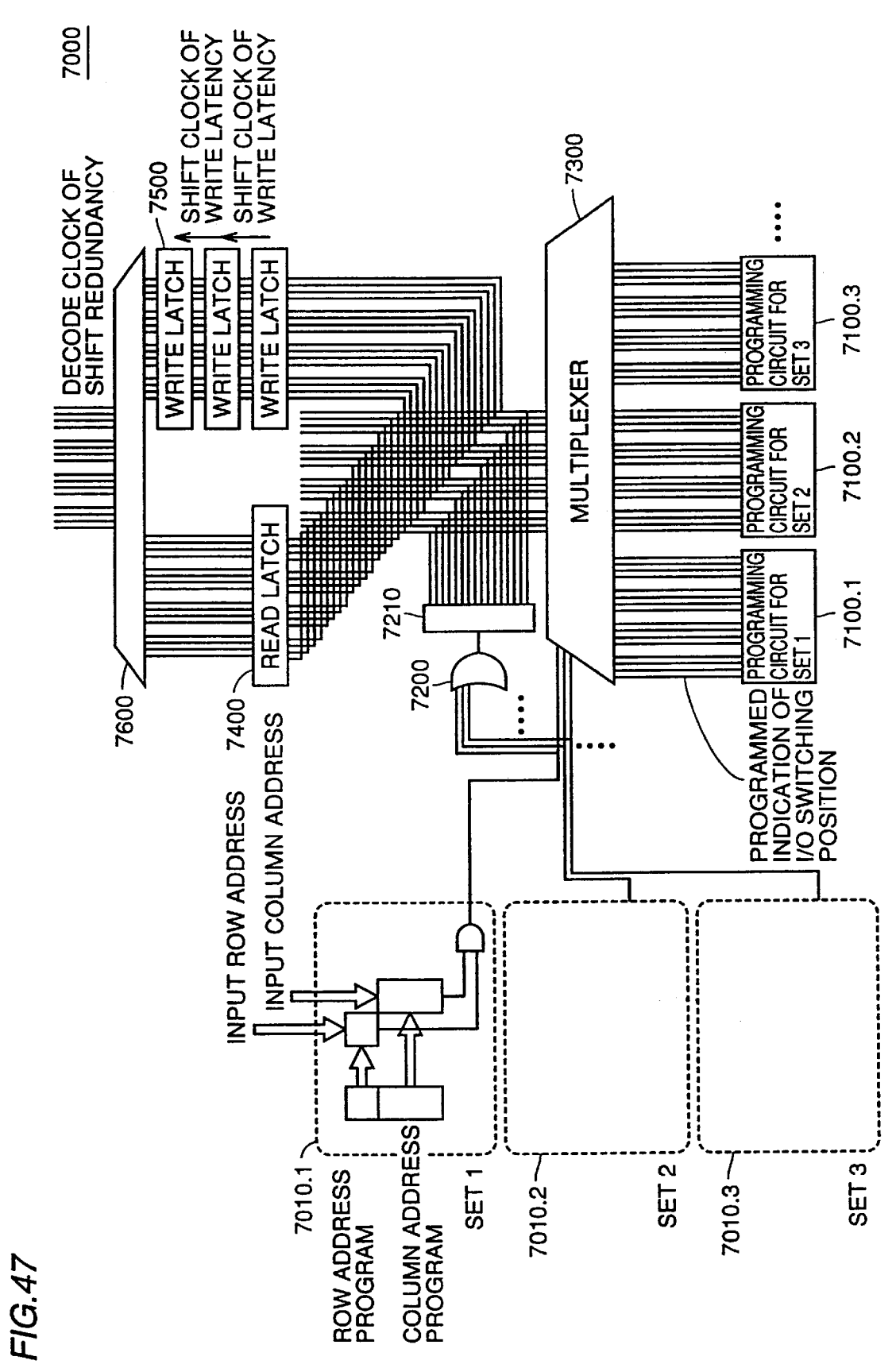
FIG. 47 illustrates the structure of a circuit 7000 for generating the decode signal indicating a shift position of redundancy.

FIG. 47 shows the structure of a circuit 7000 for generating the decode signal indicating a shift portion of redundancy.

Addresses of a corresponding row (bank or mat) and a column and information indicating the place of a corresponding I/O shift position in address input are programmed in compare circuits 7010.1 to 7010.p (p: prescribed natural number).

When the inputted row address and column address match with faulty addresses, a precharge circuit 7210 cancels precharging of an output node of a multiplexer 7330 in response to an output of an OR circuit 7200 receiving outputs of the compare circuits 7010.1 to 7010.p (it is assumed that the precharge level is low). On the other hand, the decode signal indicating the I/O switching position is outputted through a multiplexer 7300. This decode signal is previously held in programming circuits 7100.1 to 7100.p in correspondence to faulty addresses held in the compare circuits 7010.1 to 7010.p respectively.

The decode signal outputted from the multiplexer 7300 is held in a read latch circuit 7400 and a write latch circuit 7500 for the present.

These latch circuits are provided since whether it is a read operation or a write operation cannot be distinguished in an address determination period in a mode where an address signal is read in advance of a command signal by one cycle described later.

Therefore, the latch circuits 7400 and 7500 output data as such without delaying the timing by shift operations in normal operations.

Thus, the decode signal is transmitted from a multiplexer 7600 serving as a read/write selection switch as a signal controlling shift redundancy.

In a mode where the address signal is looked ahead of the command signal by one cycle, the latch circuit 7400 shift-operates the decode signal by one cycle dock for the read operation. In this mode, the write latch circuit 7500 for the write operation shifts an input of a write command in accordance with a write latency and thereafter outputs the same for performing decoding of shift redundancy.

Figure 48:
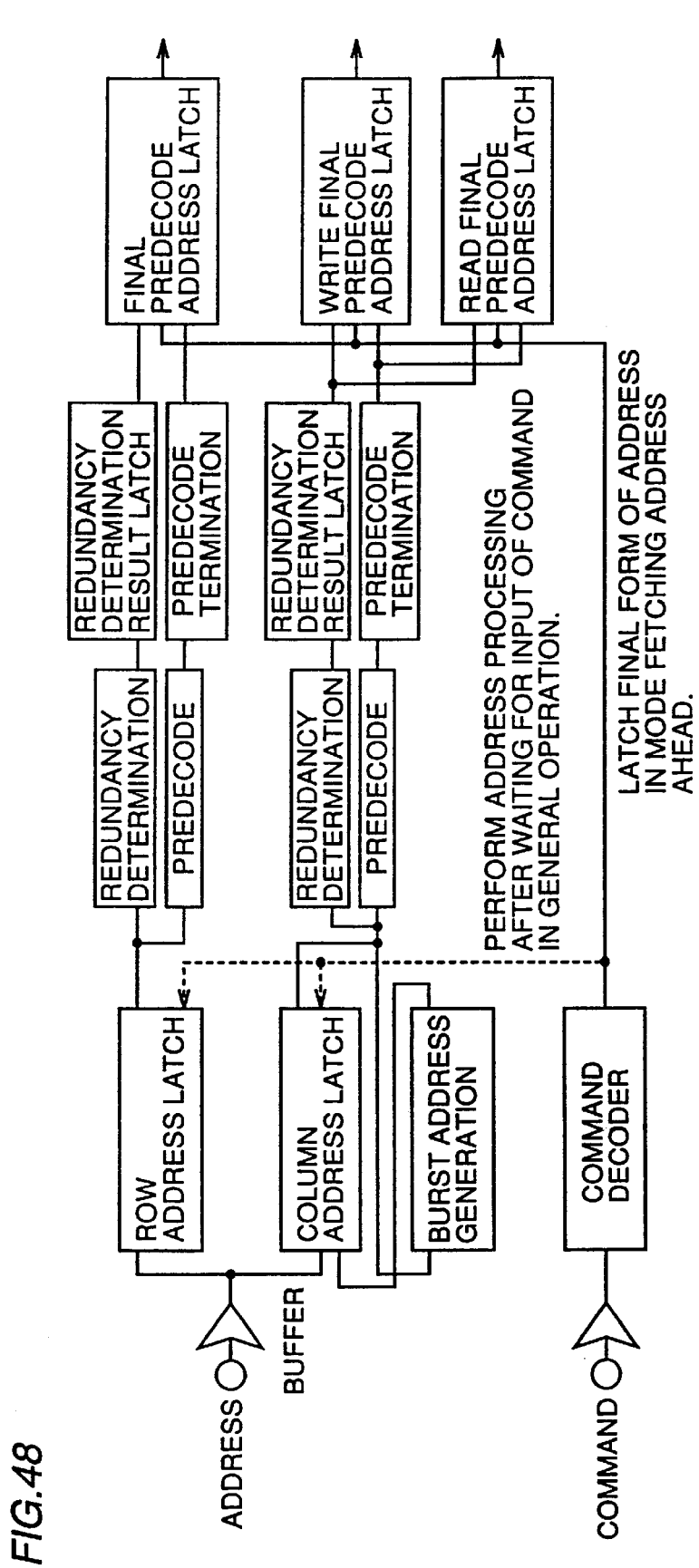
FIG. 48 is a flow diagram showing the flow of address signal processing.

FIG. 48 illustrates the flow of address signal processing.

When the row address is fetched along with command data in a general mode, redundancy determination and predecoding are performed in parallel. The result of redundancy determination is held in the latch circuits while a predecode address for finally performing selection is latched after a result of predecoding for the row address is obtained, for performing row selection on the basis thereof. When the column address is fetched with the command data in this mode, a burst address is generated for performing redundancy determination and predecoding in parallel. The result of redundancy determination is held in the latch circuits while a read predecode address or a write predecode address for finally performing selection is latched after a result of predecoding for the row address is obtained, for performing column selection on the basis thereof.

When the row address is fetched in the mode where the address signal is looked ahead of the command signal by one cycle, redundancy determination and predecoding are performed in parallel. The result of redundancy determination is held in the latch circuits while a predecode address for finally performing selection is latched after a result of predecoding for the row address is obtained, for performing row selection on the basis thereof. When the column address is fetched in this mode, a burst address is generated for performing redundancy determination and predecoding in parallel. The result of redundancy determination is held in the latch circuits while, if command data is inputted, a read predecode address or a write predecode address for finally performing selection is latched after a result of predecoding for the row address is obtained in response to whether this is a read command or a write command, for performing column selection on the basis thereof.

Figure 49:
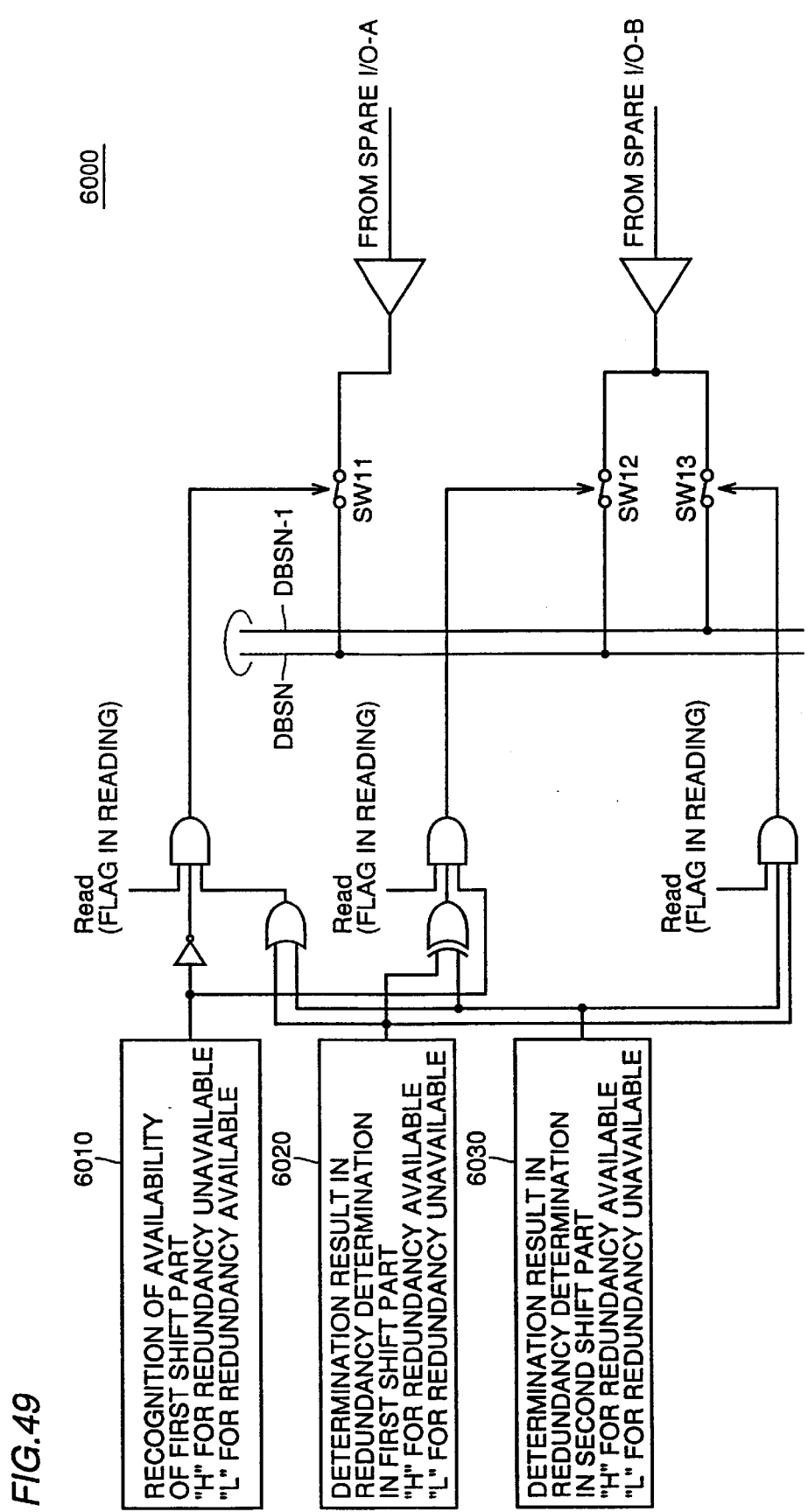
FIG. 49 is a schematic block diagram showing the structure of a one-to-two replacement logic circuit 6000.

FIG. 49 is a schematic block diagram showing the structure of the one-to-two replacement logic circuit 6000 shown in FIG. 44.

This figure illustrates only a read side of the one-to-two replacement logic circuit 6000.

The one-to-two replacement logic circuit 6000 is a circuit recognizing unavailability when repair was performed once with the spare I/O-A but thereafter the spare I/O-A has become unavailable since it has already been found out that the spare I/O-A is faulty in a test of the redundancy part for switching the connection between the spare I/O-A and the spare I/O-B.

Signals indicating whether or not to use redundancy are required in results of redundancy determination in two shift parts respectively. While the spare I/O-A is preferentially employed in the spares I/O-A and I/O-B, information for regarding I/O-A as unavailable is outputted when 1/O-A is unavailable such that a faulty cell is present in I/O-A in an initial fault check, for example, or when repair was performed once with I/O-A but a fault has been detected through re-checking and repair must be performed again with I/O-B.

A determination circuit 6010 determines availability/unavailability of the first shift part, and outputs a high-level signal if redundancy is available while outputting a low-level signal if redundancy is unavailable.

In response to the redundancy determination in the first shift part, a determination circuit 6020 outputs a high-level signal if redundancy available while outputting a low-level signal if redundancy is unavailable.

In response to redundancy determination in the second shift part, a determination circuit 6030 outputs a high-level signal if redundancy is available while outputting a low-level signal if redundancy is unavailable.

Latencies for the read and write operations are different in magnitude from each other, and hence the determination circuits 6020 and 6030 have different latch circuits for the read and write operations respectively.

When employing the redundancy column of at least either the spare I/O-A or the spare I/O-B in the read operation and the spare I/O-A is available, read data from the spare I/O-A is transmitted to the data bus DBSN through a switching circuit SW11.

When employing the redundancy column of either the spare I/O-A or the spare I/O-B in the read operation and the spare I/O-A is unavailable, read data from the spare I/O-B is transmitted to the data bus DBSN through a switching circuit SW12.

When employing the redundancy columns of both the spare I/O-A and the spare I/O-B, the read data from the spare I/O-B is transmitted to the data bus DBSN-1 through a switching circuit SW 13.

Figure 50:
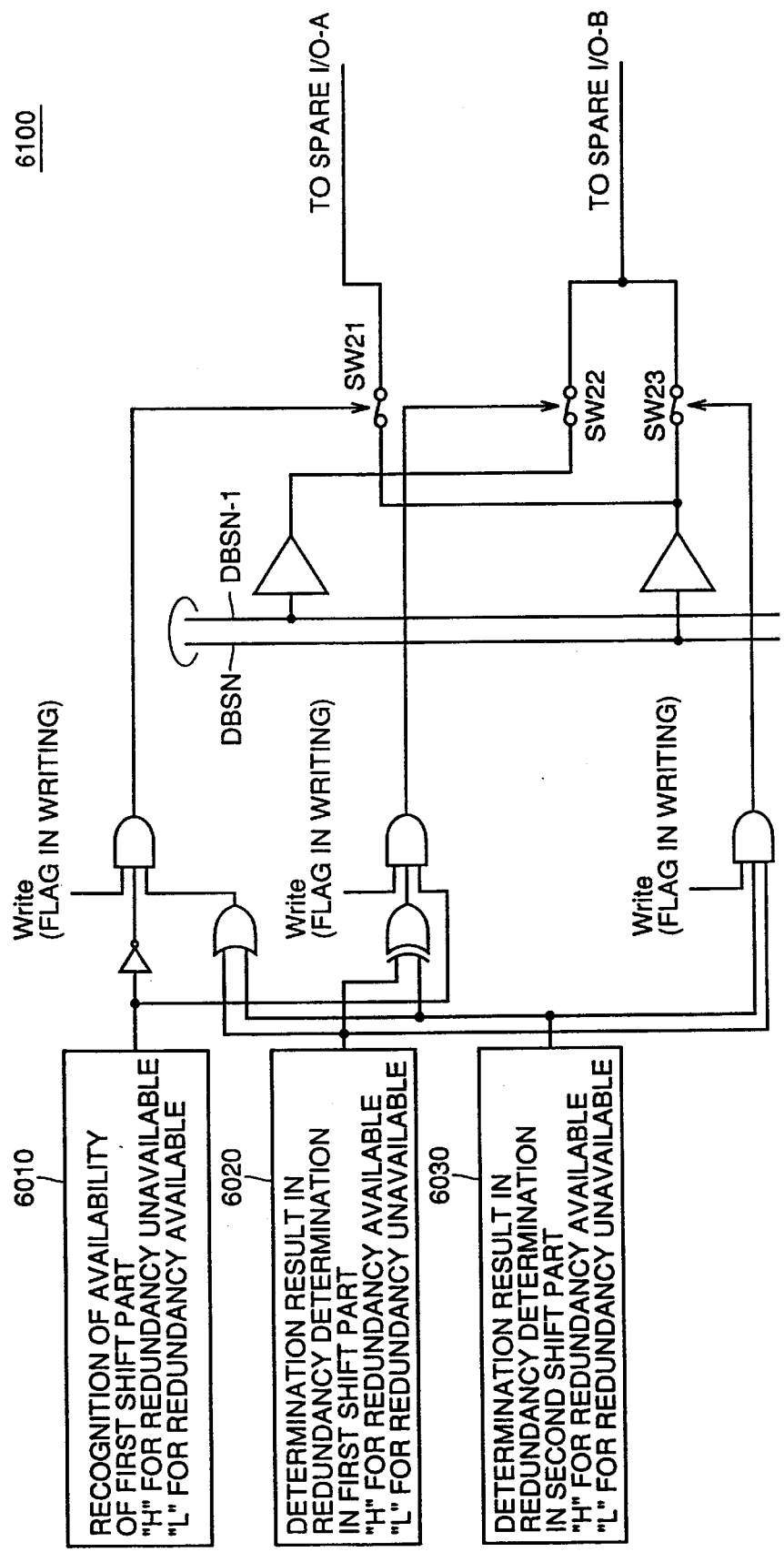
FIG. 50 is a schematic block diagram showing a two-to-one replacement logic circuit 6100.

FIG. 50 is a schematic block diagram showing the two-to-one replacement logic circuit 6100.

This figure shows the structure of only a write side.

When employing the redundancy column of at least either the spare I/O-A or the spare I/O-B in the write operation and the spare I/O-A is available, write data from the data bus DBSN is transmitted to the spare I/O-A through a switching circuit SW21.

When employing the redundancy columns of both the spare I/O-A and the spare I/O-B in the write operation, write data from the data bus DBSN-1 is transmitted to the spare I/O-B through a switching circuit SW22.

When employing the redundancy column of either the spare I/O-A or the spare I/O-B -in the write operation and the spare I/O-A is unavailable, write data from the data bus DBSN is transmitted to the spare I/O-B through a switching circuit SW23.

Figure 51:
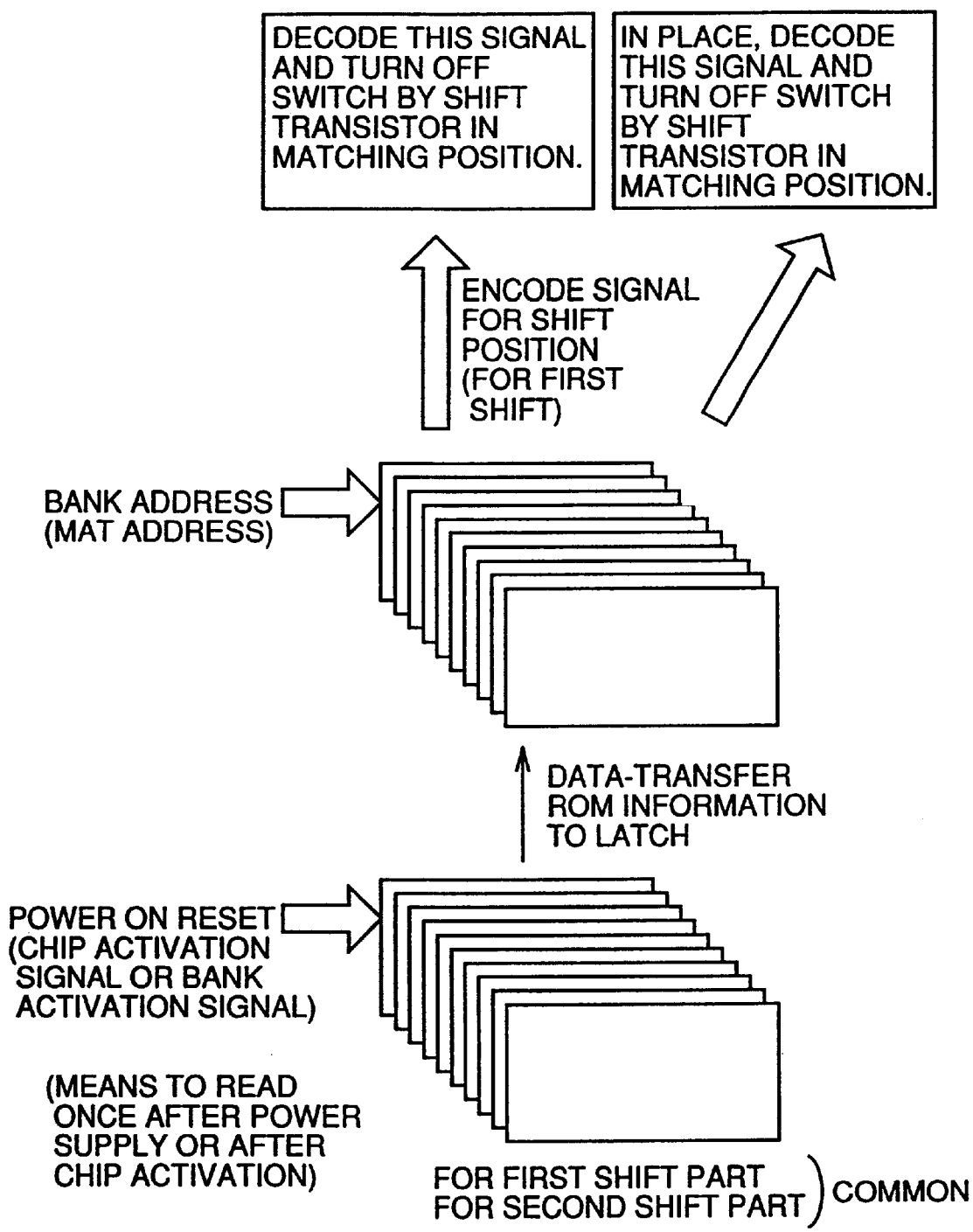
FIG. 51 illustrates an exemplary structure of control rendering a connection state dynamically changeable.

FIG. 51 illustrates an exemplary structure of control rendering the connection state dynamically changeable as described above. In other words, this figure shows the flow of control for the structure replacing faulty portions every bank or mat in the multi-bank structure.

In the multi-bank (multi-mat) structure, I/O lines are arranged over another bank (mat). When repaired I/Os vary with the bank (mat), therefore, the connection state must be changed.

Therefore, shift information for the first shift part and that for the second shift part are changed in accordance with an inputted bank address (mat address).

First, a programming element programming the faulty address may have a structure selected from various structures such as a nonvolatile memory employing a ferromagnetic film, a nonvolatile RAM structure with a flash ROM and the like.

It has a structure of holding the faulty address in common for the first shift part and the second shift part.

The information is transferred to a latch arranged on a compare part after activation of the chip following power supply. The information is transferred between generation of power on reset and a column operation requiring comparison. The information may be transferred in parallel or serially transferred through a shift register.

When transferring the information through the shift register, the latch of the compare part forms part of the shift register, to simplify the transfer operation. A transfer clock may be internally generated by a ring oscillator having a proper cycle, or may be generated on the basis of an external clock.

The compare part compares input of the bank address (mat address) with information read from a ROM part and outputs repair information in accordance with a result of match/mismatch. The repair information is outputted as an encode signal for a shift position, and this signal is further decoded for changing the shift state. In this case, fuse link parts in data blowing in the aforementioned shift structure are formed by MOS transistors, and the decode signal controls ONIOFF states of the MOS transistors shelving as switches.

Figure 52:
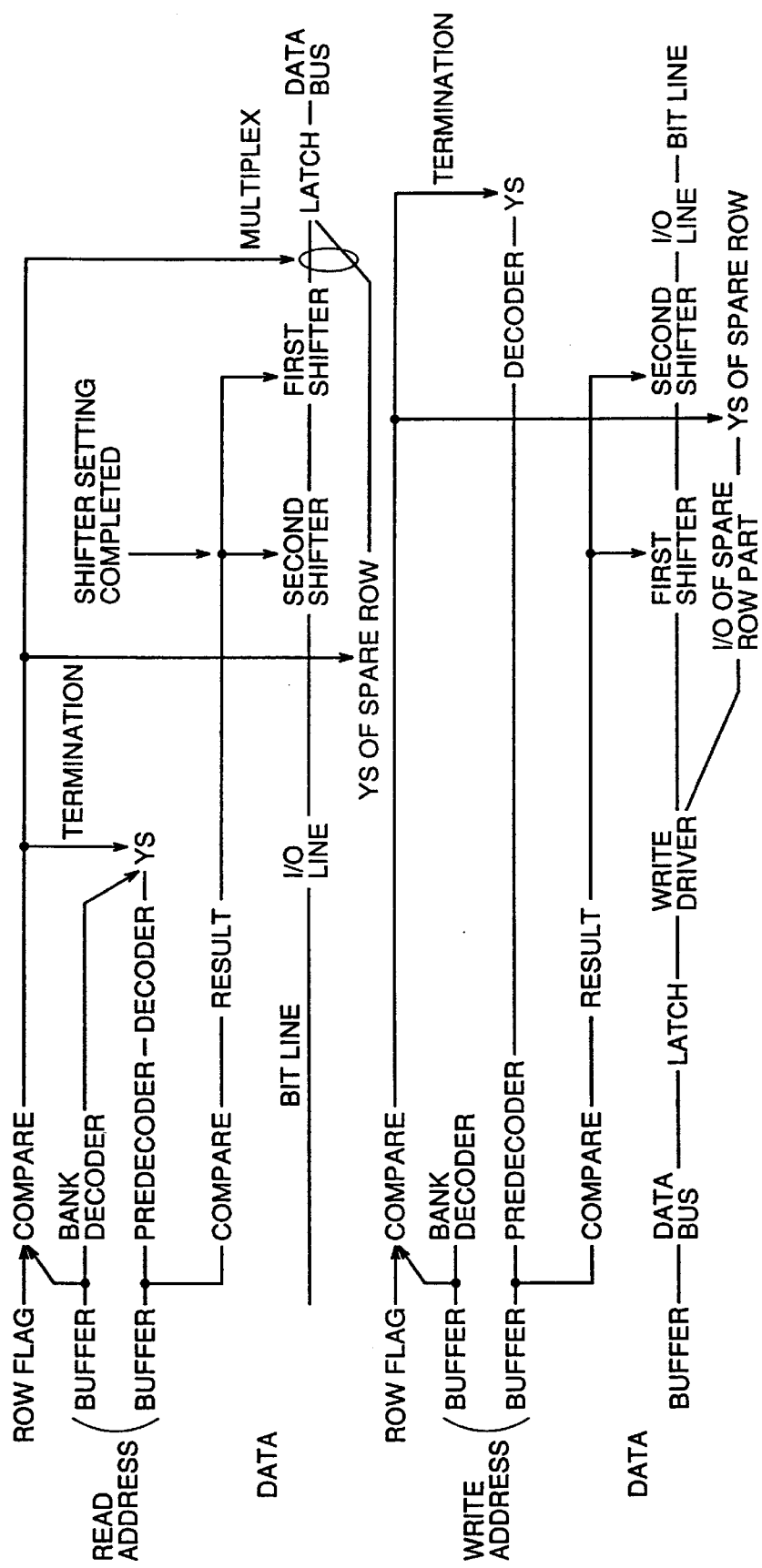
FIG. 52 is a flowchart illustrating the control flow in more detail.

FIG. 52 is a flowchart illustrating the control flow shown in FIG. 51 in more detail.

In the read operation, the supplied row address is compared with a faulty row address while the bank address and the column address are decoded in parallel. In a normal memory array, a signal YS for column selection is generated on the basis of the results of decoding.

On the other hand, the column address is also compared with a faulty column address. When a spare column I/O is selected in response to the result of this comparison, column selection by the signal YS in the normal memory array is first terminated. Second, setting of a shifter is completed so that the shift operation of the second shift part 5060 is performed and then the shift operation of the first shift part 5050 is performed.

Then, the multiplexer 5100 selects data read from the spare row and data from the spare I/O and supplies the same to the data bus DBS.

In the write operation, the supplied row address is compared with the faulty row address while the bank address and the column address are decoded in parallel.

On the other hand, the column address is also compared with the faulty column address. In parallel with this, write data is transmitted to the latch circuit 5020 through the data bus DBS, and amplified by the write driver 5110. Thus, the write data is transmitted to the shift switching circuit 5040 and the I/O part of the spare row.

When the spare row is selected in response to the comparison of the row address and the faulty row address, a column selection signal YS(CSL) for the spare row is activated for terminating column selection for the normal memory array area.

When a spare column I/O is selected in response to the result of comparison of the column address and the faulty column address, on the other hand, the shift operation of the first shift part 5050 is performed and then the shift operation of the second shift part 5060 is performed.

Thus, data is written through the pair of main I/O lines M-I/O and written in the spare column by the pair of spare I/O lines S-I/O.

Figure 53:
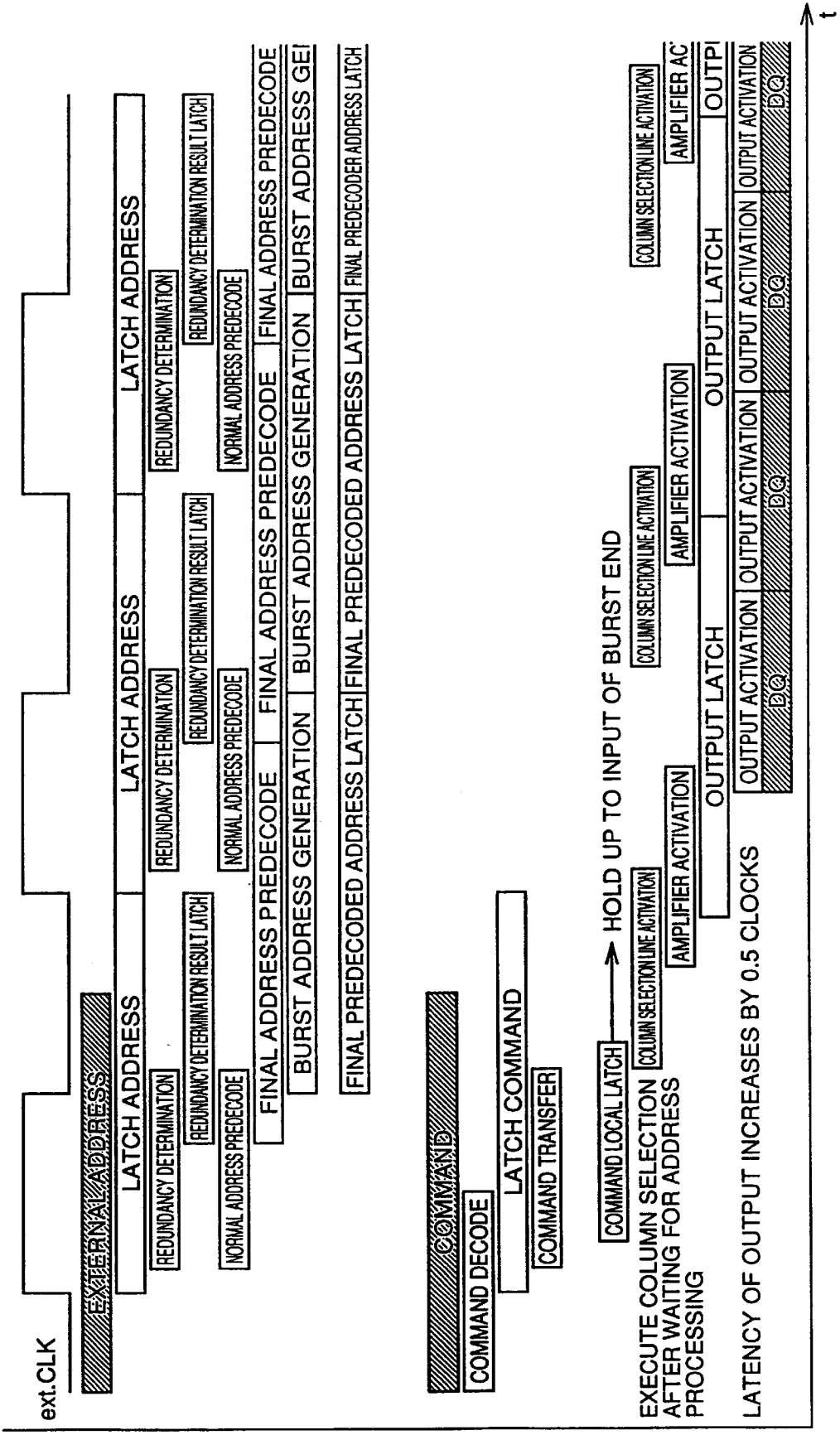
FIG. 53 illustrates access, command and data processing in a general read operation.

FIG. 53 illustrates access, command and data processing in a general read operation.

An external address is latched with the command for performing redundancy determination. The redundancy determination is performed in parallel with address predecoding.

The result of the redundancy determination is latched for thereafter deciding whether to employ a general address or a redundant address for accessing the memory array. The command signal is held up to termination of a burst cycle. An operation in the memory array is started after waiting for address processing (result of redundancy determination), for performing processing such as activation of the column selection line. After a next cycle, a similar operation is repeated in accordance with generation of the burst address.

Figure 54:
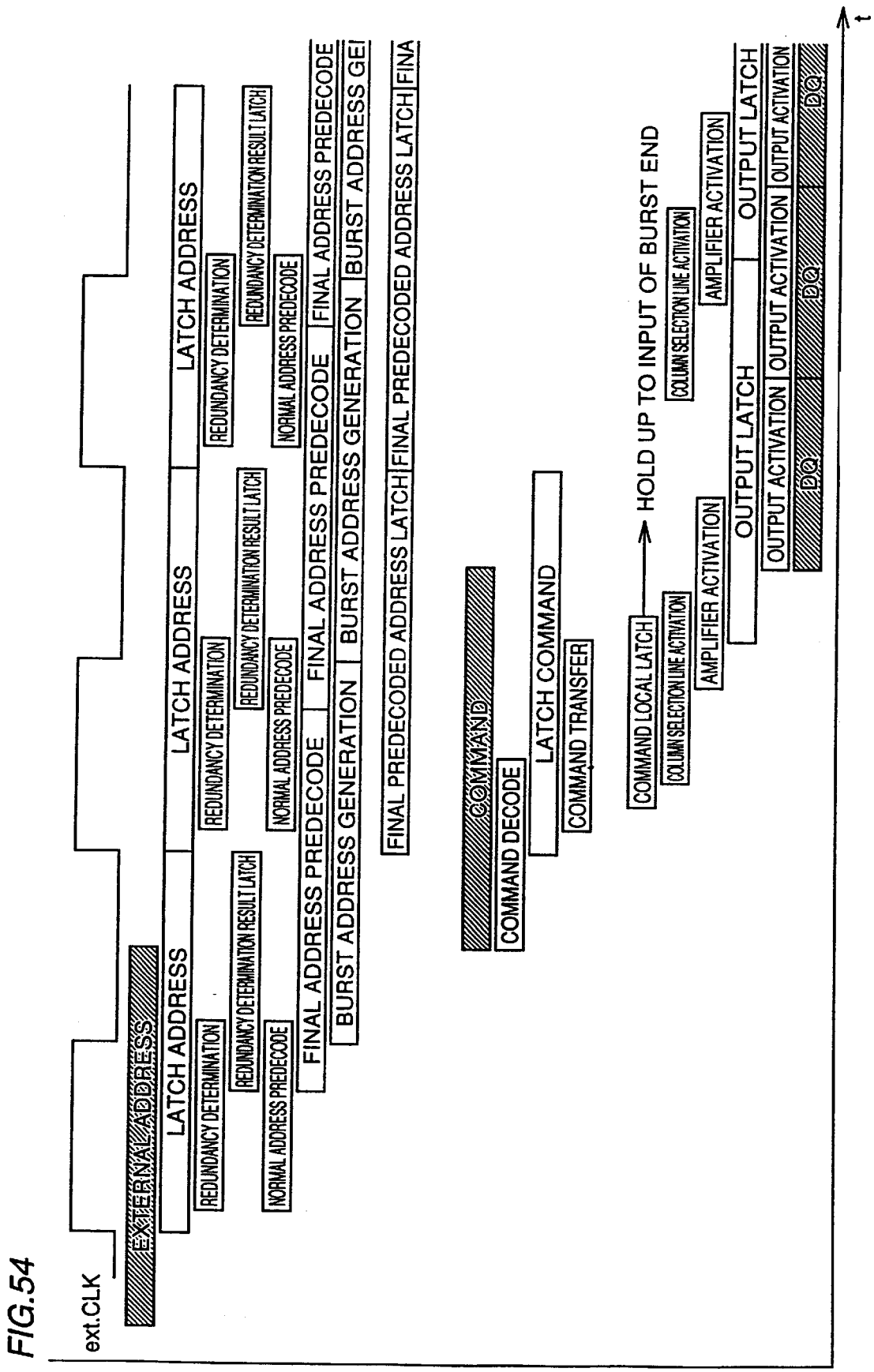
FIG. 54 is a timing chart showing an operation of fetching an address in advance of a command by one cycle for processing the same in a read operation.

FIG. 54 is a timing chart showing an operation fetching the address ahead of the command by one cycle and processing the same in the read operation.

Therefore, it follows that the address signal is fetched every cycle.

The fetched address signal is subjected to redundancy determination and predecoding, and the semiconductor memory device enters a command input wait state. If no command is inputted, processing is performed on a fetched new address again for updating the contents in a next cycle. When a command is inputted, the result of redundancy determination is activated and latched to decide whether to employ a general address or a redundant address for accessing the memory array in accordance with the result.

The value of the command signal is held up to termination of the burst cycle. The address processing (result of redundancy determination) has already been terminated and hence the operation in the memory array is started with transfer of the command, for performing processing such as activation of the column selection line.

After the next cycle, a similar operation is repeated in accordance with generation of the burst address. Address processing is performed with the burst address up to termination of the burst cycle, and redundancy determination is performed through an external address again following termination of the burst cycle.

Figure 55:
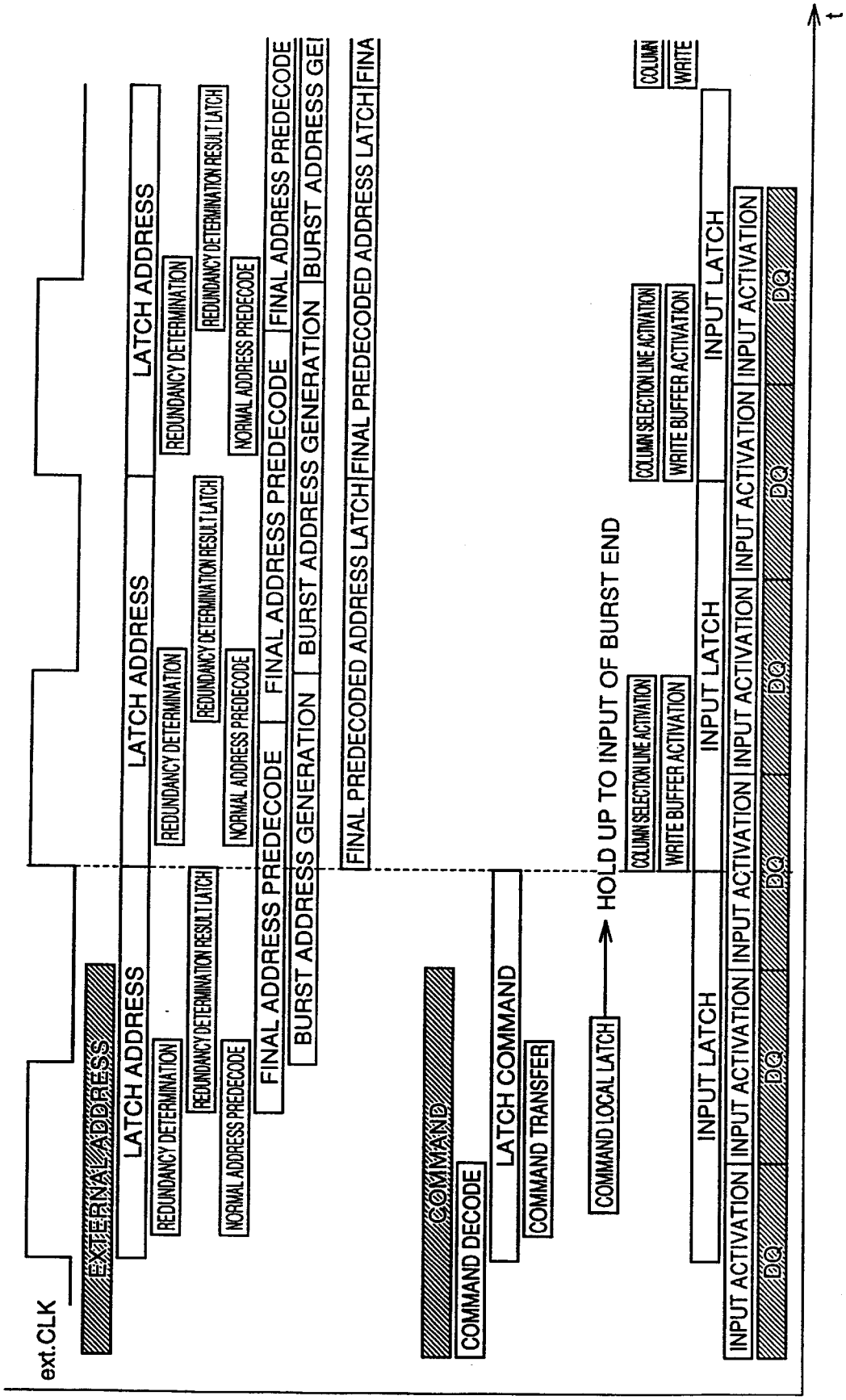
FIG. 55 illustrates access, command and data processing in a general write operation.

FIG. 55 illustrates access, command and data processing in a general write operation.

The address signal is processed similarly to the read operation. In this case, however, the fetched address is latched as a final predecode address by an internal latency (one clock in this case) in writing for performing a shift operation.

Figure 56:
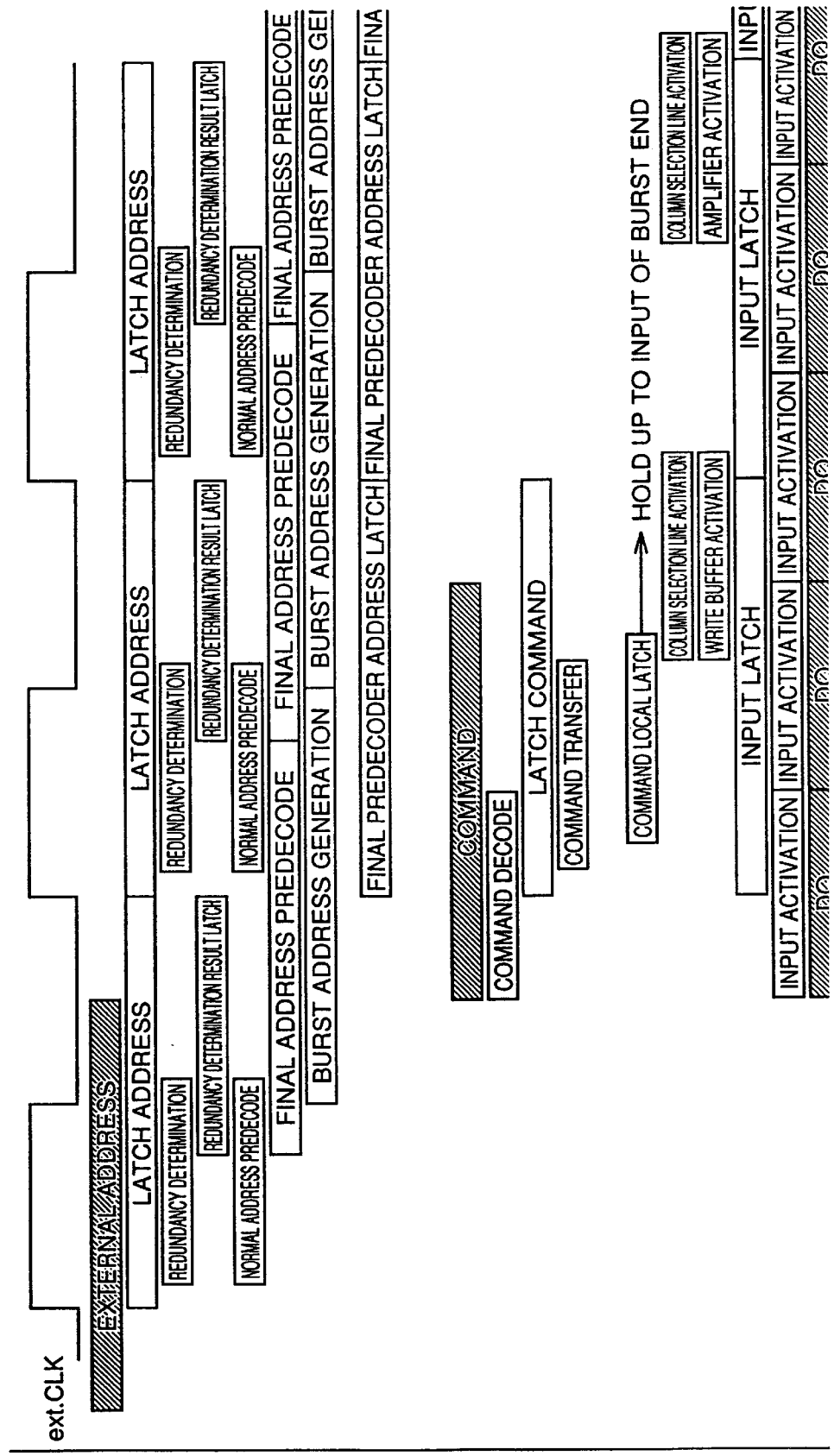
FIG. 56 is a timing chart showing an operation of fetching an address in advance of a command by one cycle for processing the same in a write operation.

FIG. 56 is a timing chart showing an operation of fetching an address ahead of a command by one cycle in writing.

In this case, address processing is already terminated when fetching the command, and hence access to the memory array can be started if the value of the write latency is for 0.5 clocks, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated device comprising:
   a first circuit chip including a first circuit formed on a first major surface of a first semiconductor substrate, said first circuit having a plurality of first input/output nodes for electrically interfacing with the exterior of said first circuit chip;
   a second circuit chip including a second circuit formed on a second major surface of a second semiconductor substrate, said second major surface being face to face with said first major surface and said second circuit having a plurality of second input/output nodes for electrically interfacing with the exterior of said second circuit chip; and
   a connecting portion electrically connecting said plurality of first input/output nodes to said second input/output nodes respectively, said connecting portion including:
   a first connecting member for establishing electrical connections from said plurality of second input/output nodes, and
   a second connecting member, provided between said first connecting member and said plurality of first input/output nodes, for electrically connecting said first connecting member to said plurality of first input/output nodes.

2. The integrated device according to claim 1, wherein said first connecting member includes interface interconnections provided on said second circuit and respectively corresponding to said plurality of second input/output nodes.

3. The integrated device according to claim 2, wherein each of said interface interconnections extends from a corresponding one of said plurality of second input/output nodes to a position corresponding to one of said plurality of first input/output nodes.

4. The integrated device according to claim 1, wherein said second circuit includes a memory circuit having plurality of storage elements each storing data.

5. The integrated device according to claim 1, wherein said first connecting member includes interface interconnections respectively provided corresponding to said plurality of second input/output nodes, and
said second connecting member includes a plurality of bumps respectively provided between said interface interconnections and said plurality of first input/output nodes.

6. The integrated device according to claim 5, wherein each of said interface interconnections extends from a corresponding one of said plurality of second input/output nodes to a position corresponding to one of said plurality of first input/output nodes.

7. The integrated device according to claim 6, wherein said second circuit includes a plurality of memory circuits separably spaced on said second major surface, and
said interface interconnections are provided in common for said plurality of memory circuits.

8. The integrated device according to claim 5, wherein said interface interconnections are formed by photolithography.

9. The integrated device according to claim 8, wherein said second circuit chip includes an insulator layer provided on the surface of said second circuit, and said interface interconnections are provided under said insulator layer.

10. The integrated device according to claim 1, wherein said first circuit further has a plurality of interface nodes for electrically interfacing with the exterior of said first circuit chip.

11. The integrated device according to claim 10, wherein said plurality of interface nodes are electrically connectable to the exterior of said first circuit chip through leads.

* * * * *